(12) United States Patent
Momose

(10) Patent No.: US 10,716,208 B1
(45) Date of Patent: Jul. 14, 2020

(54) WIRING BOARD

(71) Applicant: SHINKO ELECTRIC INDUSTRIES CO., LTD., Nagano-shi, Nagano (JP)

(72) Inventor: Shuhei Momose, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 0 days.

(21) Appl. No.: 16/781,123

(22) Filed: Feb. 4, 2020

(30) Foreign Application Priority Data

Feb. 6, 2019 (JP) .................. 2019-019431

(51) Int. Cl.
*H05K 1/11* (2006.01)
*H05K 1/02* (2006.01)
*H05K 1/05* (2006.01)

(52) U.S. Cl.
CPC ............. *H05K 1/0298* (2013.01); *H05K 1/05* (2013.01); *H05K 1/115* (2013.01)

(58) Field of Classification Search
CPC .. H05K 1/0213; H05K 1/0271; H05K 1/0278; H05K 1/0296; H05K 1/0298
See application file for complete search history.

(56) References Cited

U.S. PATENT DOCUMENTS

2016/0044789 A1  2/2016  Shimizu et al.

FOREIGN PATENT DOCUMENTS

JP      2016-039214      3/2016

*Primary Examiner* — Jeremy C Norris
(74) *Attorney, Agent, or Firm* — Rankin, Hill & Clark LLP

(57) ABSTRACT

A wiring board includes: a first insulating layer; a second insulating layer that is formed on an upper face of the first insulating layer; a first metal layer that is formed on an upper face of the second insulating layer; a third insulating layer that is formed on the upper face of the second insulating layer so as to cover the first metal layer; an opening portion that penetrates at least the second insulating layer, the first metal layer and the third insulating layer in a thickness direction of the wiring board; an electronic component that is provided in the opening portion; a filling insulating layer that fills the opening portion and covers the electronic component; and a wiring layer that is formed on an upper face of the filling insulating layer. A first step portion is formed by a side face of the second insulating layer constituting an inner side face of the opening portion and a side face of the first metal layer constituting the inner side face of the opening portion.

11 Claims, 36 Drawing Sheets

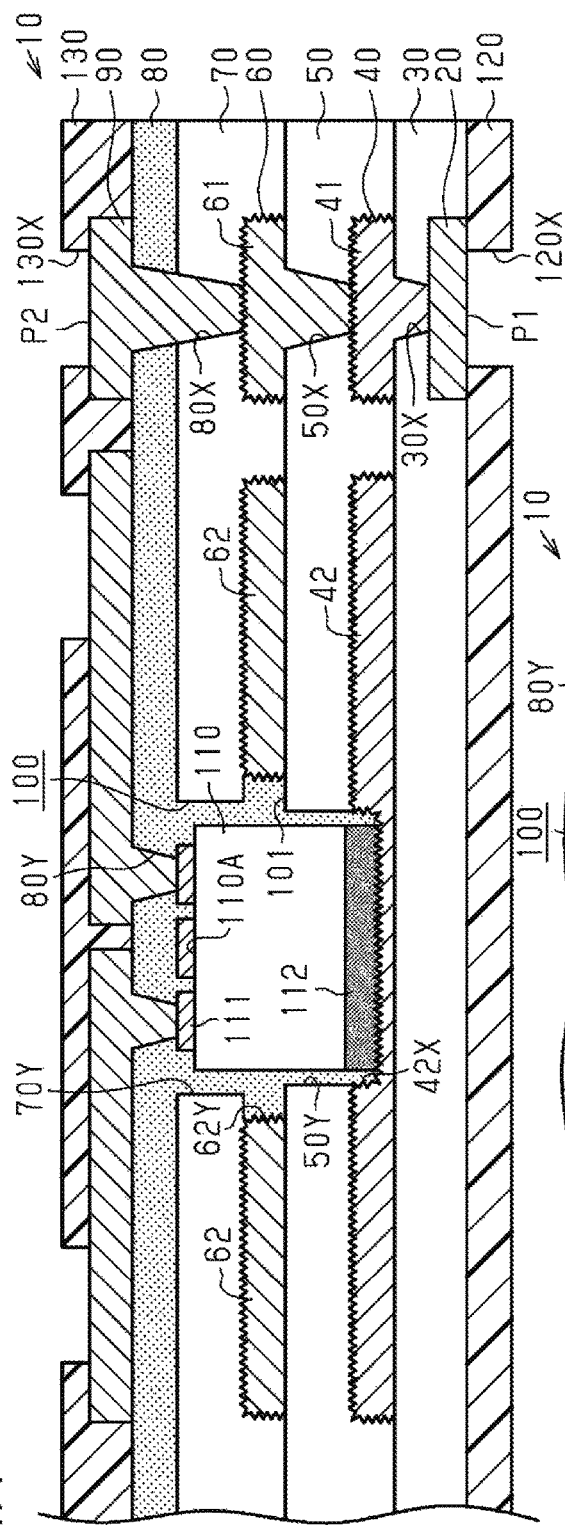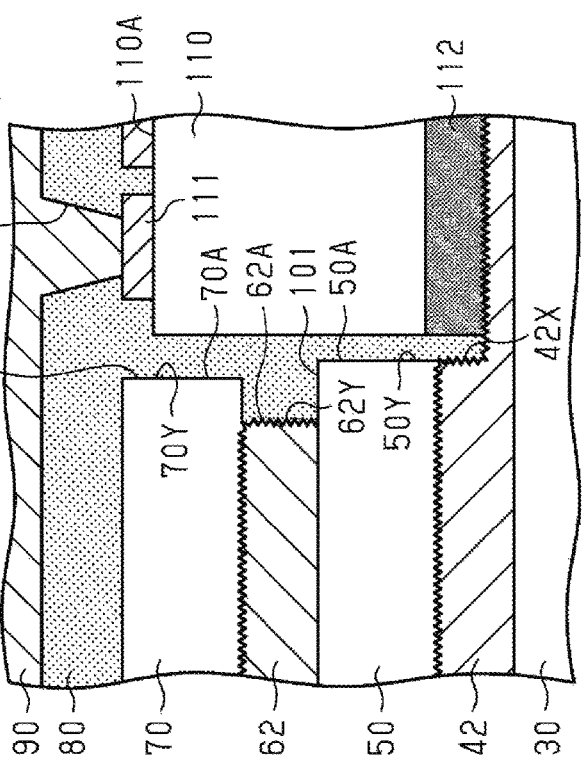

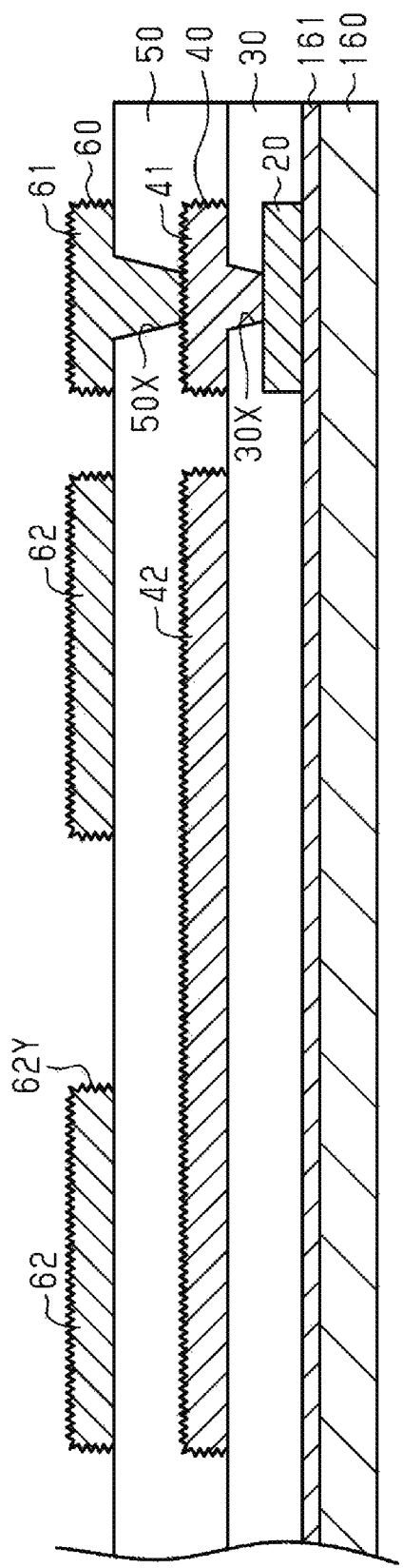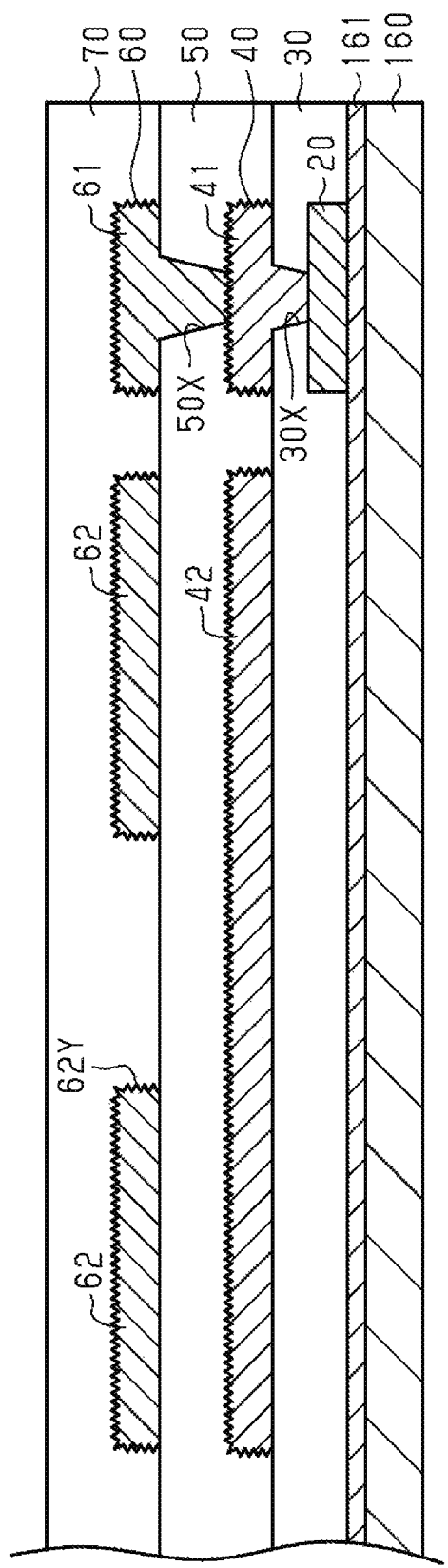

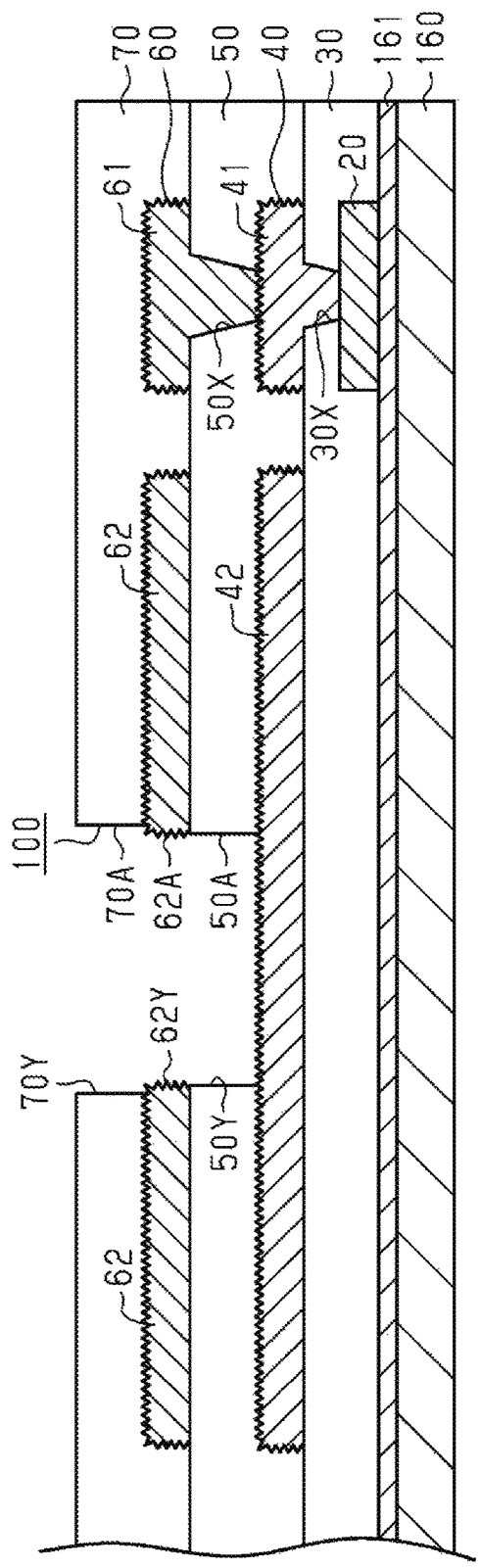
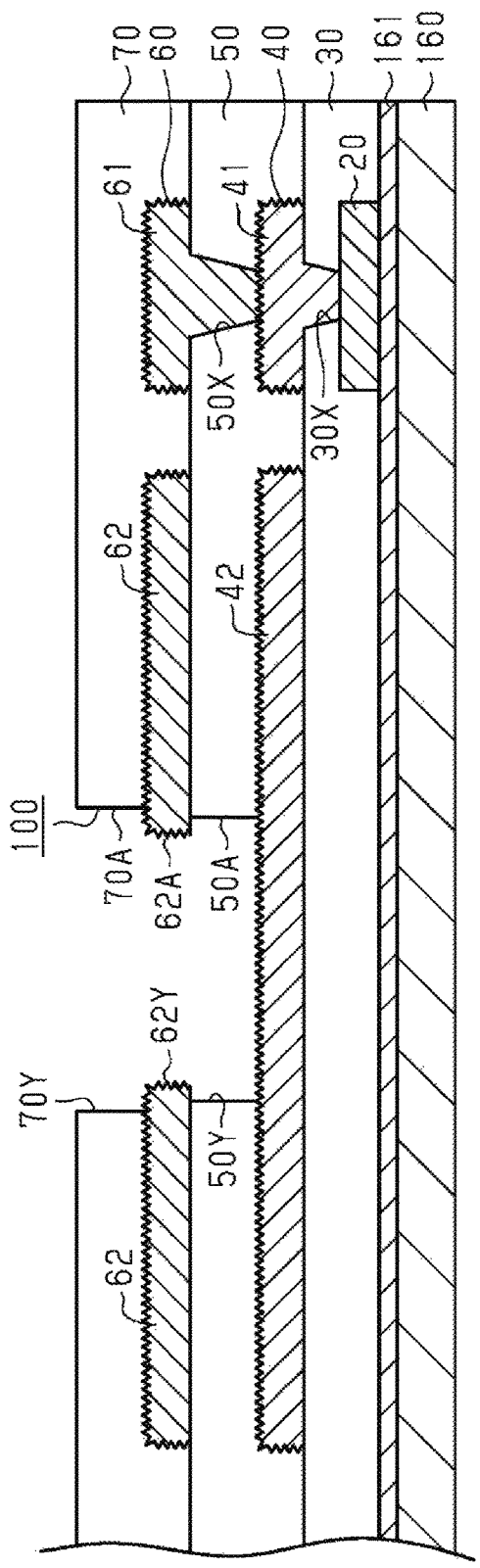

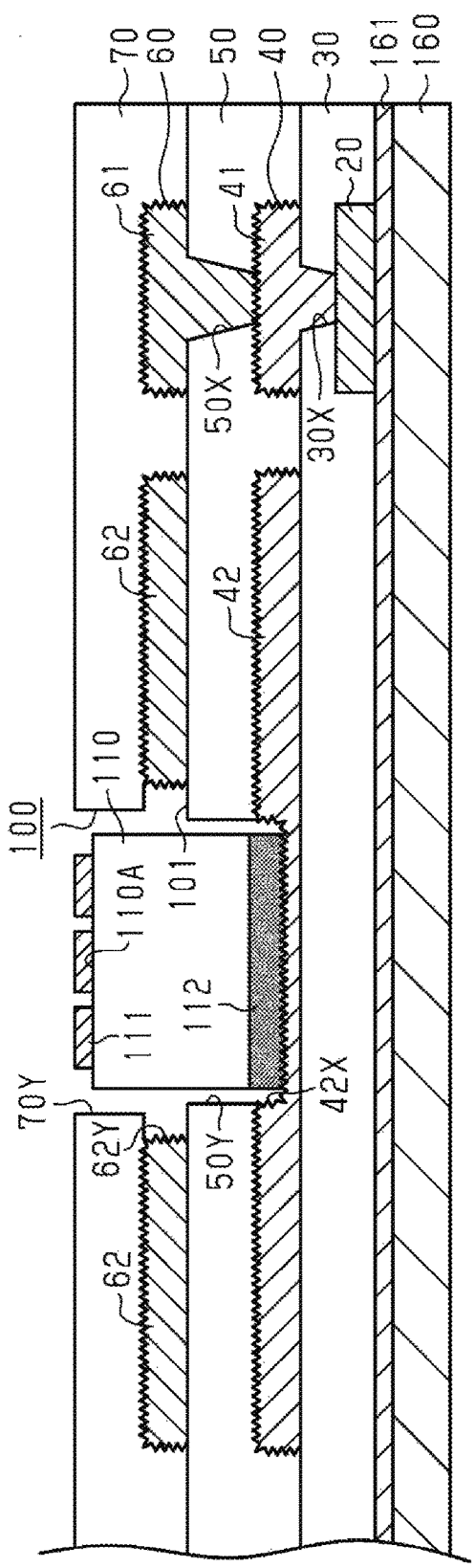
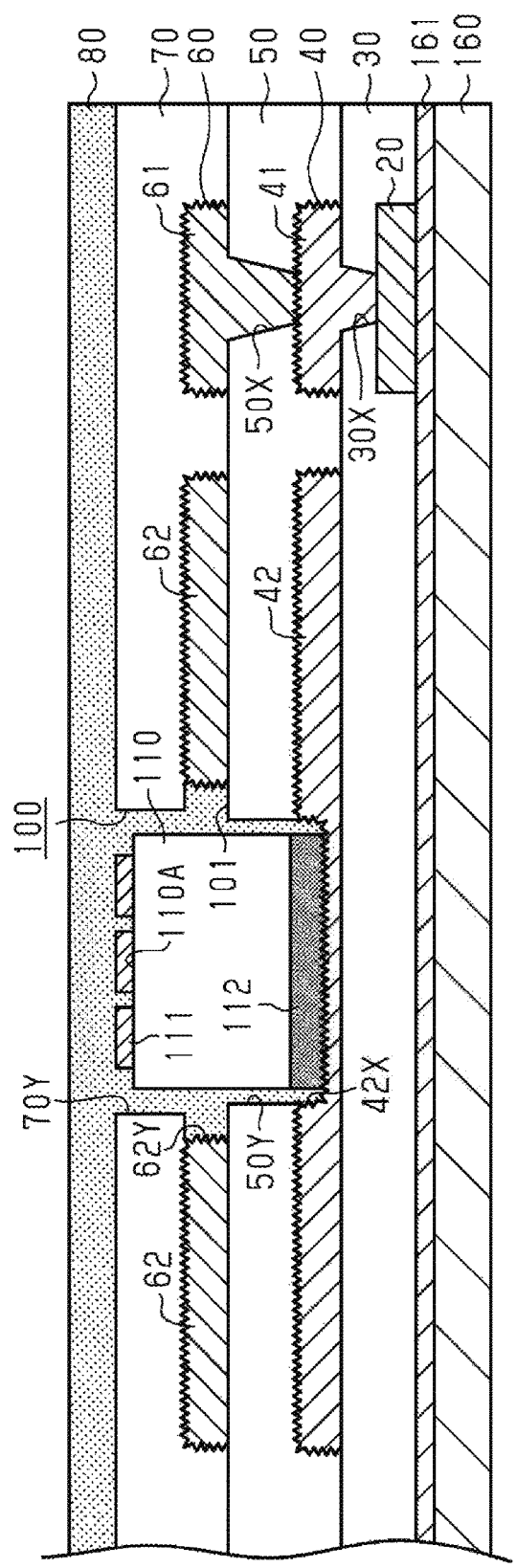
FIG. 10A
FIG. 10B

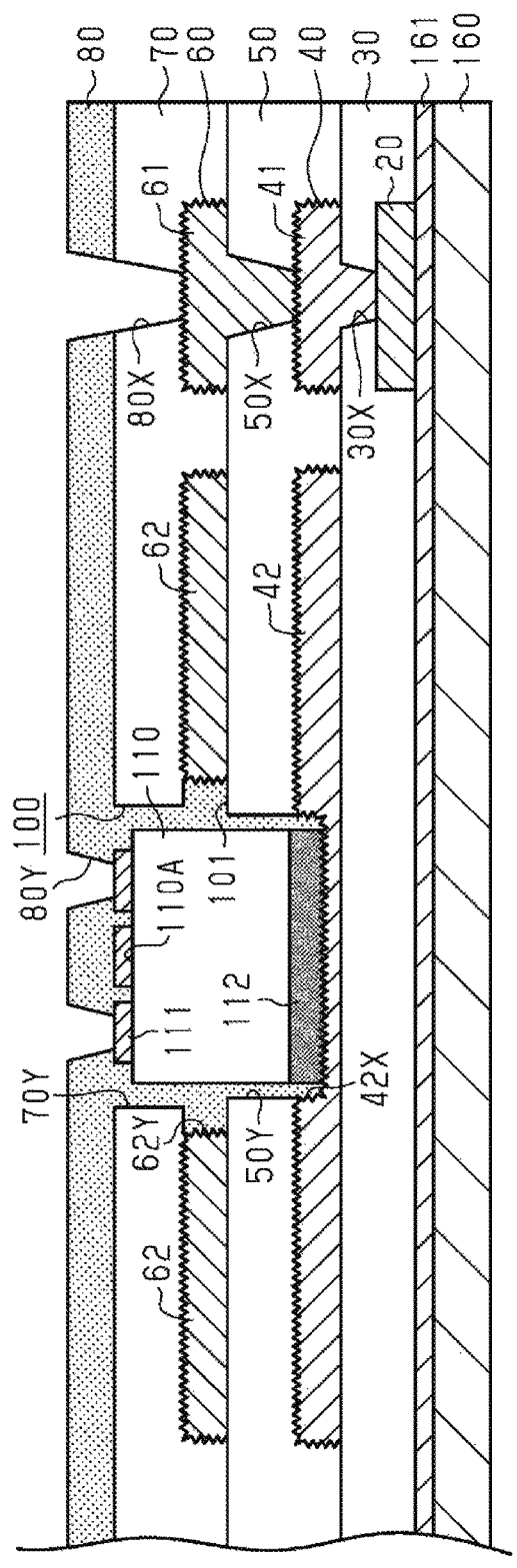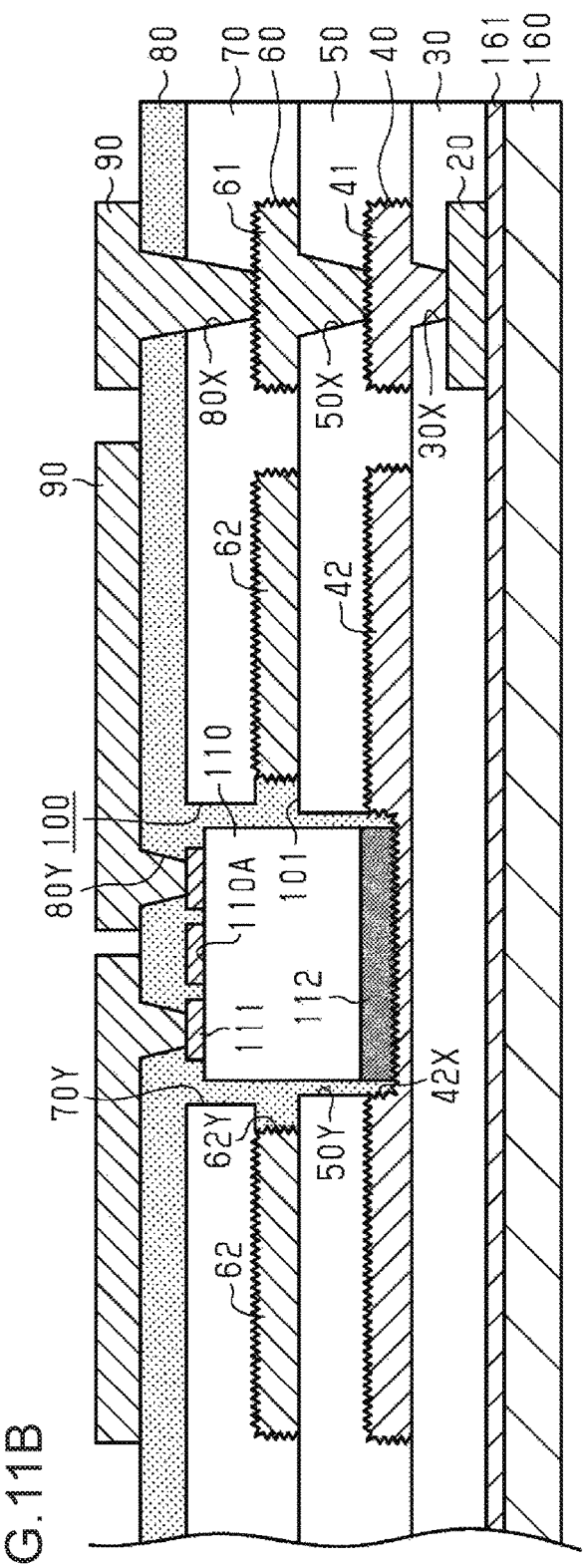

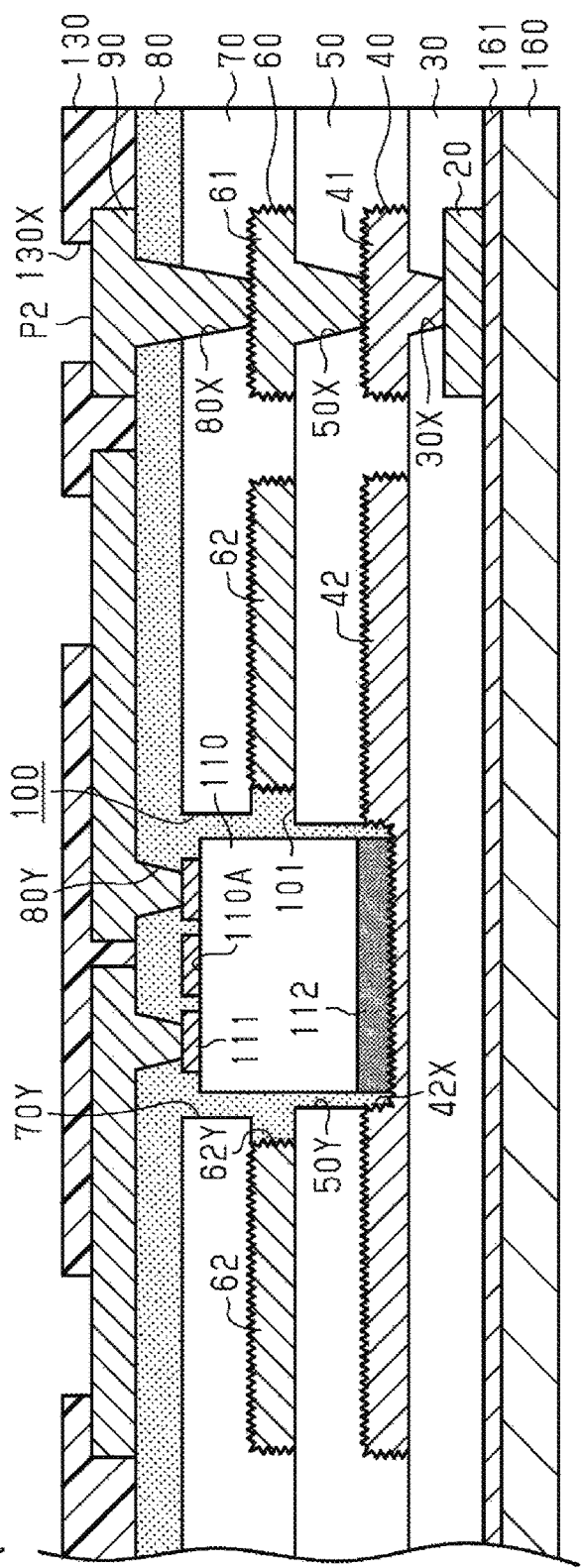
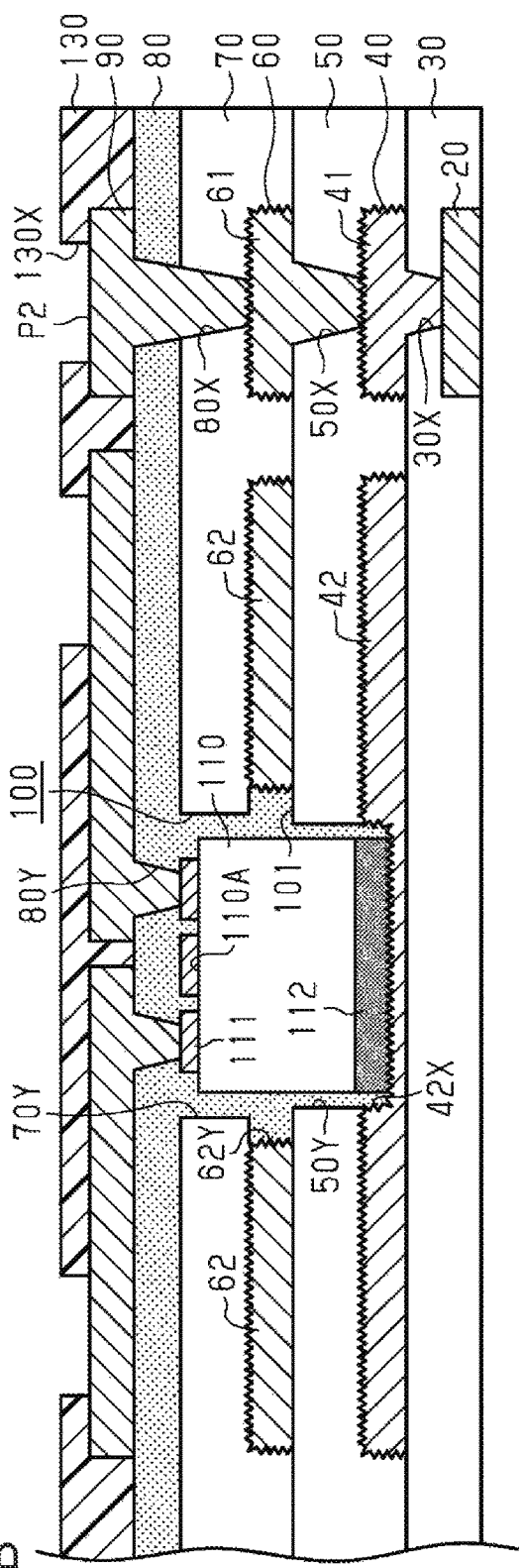
FIG. 12A
FIG. 12B

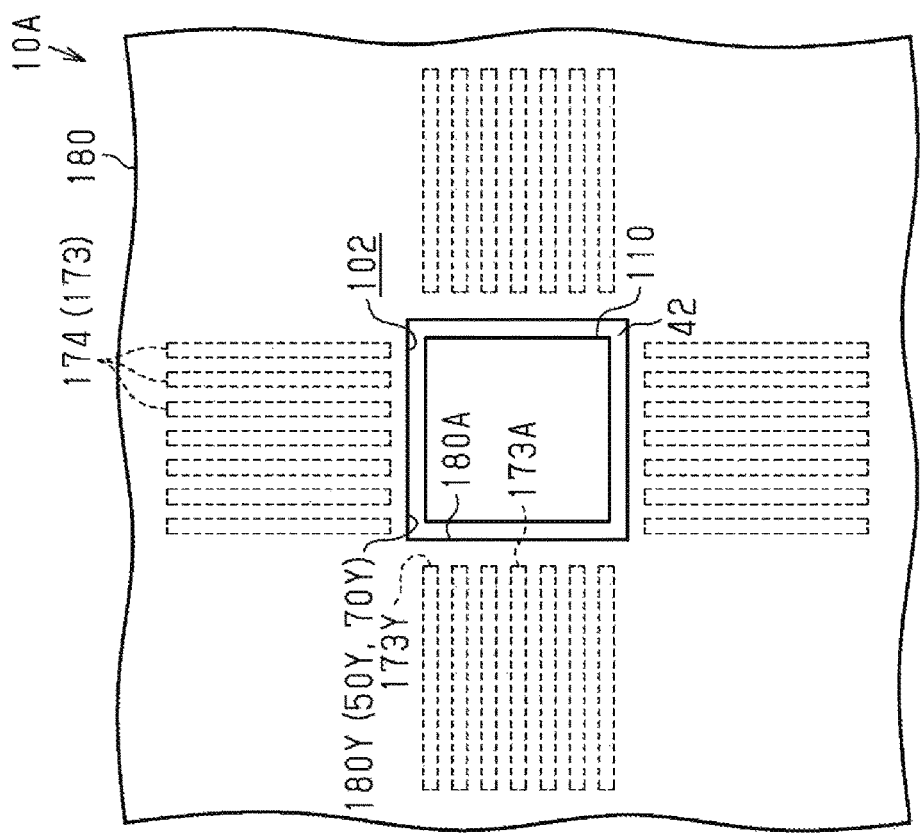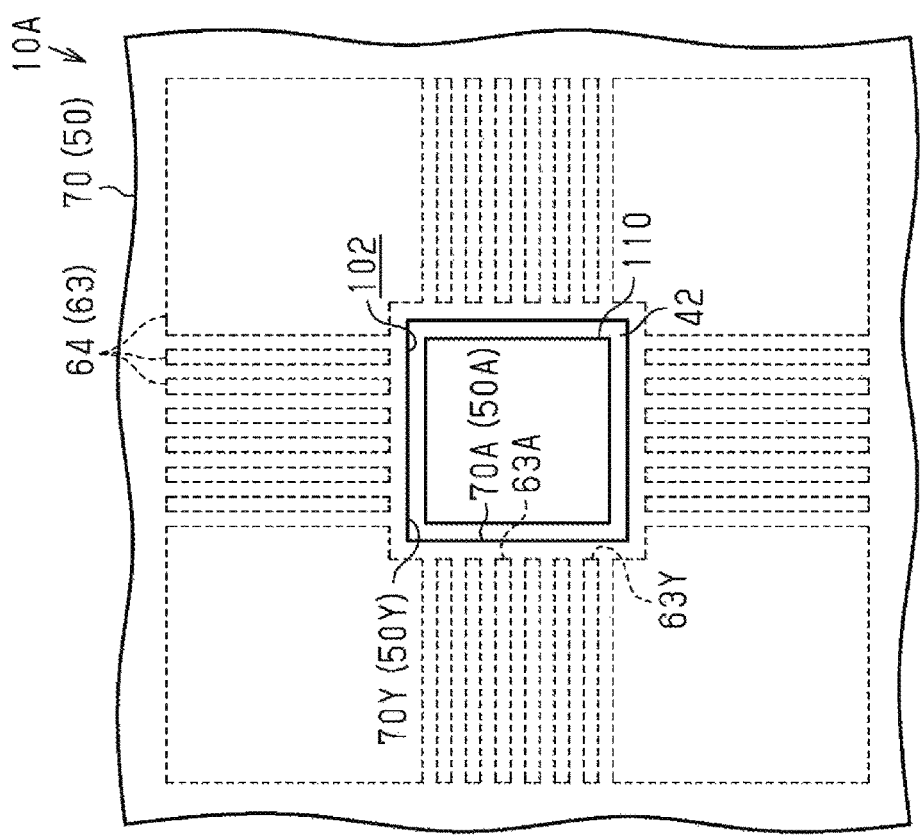

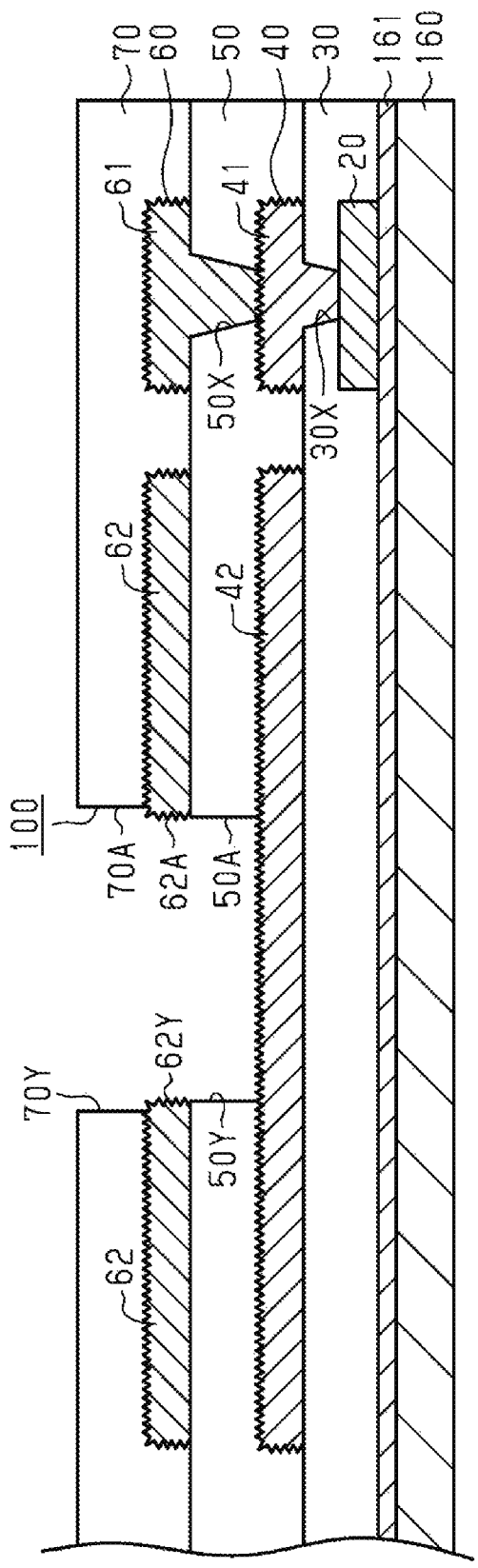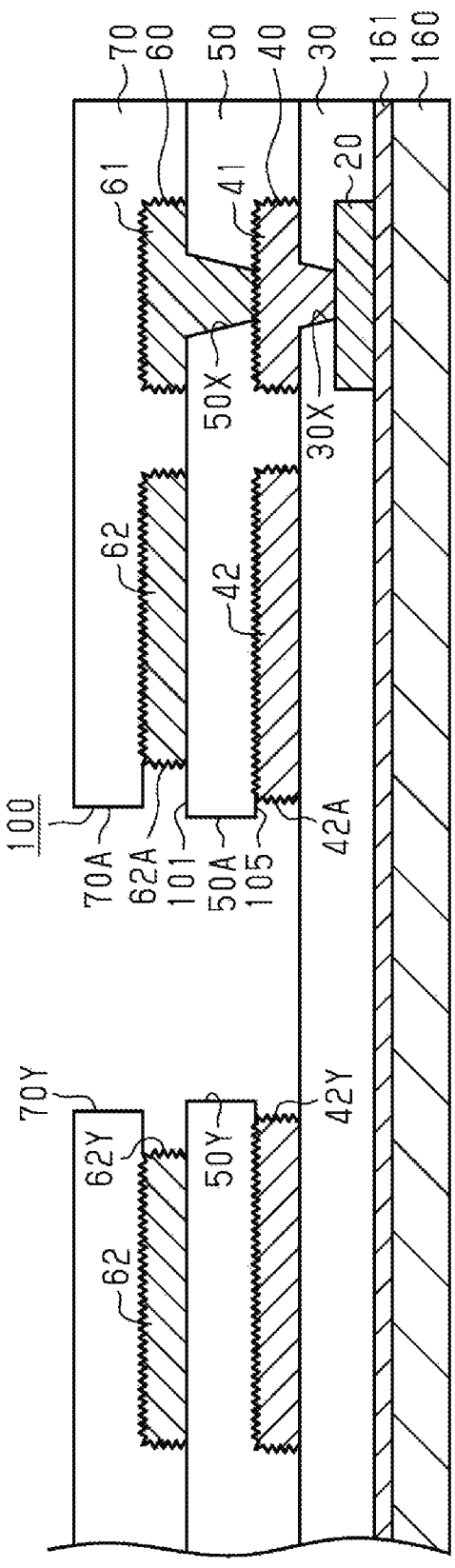

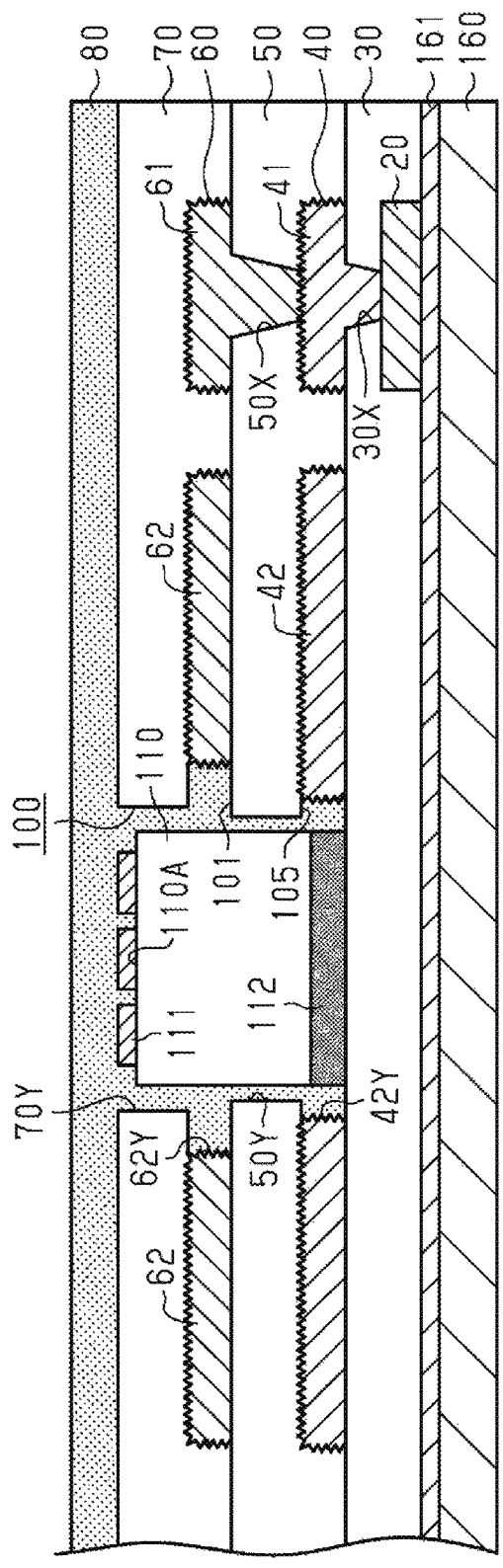
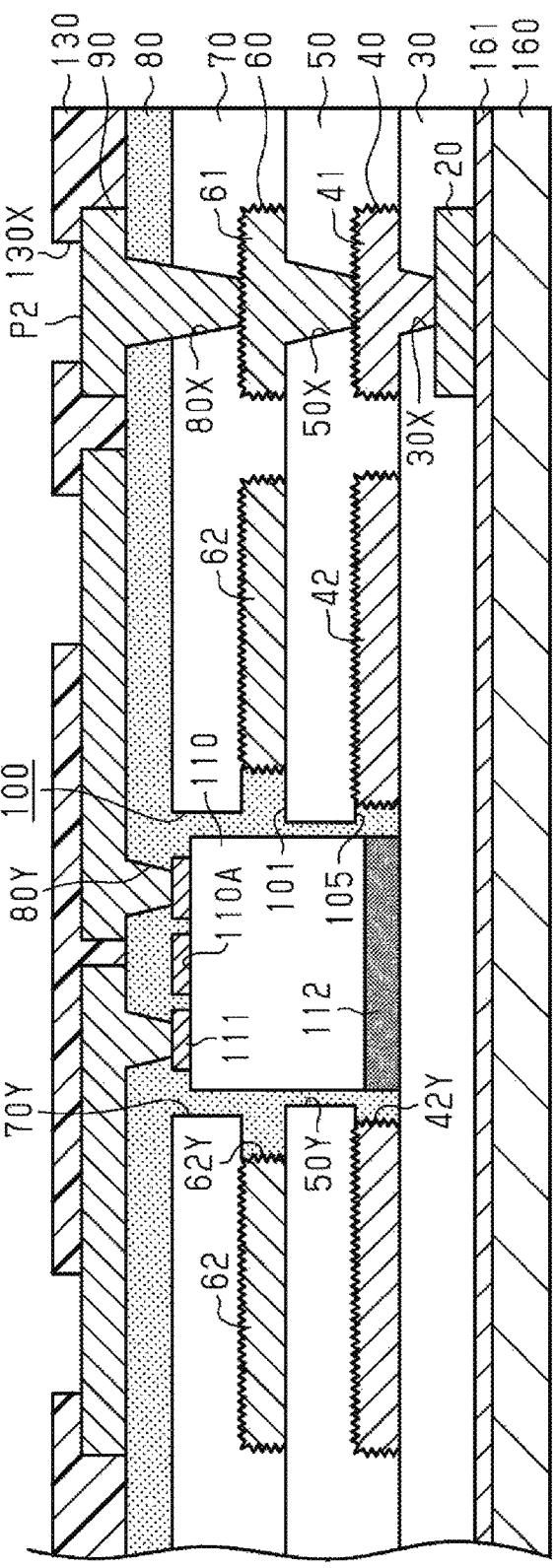
FIG.20A
FIG.20B

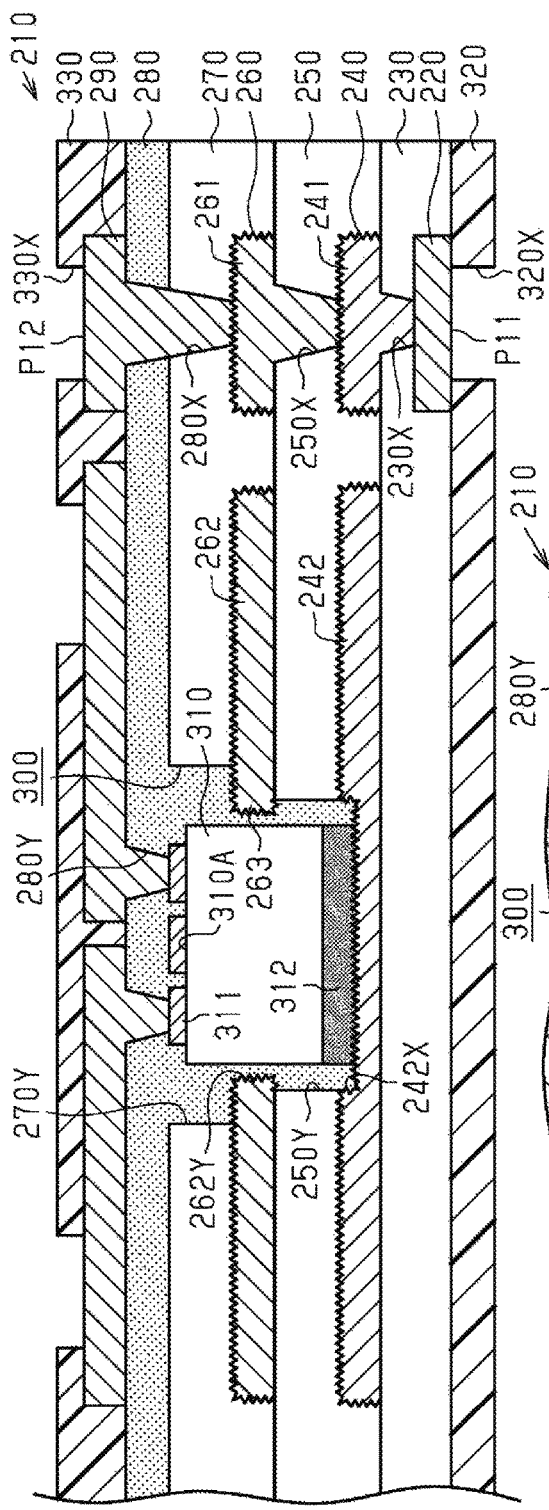
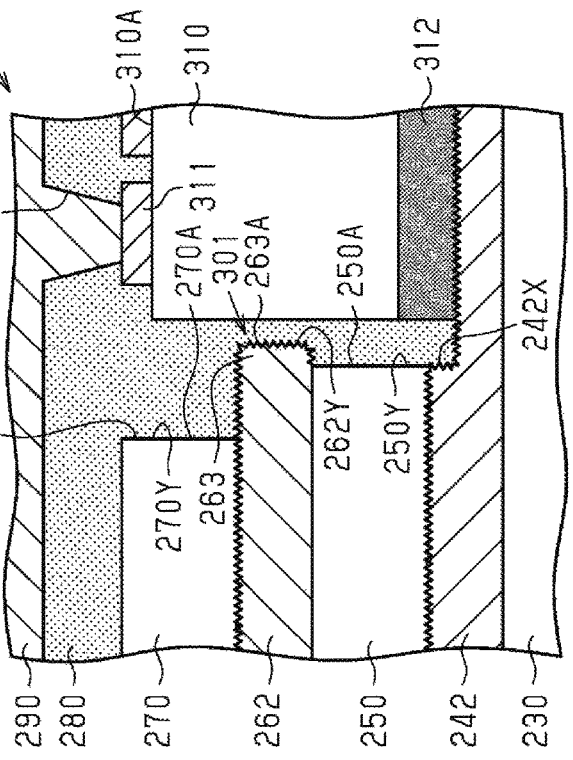
FIG.21A
FIG.21B

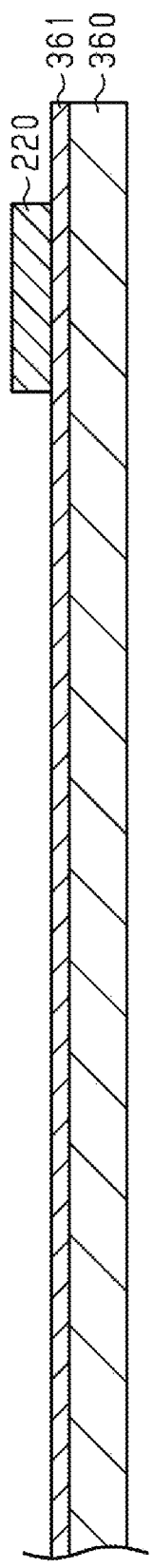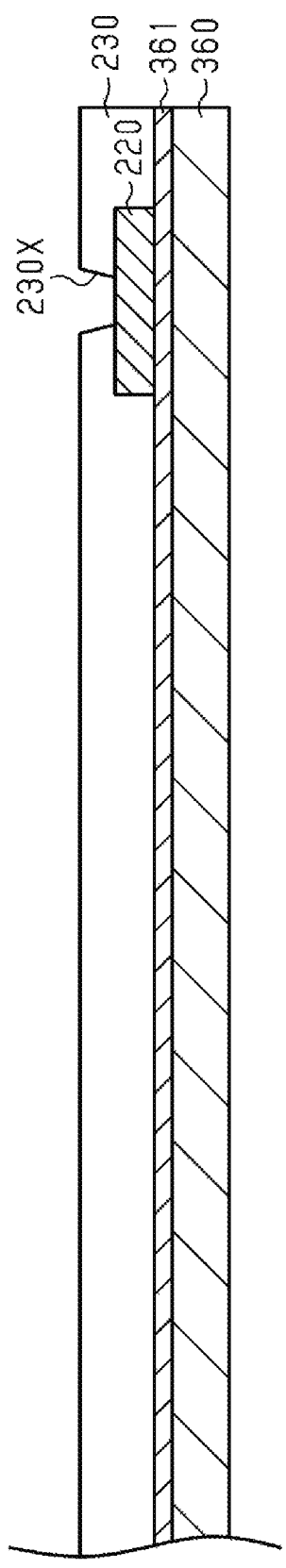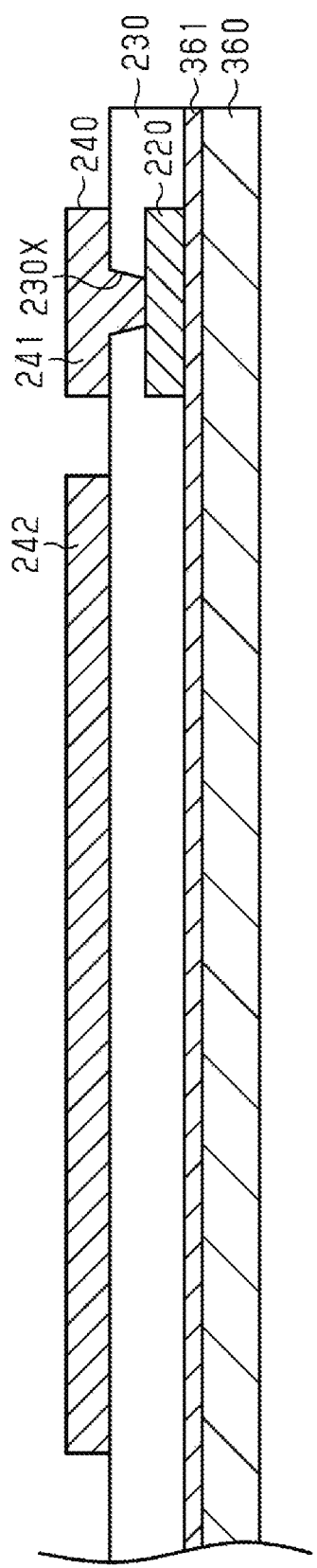
FIG.25A
FIG.25B
FIG.25C

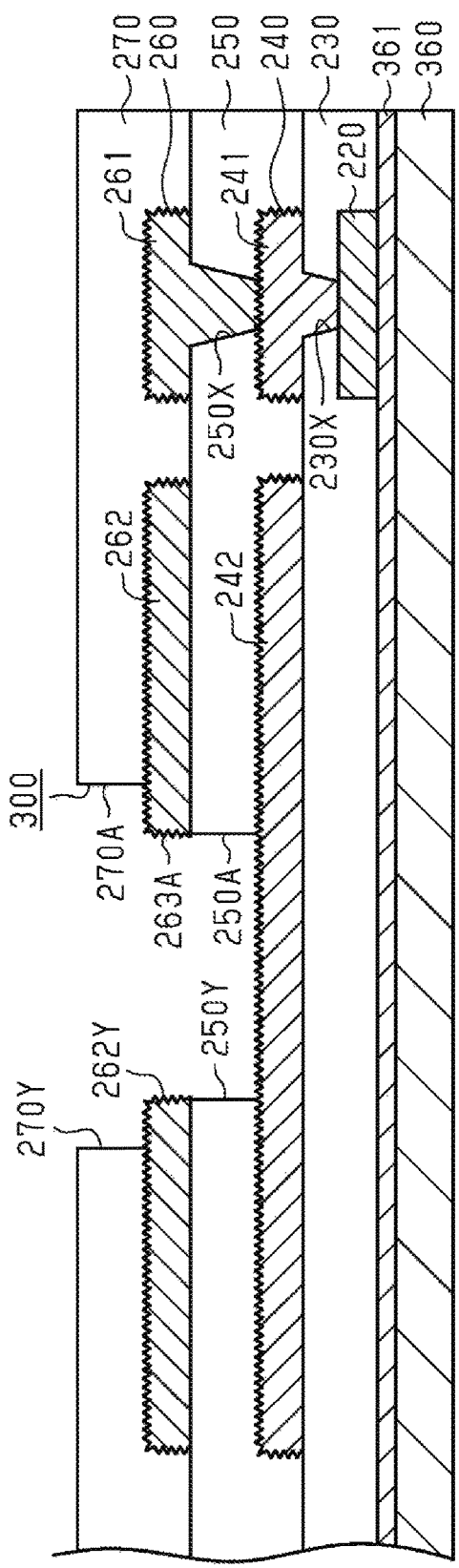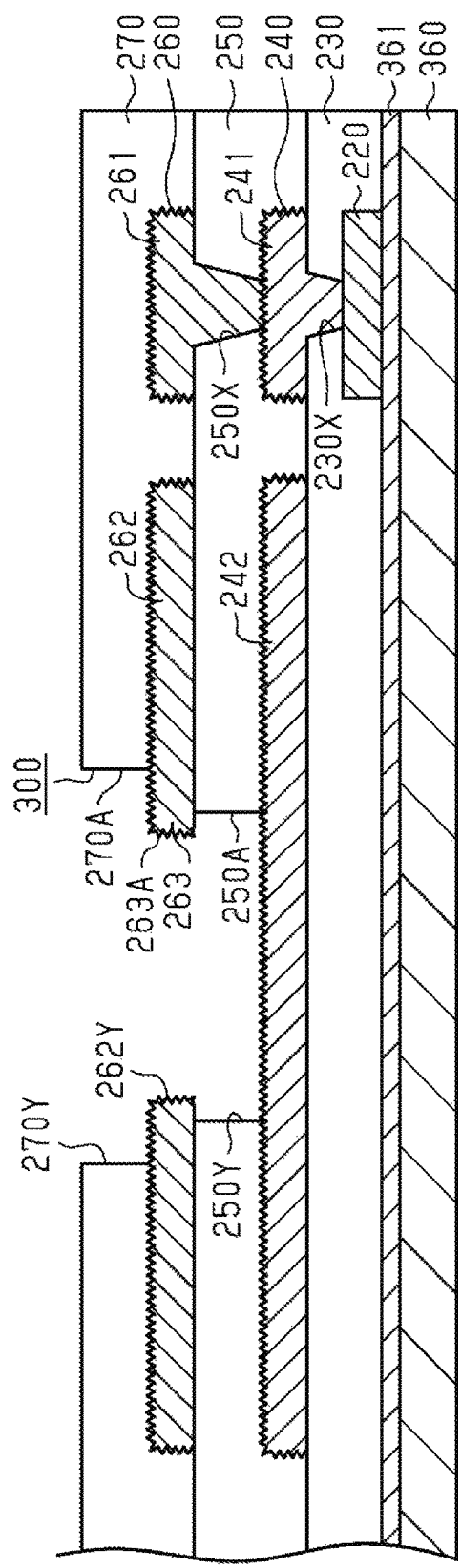

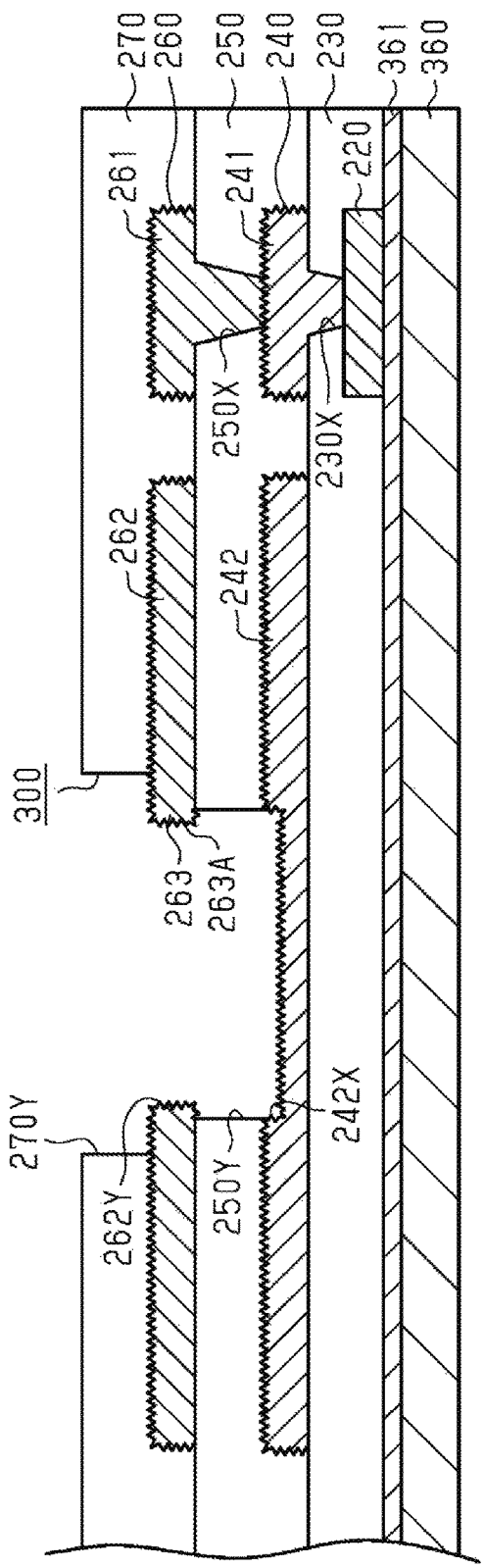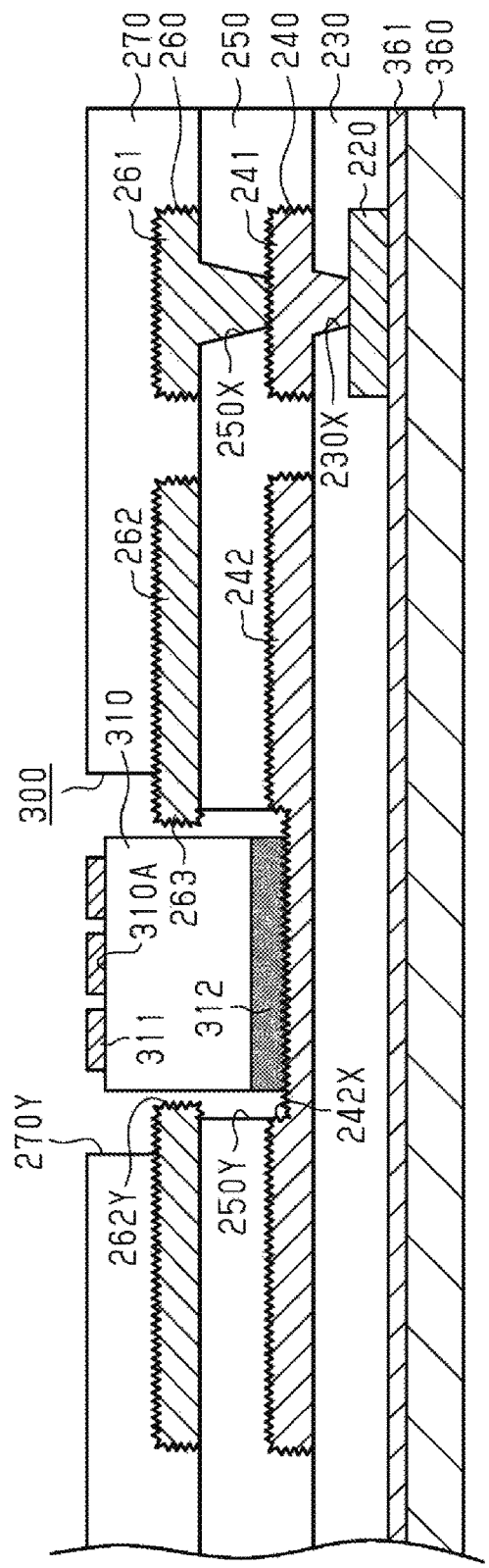
FIG.29A
FIG.29B

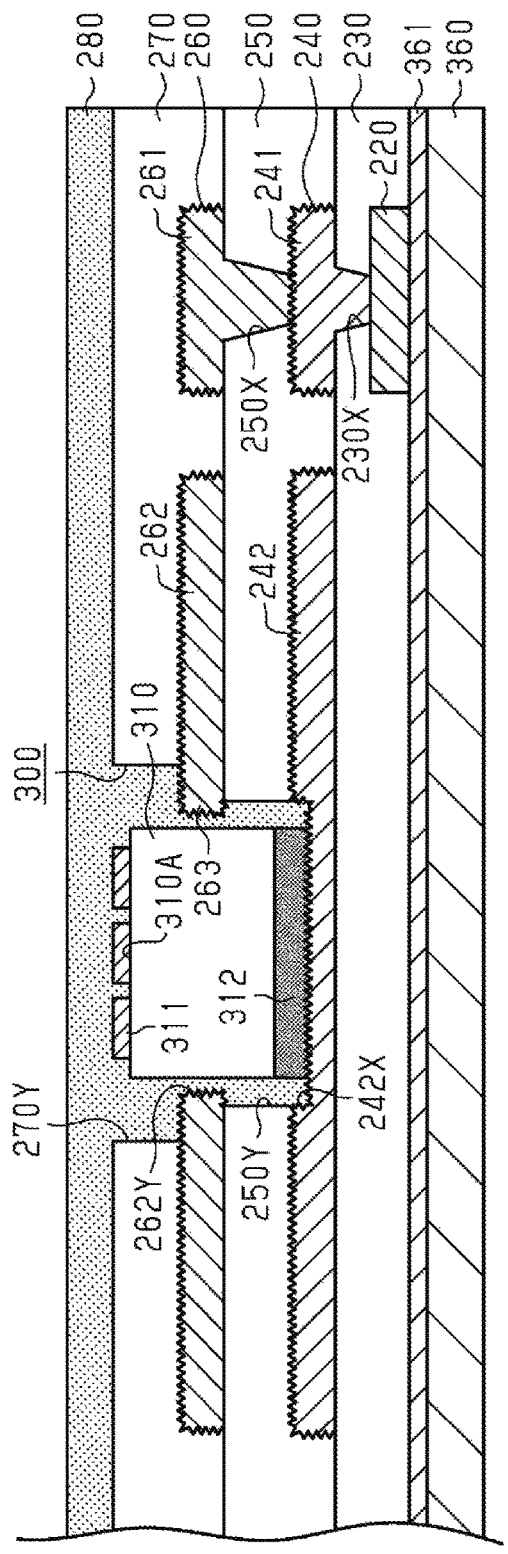
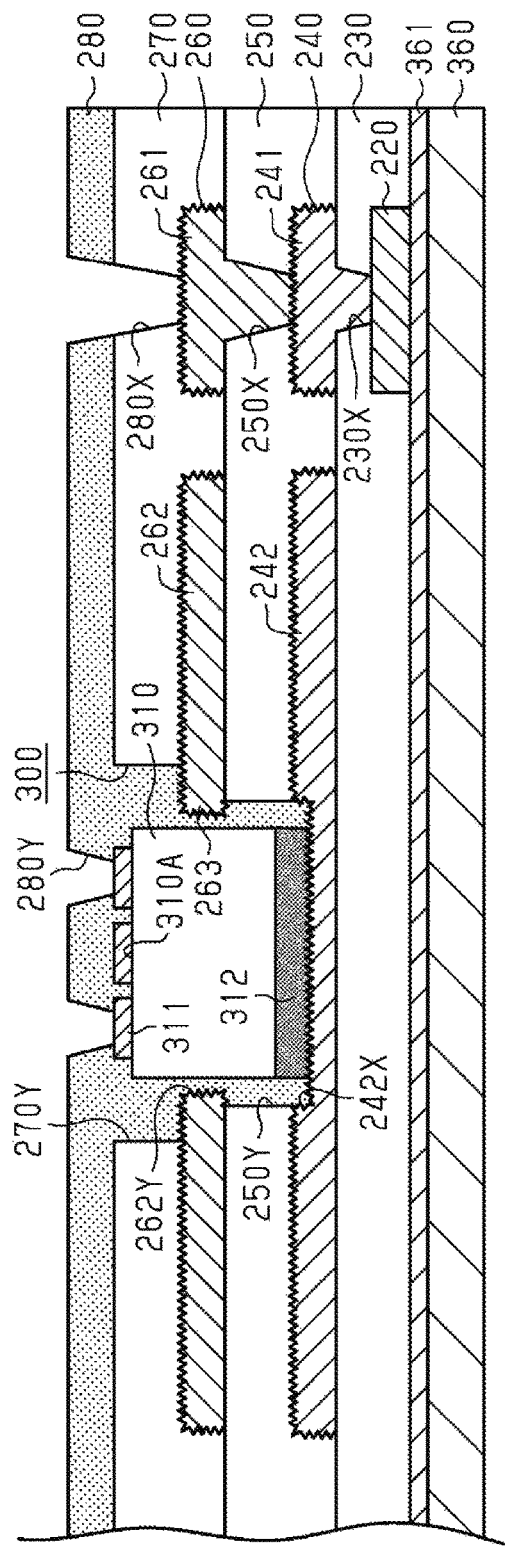

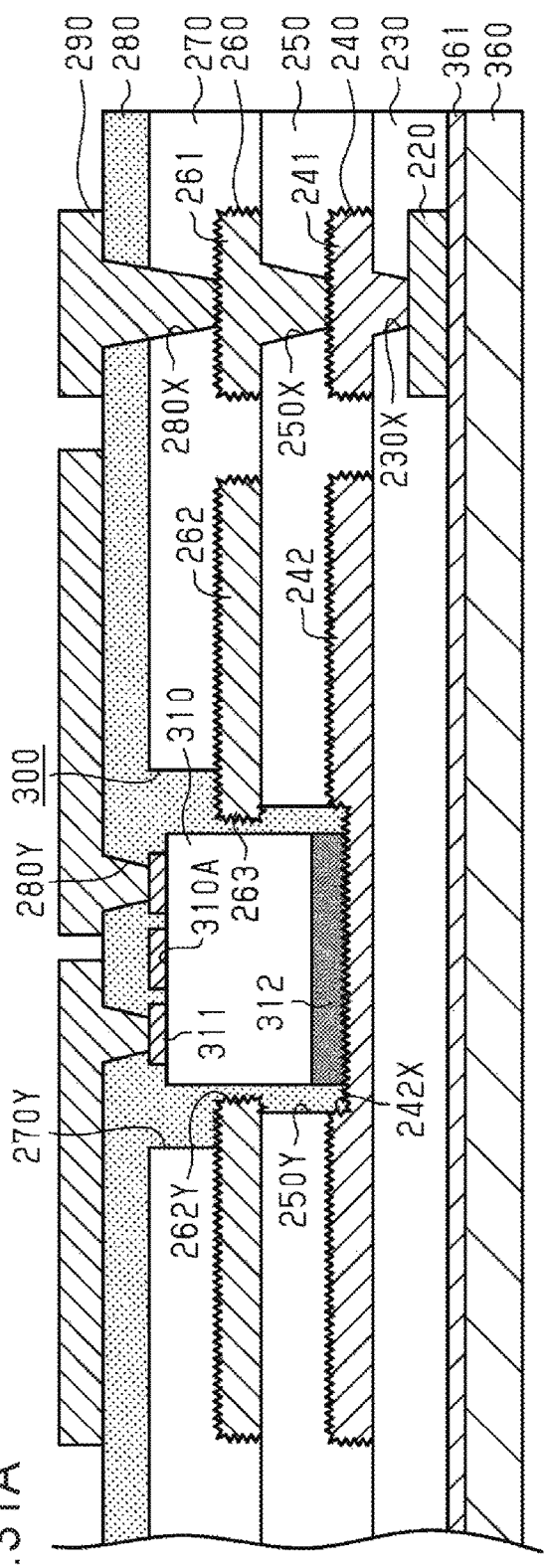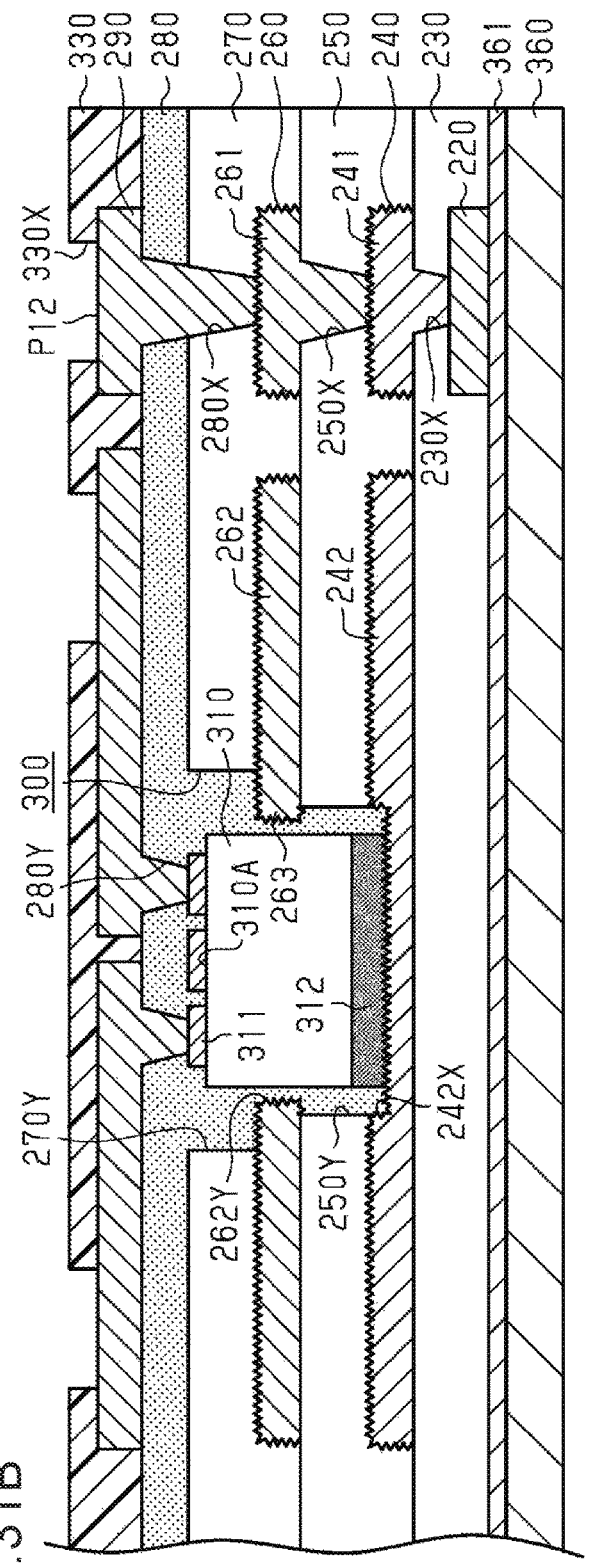

WIRING BOARD

This application claims priority from Japanese Patent Applications No. 2019-019431, filed on Feb. 6, 2019, the entire contents of which are herein incorporated by reference.

BACKGROUND

1. Technical Field

The present disclosure relates to a wiring board.

2. Background Art

In the background art, there has been known a wiring board in which an electronic component such as a semiconductor chip or a chip capacitor is embedded (e.g. see JP-A-2016-039214). The electronic component is disposed in an opening portion formed in an interlayer insulating layer of the wiring board.

FIG. 38 shows an electronic component embedded type wiring board 400 according to the background art. The wiring board 400 has an insulating layer 410, a metal layer 420, an interlayer insulating layer 430, and an opening portion 440. The metal layer 420 is formed on an upper face of the insulating layer 410. The interlayer insulating layer 430 is formed on the upper face of the insulating layer 410 so as to cover the metal layer 420. The opening portion 440 penetrates the interlayer insulating layer 430 in a thickness direction. The wiring board 400 has an electronic component 450, an insulating layer 460 and a wiring layer 470. The electronic component 450 is disposed inside the opening portion 440. With the insulating layer 460, the opening portion 440 is filled and the electronic component 450 is entirely covered. The wiring layer 470 is electrically connected to electrodes 451 of the electronic component 450 and formed on an upper face of the insulating layer 460.

However, tight adhesiveness between the metal layer 420 which is exposed in the bottom of the opening portion 440 and the insulating layer 460 with which the opening portion 440 is filled is not excellent in the wiring board 400. In addition, tight adhesiveness between the interlayer insulating layer 430 which has the opening portion 440 and the insulating layer 460 with which the opening portion 440 is filled is not excellent in the wiring board 400. Therefore, when, for example, a warp or thermal stress occurs in the wiring board 400, stress is concentrated on the vicinity of an opening edge 480 of the bottom of the opening portion 440 so that peeling is apt to occur at an interface between the metal layer 420 and the insulating layer 460. When the peeling occurs at the interface between the metal layer 420 and the insulating layer 460, the peeling may be propagated to an interface between the interlayer insulating layer 430 and the insulating layer 460, and the wiring layer 470 may be broken due to the propagated peeling. When the wiring layer 470 is broken, electric reliability of the wiring board 400 may be lowered.

SUMMARY

Certain embodiment provides a wiring board.
The wiring board comprises:
a first insulating layer;
a second insulating layer that is formed on an upper face of the first insulating layer;
a first metal layer that is formed on an upper face of the second insulating layer;
a third insulating layer that is formed on the upper face of the second insulating layer so as to cover the first metal layer;
an opening portion that penetrates at least the second insulating layer, the first metal layer and the third insulating layer in a thickness direction of the wiring board;
an electronic component that is provided in the opening portion;
a filling insulating layer that fills the opening portion and covers the electronic component; and
a wiring layer that is formed on an upper face of the filling insulating layer.

A first step portion is formed by a side face of the second insulating layer constituting an inner side face of the opening portion and a side face of the first metal layer constituting the inner side face of the opening portion.

BRIEF DESCRIPTION OF DRAWINGS

FIG. 1A is a schematic sectional view (a sectional view taken along a line 1-1 in FIG. 2) showing a wiring board according to a first embodiment;

FIG. 1B is an enlarged sectional view showing the wiring board according to the first embodiment;

FIGS. 7A and 7B are schematic sectional views showing the method for manufacturing the wiring board according to the first embodiment;

FIGS. 8A and 8B are schematic sectional views showing the method for manufacturing the wiring board according to the first embodiment;

FIGS. 10A and 10B are schematic sectional views showing the method for manufacturing the wiring board according to the first embodiment;

FIGS. 11A and 11B are schematic sectional views showing the method for manufacturing the wiring board according to the first embodiment;

FIGS. 12A and 12B are schematic sectional views showing the method for manufacturing the wiring board according to the first embodiment;

FIGS. 16A and 16B are schematic plan views showing the wiring board according to the modification;

FIGS. 19A and 19B are schematic sectional views showing a method for manufacturing the wiring board according to the other modification;

FIGS. 20A and 20B are schematic sectional views showing the method for manufacturing the wiring board according to the other modification;

FIG. 21A is a schematic sectional view (a sectional view taken along a line 21a-21a in FIG. 22) showing a wiring board according to a second embodiment;

FIG. 21B is an enlarged sectional view showing the wiring board according to the second embodiment;

FIGS. 25A to 25C are schematic sectional views showing a method for manufacturing the wiring board according to the second embodiment;

FIGS. 28A and 28B are schematic sectional views showing the method for manufacturing the wiring board according to the second embodiment;

FIGS. 29A and 29B are schematic sectional views showing the method for manufacturing the wiring board according to the second embodiment;

FIGS. 30A and 30B are schematic sectional views showing the method for manufacturing the wiring board according to the second embodiment;

FIGS. 31A and 31B are schematic sectional views showing the method for manufacturing the wiring board according to the second embodiment;

DESCRIPTION OF EMBODIMENTS

Figure 2:
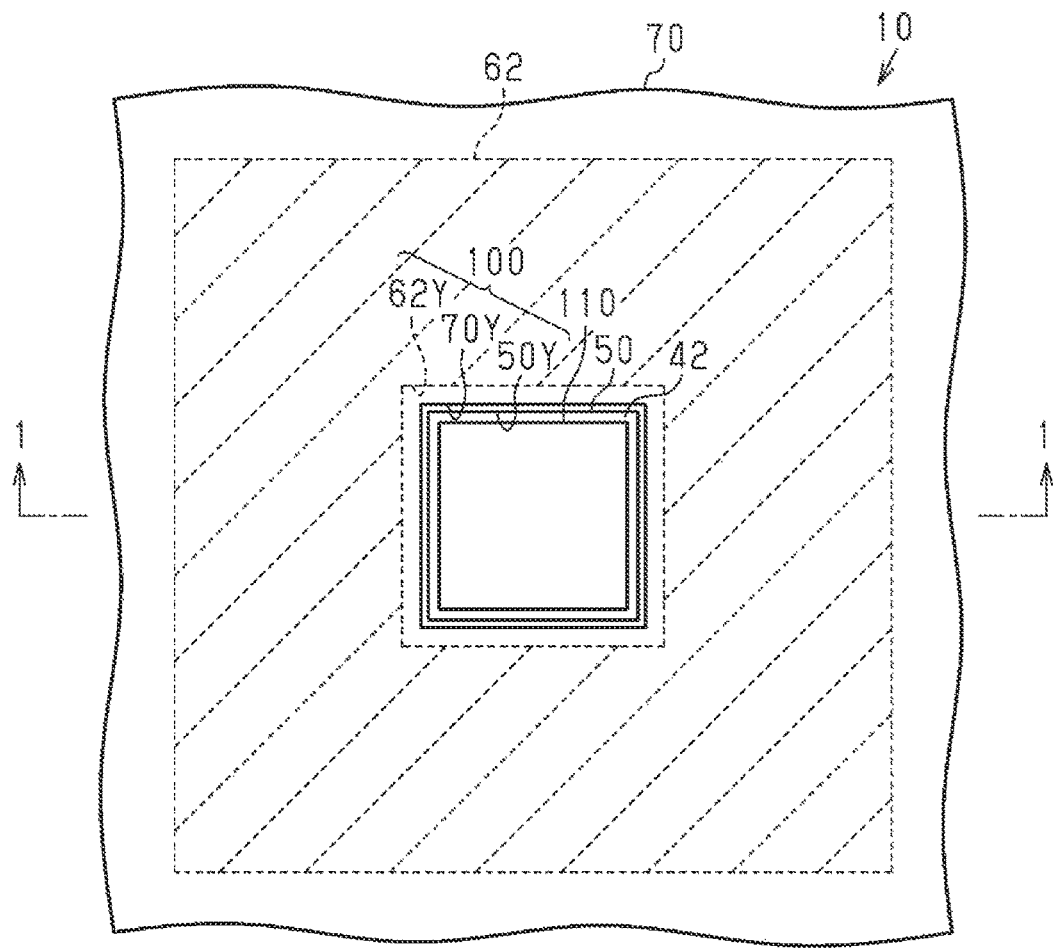
FIG. 2 is a schematic plan view showing the wiring board according to the first embodiment.

Embodiments will be described below with reference to the accompanying drawings. Incidentally, some of the accompanying drawings show characteristic portions in an enlarged manner for convenience in order to make the characteristics easy to understand. Therefore, constituent elements do not always have the same dimensional ratios etc. as real ones. In addition, in sectional views, in order to make sectional structures of members easy to understand, some of the members are illustrated by a satin pattern rather than by hatching while others are illustrated without hatching. Incidentally, in the description of the present invention, the term "plan view" means a view of a subject seen from a vertical direction (an up/down direction in the drawings) of FIG. 1 etc., and the term "planar shape" means a shape of the subject viewed from the vertical direction of FIG. 1 etc.

First Embodiment

A first embodiment will be described below in accordance with FIG. 1A to FIG. 14.

As shown in FIG. 1A, a wiring board 10 has a structure in which a wiring layer 20, an insulating layer 30, a conductor layer 40, an insulating layer 50, a conductor layer 60, an insulating layer 70, an insulating layer 80, and a wiring layer 90 are formed sequentially. The wiring board 10 in the present example has a form of a so-called "coreless board" which is free from any support substrate unlike a wiring board which is manufactured by a general build-up method, i.e. a wiring board in which a required number of build-up layers are formed sequentially on each or one of opposite faces of a core substrate serving as a support substrate.

The wiring board 10 has one or more electronic components 110 (one electronic component 110 in FIG. 1A) disposed in an opening portion 100 formed in the plurality of insulating layers 50 and 70, a solder resist layer 120 formed on a lower face of the insulating layer 30, and a solder resist layer 130 formed on an upper face of the insulating layer 80. The wiring board 10 is a wiring board in which the electronic component 110 is embedded.

Here, for example, cupper (Cu) or a copper alloy can be used as the material of the wiring layers 20 and 90 and the conductor layers 40 and 60. For example, any of insulating resins such as an epoxy resin and a polyimide resin or any of resin materials in which fillers made of silica, alumina, etc., are mixed with these resins can be used as the material of the insulating layers 30, 50, 70 and 80. In addition, for example, a reinforcing material-including insulating resin in which a reinforcing material such as a woven fabric or an unwoven fabric of glass, aramid or LCP (Liquid Crystal Polymer) fiber is impregnated with a thermosetting resin containing an epoxy resin, a polyimide resin, or the like, as a main component may be used as the material of the insulating layers 30, 50, 70 and 80. Incidentally, a non-photosensitive insulating resin containing a thermosetting resin as a main component or an insulating resin containing a photosensitive resin as a main component can be used as the material of the insulating layers 30, 50, 70 and 80.

The wiring layer 20 is an outermost (lowermost in this case) wiring layer of the wiring board 10. A lower face of the wiring layer 20 is exposed from the insulating layer 30. The lower face of the wiring layer 20 in the present example is formed to be substantially flush with the lower face of the insulating layer 30. Incidentally, the lower face of the wiring layer 20 may be formed to be recessed on the conductor layer 40 side relatively to the lower face of the insulating layer 30. The thickness of the wiring layer 20 can be, for example, set in a range of about 10 to 30 μm.

The insulating layer 30 is formed so as to cover an upper face and a side face of the wiring layer 20 and expose the lower face of the wiring layer 20. A through hole 30X penetrating the insulating layer 30 in a thickness direction so as to expose a portion of the upper face of the wiring layer 20 is formed at a predetermined place in the insulating layer 30. The through hole 30X is, for example, formed into a taper shape in which an opening width (an opening diameter) is reduced as it goes from an upper side (the conductor layer 40 side) toward a lower side (the wiring layer 20 side) in FIG. 1A. For example, the through hole 30X is formed into an inverted truncated conical shape in which an opening diameter of a lower side opening end is smaller than an opening diameter of an upper side opening end. Incidentally, a thickness between the upper face of the wiring layer 20 and an upper face of the insulating layer 30 can be, for example, set in a range of about 10 to 35 µm.

The conductor layer 40 is formed on the upper face of the insulating layer 30. The thickness of the conductor layer 40 can be, for example, set in a range of about 10 to 30 µm. An upper face and a side face of the conductor layer 40 are, for example, roughened faces. The upper face and the side face of the conductor layer 40 are, for example, formed into roughened faces larger in surface roughness than a lower face of the conductor layer 40. The surface roughness of the conductor layer 40 can be, for example, set to be not lower than 200 nm in terms of surface roughness Ra value. Here, the surface roughness Ra value is one kind of numerical value, which expresses the surface roughness and which is called arithmetical average roughness. Specifically, the surface roughness Ra value is an arithmetic average of absolute values measured as a height varying within a measurement region from the surface which is an average line.

The conductor layer 40 has, for example, a wiring layer 41 and a metal layer 42. The wiring layer 41 and the metal layer 42 are formed separately from each other to be electrically insulated from each other. The wiring layer 41 and the metal layer 42 are formed on one and the same plane.

The wiring layer 41 is, for example, electrically connected to the wiring layer 20 through a via wiring filled in the through hole 30X. The wiring layer 41 is, for example, formed integrally with the via wiring filled in the through hole 30X.

The metal layer 42 is, for example, formed in a mount region where the electronic component 110 is mounted. The metal layer 42 is, for example, formed at a position overlapping with the electronic component 110 in plan view. The metal layer 42 is, for example, formed at a position overlapping with the opening portion 100 in plan view. The planar shape of the metal layer 42 is, for example, formed to be larger than the planar shape of the opening portion 100. An outer circumferential edge of the metal layer 42 is, for example, formed so as to surround an opening edge of the opening portion 100 from the outside in plan view. The metal layer 42 is, for example, formed into a rectangular shape in plan view. The metal layer 42 in the present example is, for example, a metal layer which is electrically isolated (floating) without being electrically connected to any other wiring layer or any other conductor layer. The metal layer 42 may be, for example, a wiring pattern for drawing a wiring or may be a power source wiring or a ground wiring. When the metal layer 42 is the wiring pattern, the power source wiring or the ground wiring, the metal layer 42 is, for example, electrically connected to another wiring layer or another conductor layer through a via wiring etc.

The insulating layer 50 is formed on the upper face of the insulating layer 30 so as to cover the conductor layer 40. Incidentally, a thickness between the upper face of the conductor layer 40 and an upper face of the insulating layer 50 can be, for example, set in a range of about 40 to 100 µm.

A through hole 50X penetrating the insulating layer 50 in the thickness direction so as to expose a portion of the upper face of the conductor layer 40 (the wiring layer 41 in this case) is formed at a predetermined place in the insulating layer 50. The through hole 50X is, for example, formed into a taper shape in which an opening width (an opening diameter) is reduced as it goes from the upper side (the conductor layer 60 side) toward the lower side (the conductor layer 40 side) in FIG. 1A. The through hole 50X is, for example, formed into an inverted truncated conical shape in which an opening diameter of a lower side opening end is smaller than an opening diameter of an upper side opening end.

The conductor layer 60 is formed on the upper face of the insulating layer 50. The thickness of the conductor layer 60 can be, for example, set in a range of about 10 to 30 µm. An upper face and a side face of the conductor layer 60 are, for example, roughened faces. The upper face and the side face of the conductor layer 60 are, for example, formed into roughened faces larger in surface roughness than a lower face of the conductor layer 60. The surface roughness of the conductor layer 60 can be, for example, set to be not lower than 200 nm in terms of surface roughness Ra value.

The conductor layer 60 has, for example, a wiring layer 61 and a metal layer 62. The wiring layer 61 and the metal layer 62 are formed separately from each other to be electrically insulated from each other. The wiring layer 61 and the metal layer 62 are formed on one and the same plane.

The wiring layer 61 is, for example, electrically connected to the wiring layer 41 through a via wiring filled in the through hole 50X. The wiring layer 61 is, for example, formed integrally with the via wiring filled in the through hole 50X.

The metal layer 62 is, for example, formed so as to surround the mount region where the electronic component 110 is mounted. The metal layer 62 in the present example is, for example, a dummy pattern which is electrically isolated (floating) without being electrically connected to any other wiring layer or any other conductor layer. The metal layer 62 may be, for example, a wiring pattern for drawing a wiring or may be a power source wiring or a ground wiring. When the metal layer 62 is the wiring pattern, the power source wiring or the ground wiring, for example, the metal layer 62 is electrically connected to another wiring layer or another conductor layer through a via wiring etc.

The insulating layer 70 is formed on the upper face of the insulating layer 50 so as to cover the conductor layer 60. Incidentally, a thickness between the upper face of the conductor layer 60 and an upper face of the insulating layer 70 can be, for example, set in a range of about 40 to 100 µm.

The opening portion 100 is, for example, formed so as to penetrate the insulating layer 50, the metal layer 62 and the insulating layer 70 in the thickness direction. The opening portion 100 is, for example, formed so as to expose a portion of an upper face of the metal layer 42. The opening portion 100 is formed correspondingly to the electronic component 110 embedded in the opening portion 100.

The opening portion 100 in the present example is constituted by a through hole 50Y, a through hole 62Y and a through hole 70Y. The through hole 50Y penetrates the insulating layer 50 in the thickness direction. The through hole 62Y penetrates the metal layer 62 in the thickness direction. The through hole 70Y penetrates the insulating layer 70 in the thickness direction.

As shown in FIG. 2, each of the through holes 50Y, 62Y and 70Y in the present example is formed into a rectangular shape in plan view. The through holes 50Y, 62Y and 70Y are, for example, formed coaxially with each other. That is, positions of a central axis of the through hole 50Y, a central axis of the through hole 62Y and a central axis of the through hole 70Y align with one another in plan view. Each of the planar shapes of the through holes 50Y, 62Y and 70Y is formed to be larger than the planar shape of the electronic component 110. The planar shape of the through hole 50Y, 62Y, 70Y is, for example, formed to be smaller than the planar shape of the metal layer 42.

The through hole 62Y is, for example, formed to be larger in planar shape than each of the through holes 50Y and 70Y. The metal layer 62 is, for example, formed so as to surround opening edges of the through holes 50Y and 70Y from the outside. The metal layer 62 is, for example, formed into a ring shape (frame shape) in plan view. The metal layer 62 in the present example is formed into a rectangular closed ring shape to continuously surround the opening edge of each of the through holes 50Y and 70Y over the whole circumference.

Incidentally, FIG. 2 is a plan view in which the wiring board 10 shown in FIG. 1A is seen from top. In FIG. 2, the insulating layer 80, the wiring layer 90, the solder resist layer 130, etc. are drawn in perspective.

Figure 3:
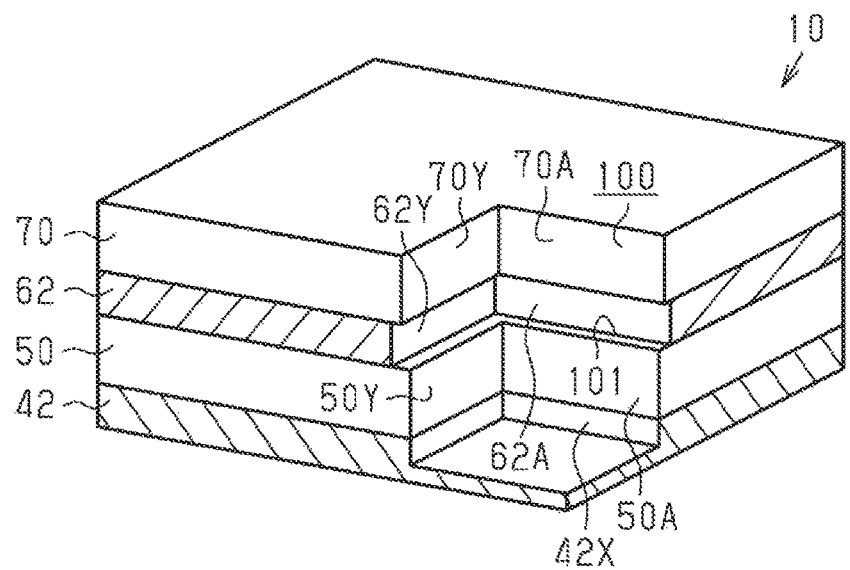
FIG. 3 is a schematic perspective view showing the wiring board according to the first embodiment.

As shown in FIG. 1B and FIG. 3, a side face 62A of the metal layer 62 constituting an inner side face of the opening portion 100 (the through hole 62Y) is provided at a position where the side face 62A is set back (separated) inward of the insulating layer 50 from a side face 50A of the insulating layer 50 constituting the inner side face of the opening portion 100 (the through hole 50Y). The side face 62A of the metal layer 62 is provided at a position where the side face 62A is set back inward of the insulating layer 70 from a side face 70A of the insulating layer 70 constituting the inner side face of the opening portion 100 (the through hole 70Y). That is, the side face 62A of the metal layer 62 is provided at the position where the side face 62A is set back in a direction to be separated more distantly from a planar center of the opening portion 100 than the side faces 50A and 70A of the insulating layers 50 and 70. The side face 62A of the metal layer 62 is, for example, formed so as to be set back from the side faces 50A and 70A of the insulating layers 50 and 70 over the whole circumference of the opening portion 100. The upper face of the insulating layer 50 positioned in the vicinity of the side face 50A of the insulating layer 50 is exposed from the metal layer 62. In addition, a lower face of the insulating layer 70 positioned in the vicinity of the side face 70A of the insulating layer 70 is exposed from the metal layer 62. Thus, a recess 101 constituted by the side face 50A of the insulating layer 50, the upper face of the insulating layer 50 exposed from the metal layer 62, the side face 62A of the metal layer 62, the lower face of the insulating layer 70 exposed from the metal layer 62, and the side face 70A of the insulating layer 70 is formed in the inner side face of the opening portion 100. In other words, a step portion constituted by the recess 101 is formed in the inner side face of the opening portion 100. The recess 101 is, for example, formed continuously over the whole circumference of the opening portion 100.

As shown in FIG. 2, the through hole 50Y of the insulating layer 50 is, for example, formed to be smaller in planar shape than the through hole 70Y of the insulating layer 70. That is, the through hole 50Y has the smallest planar shape among the through holes 50Y, 62Y and 70Y. The size of the through hole 50Y can be, for example, set in a range of about 0.7 mm×0.4 mm to 15 mm×15 mm in plan view.

As shown in FIG. 1B, the side face 70A of the insulating layer 70 is provided at a position where the side face 70A is set back in the direction to be separated more distantly from the planar center of the opening portion 100 than the side face 50A of the insulating layer 50. For example, the side face 70A of the insulating layer 70 is formed so as to be set back from the side face 50A of the insulating layer 50 over the whole circumference of the opening portion 100.

A recess 42X recessed on the insulating layer 30 side is formed in the upper face of the metal layer 42 exposed in the bottom of the opening portion 100 (specifically, the bottom of the through hole 50Y). A bottom face and an inner side face of the recess 42X are, for example, roughened faces. Surface roughness of the bottom face of the recess 42X is, for example, formed to be larger than surface roughness of the upper face of the metal layer 42 covered with the insulating layer 50. In other words, the surface roughness of the upper face of the metal layer 42 exposed in the bottom of the opening portion 100 is formed to be larger than the surface roughness of the upper face of the metal layer 42 covered with the insulating layer 50.

As shown in FIG. 1A, the electronic component 110 is mounted on (adhesively bonded to) the upper face of the metal layer 42 (specifically, the bottom face of the recess 42X) exposed from the opening portion 100 through an adhesive layer 112. That is, the electronic component 110 is disposed inside the opening portion 100. The adhesive layer 112 is formed on the upper face of the metal layer 42. For example, an epoxy-based, polyimide-based or silicone-based thermosetting adhesive agent can be used as the material of the adhesive layer 112.

For example, an active component such as a semiconductor chip, a transistor or a diode or a passive component such as a chip capacitor, a chip inductor or a chip resistor can be used as the electronic component 110. For example, a component made of silicon or a component made of ceramic can be used as the electronic component 110. The electronic component 110 according to the present embodiment is a semiconductor chip. For example, a logic chip such as a CPU (Central Processing Unit) chip or a GPU (Graphics Processing Unit) chip can be used as the semiconductor chip. In addition, for example, a memory chip such as a DRAM (Dynamic Random Access Memory) chip, an SRAM (Static Random Access Memory) chip or a flash memory chip can be used as the semiconductor chip.

The electronic component 110 can be, for example, made of a semiconductor substrate. For example, silicon etc. can be used as the material of the semiconductor substrate. Electrode terminals 111 are provided on, of the electronic component 110, a circuit formation face 110A where a semiconductor integrated circuit (not shown) is formed. The electrode terminals 111 are, for example, metal posts each formed in the shape of a column extending upward from the circuit formation face 110A. For example, copper or a copper alloy can be used as the material of the electrode terminals 111.

The electronic component 110 is bonded to the upper face of the metal layer 42 by the adhesive layer 112 in a state in which a back face (a lower face in this case) of the electronic component 110 opposite to the circuit formation face 110A is opposed to the upper face of the metal layer 42, i.e. faces up. Upper faces of the electrode terminals 111 are, for example, formed on the same plane as the upper face of the insulating layer 70 or formed to be lower than the upper face of the insulating layer 70.

The insulating layer 80 is formed so as to fill the opening portion 100 and entirely cover the electronic component 110. The insulating layer 80 is, for example, formed so as to cover an entire side face of the adhesive layer 112, an entire side face of the electronic component 110, the entire circuit formation face 110A exposed from the electrode terminals 111, and the upper faces and side faces of the electrode terminals 111. The insulating layer 80 is, for example, formed so as to cover the surface of the metal layer 42 exposed from the adhesive layer 112 inside the opening portion 100. The insulating layer 80 is, for example, formed so as to fill the opening portion 100 and the recess 101 formed in the inner side face of the opening portion 100.

As shown in FIG. 1B, the insulating layer 80 is formed so as to cover the entire side face 50A of the insulating layer 50, the entire upper face of the insulating layer 50 exposed from the metal layer 62, the entire side face 62A of the metal layer 62, the entire lower face of the insulating layer 70 exposed from the metal layer 62, and the entire side face 70A of the insulating layer 70. The insulating layer 80 is, for example, formed to bite into the lower face of the insulating layer 70 exposed by the recess 101.

As shown in FIG. 1A, the insulating layer 80 is, for example, formed so as to cover the entire upper face of the insulating layer 70. A through hole 80X penetrating the insulating layers 70 and 80 in the thickness direction so as to expose a portion of the upper face of the conductor layer 60 (the wiring layer 61 in this case) is formed at a required place in the insulating layers 70 and 80. In addition, a through hole 80Y penetrating the insulating layer 80 in the thickness direction so as to expose a portion of the upper face of each of the electrode terminals 111 is formed at a required place in the insulating layer 80. Each of the through holes 80X and 80Y is, for example, formed into a taper shape in which an opening width (an opening diameter) is reduced as it goes from the upper side (the wiring layer 90 side) toward the lower side (the wiring layer 61 side or the electrode terminal 111 side) in FIG. 1A. For example, the through hole 80X, 80Y is formed into an inverted truncated conical shape in which an opening diameter of a lower side opening end is smaller than an opening diameter of an upper side opening end.

The wiring layer 90 is formed on the upper face of the insulating layer 80. The wiring layer 90 is, for example, an outermost (uppermost in this case) wiring layer of the wiring board 10. The wiring layer 90 has a wiring layer electrically connected to the wiring layer 61 through a via wiring filled in the through hole 80X. The wiring layer 90 has a wiring layer electrically connected to the electrode terminal 111 through a via wiring filled in the through hole 80Y. The wiring layer 90 is formed integrally with the via wiring filled in the through hole 80X or the through hole 80Y. The thickness of the wiring layer 90 can be, for example, set in a range of about 10 to 30 μm.

The solder resist layer 120 is formed on the lower face of the outermost (lowermost in this case) insulating layer 30 so as to cover the lowermost wiring layer 20. For example, an insulating resin such as an epoxy resin or an acrylic resin can be used as the material of the solder resist layer 120. The thickness of the solder resist layer 120 can be, for example, set in a range of about 10 to 30 μm.

An opening portion 120X for exposing at least a portion of the lower face of the lowermost wiring layer 20 as a pad P1 is formed in the solder resist layer 120. For example, an external connection terminal such as a solder ball or a lead pin, which is used when the wiring board 10 is mounted on a mount board such as a motherboard is connected to the pad P1. That is, the pad P1 in the present example functions as an external connection pad.

Incidentally, a surface treatment layer may be formed on a lower face of the pad P1 if occasions demand. A gold (Au) layer, a nickel (Ni) layer/Au layer (a metal layer in which the Ni layer and the Au layer are formed in the named order), an Ni layer/palladium (Pd) layer/Au layer (a metal layer in which the Ni layer, the Pd layer and the Au layer are formed in the named order), etc. can be listed as examples of the surface treatment layer. Here, the Au layer is a metal layer made of Au or an Au alloy. The Ni layer is a metal layer made of Ni or an Ni alloy. The Pd layer is a metal layer made of Pd or a Pd alloy. For example, a metal layer (an electroless plating metal layer) formed by an electroless plating method can be used as each of the Ni layer, the Au layer and the Pd layer. In addition, an OSP (Organic Solderability Preservative) film formed by applying antioxidation treatment such as OSP treatment to the surface of the pad P1 can be used as another example of the surface treatment layer. An organic coating of an azole compound, an imidazole compound, or the like, can be used as the OSP film. Incidentally, the wiring layer 20 per se exposed from the opening portion 120X (or the surface treatment layer in the case where the surface treatment layer is formed on the wiring layer 20) may be set as the external connection terminal.

The solder resist layer 130 is formed on the upper face of the outermost (uppermost in this case) insulating layer 80 so as to cover the uppermost wiring layer 90. For example, an insulating resin such as an epoxy resin or an acrylic resin can be used as the material of the solder resist layer 130. The thickness of the solder resist layer 130 can be, for example, set in a range of about 10 to 30 μm.

An opening portion 130X is formed in the solder resist layer 130 in order to expose at least a portion of the uppermost wiring layer 90 as a pad P2. The pad P2 functions, for example, as an electronic component mounting pad in order to be electrically connected to an electronic component such as a semiconductor chip.

Incidentally, a surface treatment layer may be formed on the surface (an upper face and a side face or only an upper face) of the pad P2 if occasions demand. Metal layers such as an Au layer, an Ni layer/Au layer and an Ni layer/Pd layer/Au layer and an OSP film can be used as examples of the surface treatment layer.

Next, the structure of a semiconductor device 11 will be described in accordance with FIG. 4. The semiconductor device 11 has the wiring board 10, one or more semiconductor chips 140 (one semiconductor chip 140 in FIG. 4), and an underfill resin 150. The semiconductor chip 140 is flip-chip mounted on the wiring board 10. That is, a bump 141 disposed and provided on a circuit formation face (a lower face in this case) of the semiconductor chip 140 is bonded to the pad P2 of the wiring board 10. Thus, the semiconductor chip 140 is electrically connected to the pad P2 (the wiring layer 90) through the bump 141.

For example, a logic chip such as a CPU chip or a GPU chip, or a memory chip such as a DRAM chip, an SRAM chip or a flash memory chip can be used as the semiconductor chip 140. Incidentally, when a plurality of semiconductor chips 140 are mounted on the wiring board 10, the logic chip and the memory chip may be configured in combination and mounted on the wiring board 10.

For example, a gold bump or a solder bump can be used as the bump 141. For example, an alloy containing lead (Pb), a tin (Sn)—Au alloy, an Sn—Cu alloy, an Sn—Ag alloy, an Sn-silver (Ag)—Cu alloy, or the like, can be used as the material of the solder bump.

The underfill resin 150 is provided to fill a gap between the wiring board 10 and the semiconductor chip 140. For example, an insulating resin such as an epoxy resin can be used as the material of the underfill resin 150.

Next, a method for manufacturing the wiring board 10 will be described. Incidentally, portions to be final constituent elements of the wiring board 10 will be designated by signs of the final constituent elements for convenience of explanation in the description.

Figure 5A:
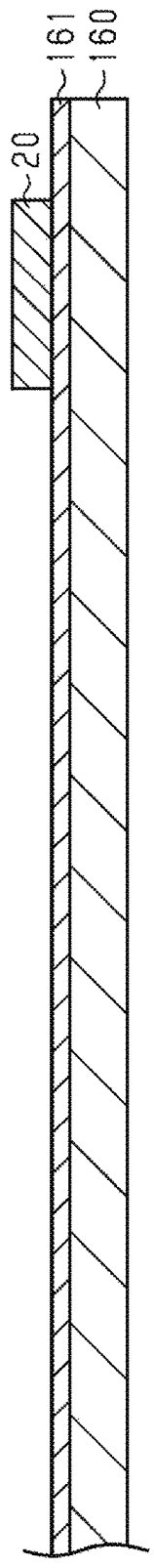
FIGS. 5A to 5C are schematic sectional views showing a method for manufacturing the wiring board according to the first embodiment.

First, a support substrate 160 is prepared, as shown in FIG. 5A. For example, a plate-like material high in rigidity, such as silicon, glass or metal (such as copper) can be used as the material of the support substrate 160. For example, a metal plate or a metal foil sheet can be used as the support substrate 160. A copper foil sheet in which an ultrathin copper foil sheet about 2 to 5 µm thick is pasted to a support body copper foil sheet, which is about 35 to 70 µm thick, through a peeling layer is used as the support substrate 160 in the present example.

Next, a metal film 161 covering an entire upper face of the support substrate 160 is formed on the upper face of the support substrate 160. For example, the metal film 161 is formed on an upper face of the ultrathin copper foil sheet of the support substrate 160. The metal film 161 can be, for example, formed by a sputtering method, a vapor deposition method or an electrolytic plating method. For example, an electrically conductive material serving as a stopper layer when the support substrate 160 is etched and removed can be used as the material of the metal film 161. In addition, for example, an electrically conductive material which can be selectively etched and removed from a wiring layer 20 (e.g. a Cu layer) which will be formed by a subsequent step can be used as the material of the metal film 161. For example, a metal such as nickel (Ni), titanium (Ti), chromium (Cr), tin, cobalt (Co), iron (Fe) or palladium or an alloy containing at least one metal selected from the aforementioned metals can be used as the material of such a metal film 161. Ni is used as the material of the metal film 161 in the present example. The thickness of the metal film 161 can be, for example, set in a range of about 0.1 to 1.0 µm.

Successively, the wiring layer 20 is formed on an upper face of the metal film 161. The wiring layer 20 can be, for example, formed by a semi-additive method. Specifically, first, a resist pattern (not shown) having an opening portion corresponding to the shape of the wiring layer 20 is formed on the upper face of the metal film 161. Successively, by an electrolytic copper plating method using the support substrate 160 and the metal film 161 as power feed layers, a copper plating coating is deposited on the upper face of the metal film 161 exposed from the opening portion of the resist pattern. Then, the resist pattern is removed. In this manner, the wiring layer 20 can be formed on the metal film 161. Incidentally, any of various wiring formation methods such as a subtractive method other than the semi-additive method can be also used as the method for forming the wiring layer 20.

Figure 5B:
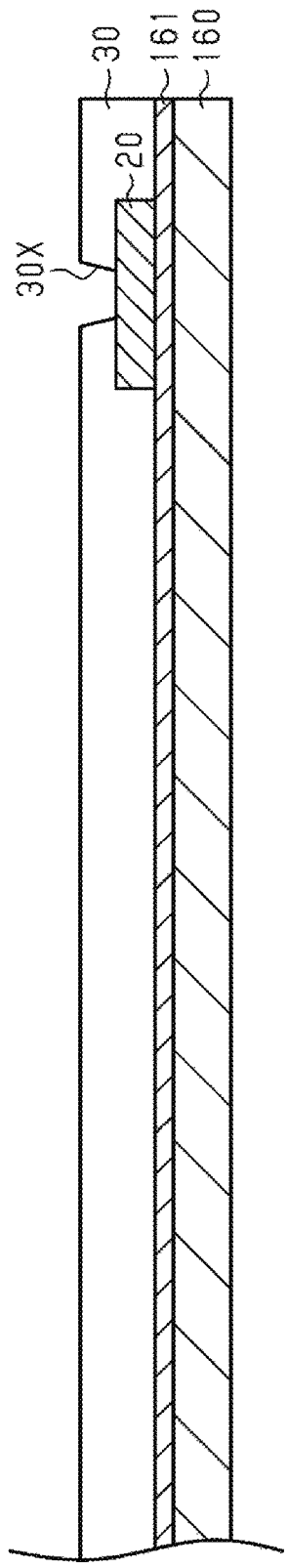

Next, an insulating layer 30 having a through hole 30X exposing a portion of an upper face of the wiring layer 20 is formed on the upper face of the metal film 161 in a step shown in FIG. 5B. When, for example, a resin film is used as the insulating layer 30, the resin film is laminated on the upper face of the metal film 161 by thermocompression bonding, and the resin film is patterned by a photolithographic method in order to form the insulating layer 30. Alternatively, a liquid or paste-like insulating resin may be applied to the upper face of the metal film 161 by a spin coating method etc., and the insulating resin may be patterned by a photolithographic method in order to form the insulating layer 30.

Figure 5C:
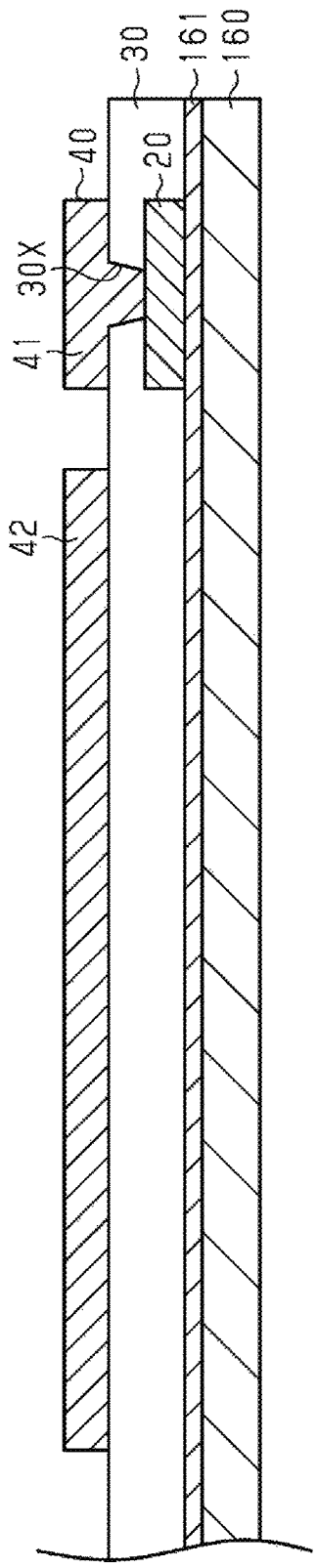

Next, a via wiring filled in the through hole 30X is formed, and a conductor layer 40 is formed on an upper face of the insulating layer 30, for example, by a semi-additive method, in a step shown in FIG. 5C. The conductor layer 40 has a wiring layer 41 and a metal layer 42. The wiring layer 41 is electrically connected to the wiring layer 20 through the via wiring filled in the through hole 30X. The metal layer 42 is formed in a mount region of an electronic component 110 (see FIG. 1A).

Figure 6A:
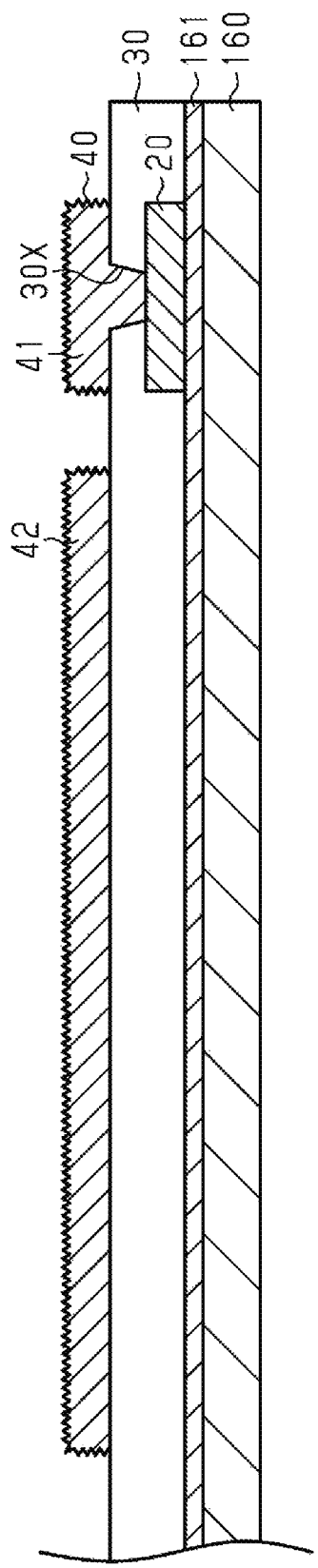
FIGS. 6A and 6B are schematic sectional views showing the method for manufacturing the wiring board according to the first embodiment.

Successively, roughening treatment is applied to the conductor layer 40 in a step shown in FIG. 6A. An entire upper face and an entire side face of the conductor layer 40 are formed into roughened faces by the roughening treatment. For example, blackening treatment, etching treatment, plating, blast treatment, or the like, can be performed as the roughening treatment.

Figure 6B:
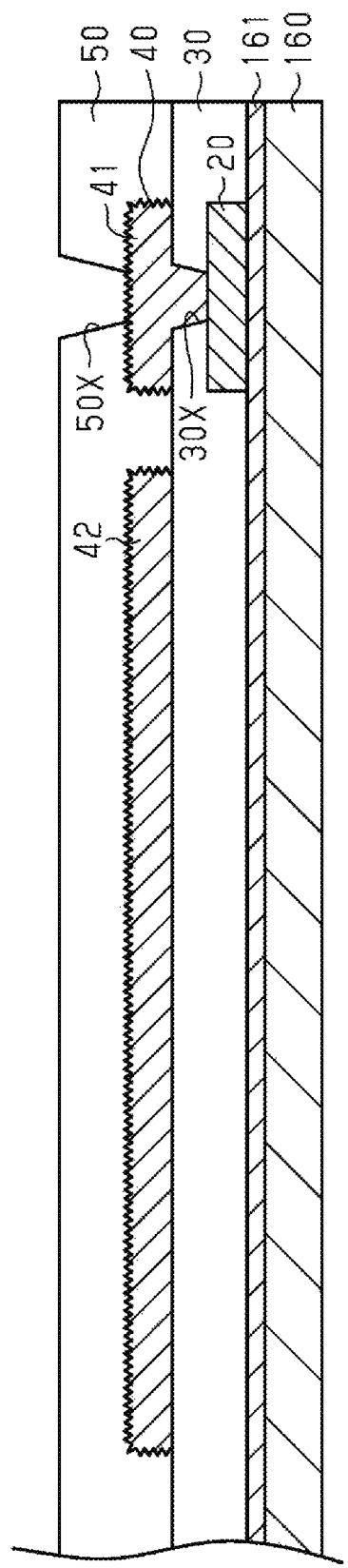

Next, an insulating layer 50 having a through hole 50X exposing a portion of an upper face of the wiring layer 41 is formed on the upper face of the insulating layer 30 in a similar manner to or the same manner as the step shown in FIG. 5B, in a step shown in FIG. 6B. On this occasion, the insulating layer 50 is formed so as to cover an entire upper face and an entire side face of the metal layer 42.

Next, a via wiring filled in the through hole 50X is formed, and a conductor layer 60 is formed on an upper face of the insulating layer 50, for example, by a semi-additive method, in a step shown in FIG. 7A. The conductor layer 60 has a wiring layer 61 and a metal layer 62. The wiring layer 61 is electrically connected to the wiring layer 41 through the via wiring filled in the through hole 50X. The metal layer 62 has a through hole 62Y. On this occasion, the planar shape of the through hole 62Y is formed to be smaller than the planar shape of the metal layer 42.

Successively, roughening treatment is applied to the conductor layer 60. By the roughening treatment, an entire upper face and an entire side face of the conductor layer 60 are formed into roughened faces. For example, blackening treatment, etching treatment, plating, blast treatment, or the like, can be performed as the roughening treatment.

Next, an insulating layer 70 covering the wiring layer 61 and the metal layer 62 is formed on the upper face of the insulating layer 50 in a similar manner to or the same manner as the step shown in FIG. 5B, in a step shown in FIG. 7B. On this occasion, the insulating layer 70 is formed so as to cover an entire upper face and an entire side face of the metal layer 62. The insulating layer 70 is formed so as to fill the through hole 62Y.

Next, in a step shown in FIG. 8A, a through hole 70Y penetrating the insulating layer 70 in a thickness direction is formed and a through hole 50Y penetrating the insulating layer 50 in the thickness direction is formed, so that a portion of the metal layer 42 corresponding to the mount region of the electronic component 110 (see FIG. 1A) is exposed from the through holes 70Y and 50Y The through holes 50Y and 70Y can be, for example, formed by a laser machining method using a $CO_2$ laser, a YAG laser, or the like.

In the present step, the planar shape of the through hole 70Y is formed to be one size larger than the planar shape of the through hole 62Y of the metal layer 62. Therefore, a portion of the upper face of the metal layer 62 in the vicinity of the opening edge of the through hole 70Y is exposed from the insulating layer 70. On this occasion, the metal layer 62 exposed from the insulating layer 70 functions as a mask and a stopper layer during the laser machining. Therefore, the through hole 50Y penetrating the insulating layer 50 in the thickness direction is formed in the insulating layer 50 exposed from the through hole 62Y of the metal layer 62.

Thus, the planar shape of the through hole 50Y is formed into a size substantially equal to the planar shape of the through hole 62Y. In the present step, the metal layer 42 functions as a stopper layer during the laser machining.

By the present step, the through hole 50Y, the through hole 62Y and the through hole 70Y are formed to communicate with one another so that an opening portion 100 penetrating the insulating layer 50, the metal layer 62 and the insulating layer 70 in the thickness direction is formed. The portion of the upper face of the metal layer 42 is exposed from the opening portion 100.

Successively, resin smear adhering to the exposed face of the metal layer 42 exposed in the bottom of the opening portion 100 (specifically, the bottom of the through hole 50Y) is removed by desmear treatment in a step shown in FIG. 8B. By the desmear treatment, portions of the insulating layers 50 and 70 exposed in an inner side face of the opening portion 100 are removed. Therefore, side faces 50A and 70A of the insulating layers 50 and 70 constituting the inner side face of the opening portion 100 are set back in a direction to be separated more distantly from the planar center of the opening portion 100. Thus, a portion of a lower face of the metal layer 62 is exposed from the insulating layer 50.

Figure 9A:
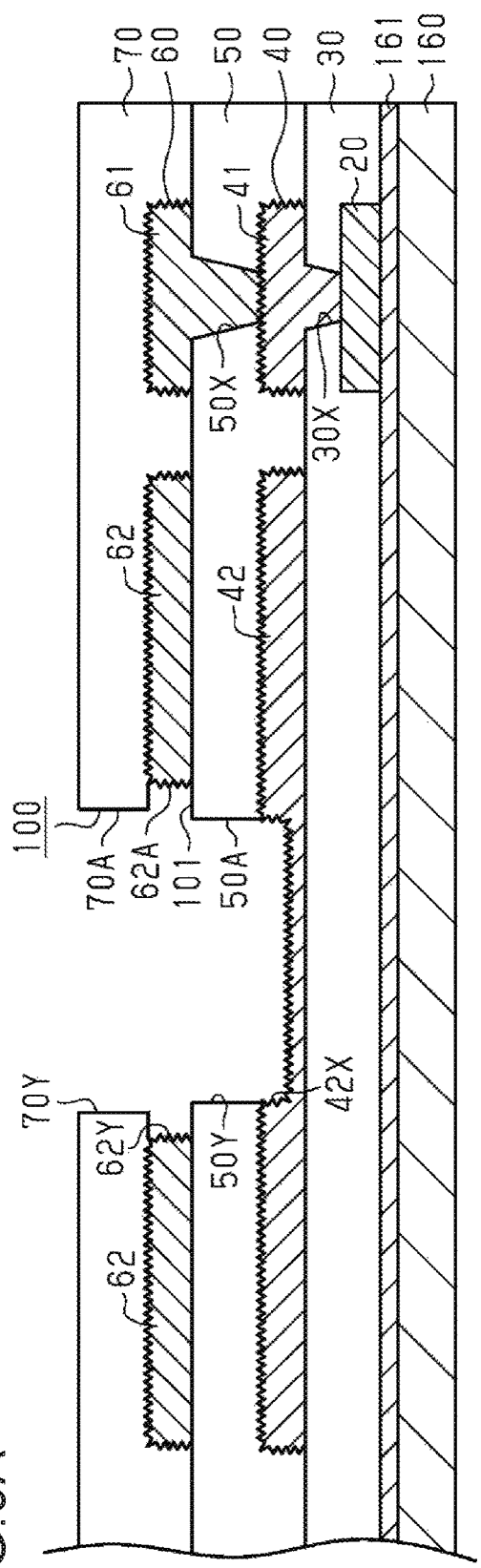
FIGS. 9A and 9B are schematic sectional views showing the method for manufacturing the wiring board according to the first embodiment.

Next, in a step shown in FIG. 9A, a portion of the metal layer 62 is removed so as to make the planar shape of the through hole 62Y of the metal layer 62 larger than each of the planar shapes of the through holes 50Y and 70Y. The metal layer 62 can be, for example, removed by isotropic etching using the insulating layer 70 as an etching mask. By the isotropic etching, first, the metal layer 62 exposed from the insulating layer 70 is etched and removed. Successively, by the isotropic etching, the metal layer 62 covered with the insulating layer 70 is also removed due to a side etch phenomenon in which the etching proceeds in an in-plane direction of the metal layer 62. Thus, a side face 62A of the metal layer 62 constituting the inner side face of the opening portion 100 is set back in a direction to be separated more distantly from the planar center of the opening portion 100 than each of side faces 50A and 70A of the insulating layers 50 and 70. As a result, a recess 101 constituted by the side face 62A of the metal layer 62 and the side faces 50A and 70A of the insulating layers 50 and 70 is formed in the inner side face of the opening portion 100. In other words, a step portion made up of the recess 101 is formed in the inner side face of the opening portion 100 in the present step.

In the present step, the metal layer 42 is also etched and removed at the same time when the metal layer 62 is etched and removed. By the etching removal, a recess 42X recessed on the insulating layer 30 side is formed in the upper face of the metal layer 42 exposed from the insulating layer 50. Further, surface roughness of a bottom face of the recess 42X is larger than that prior to the etching treatment. Therefore, the surface roughness of the bottom face of the recess 42X is larger than surface roughness of the upper face of the metal layer 42 covered with the insulating layer 50.

Figure 9B:
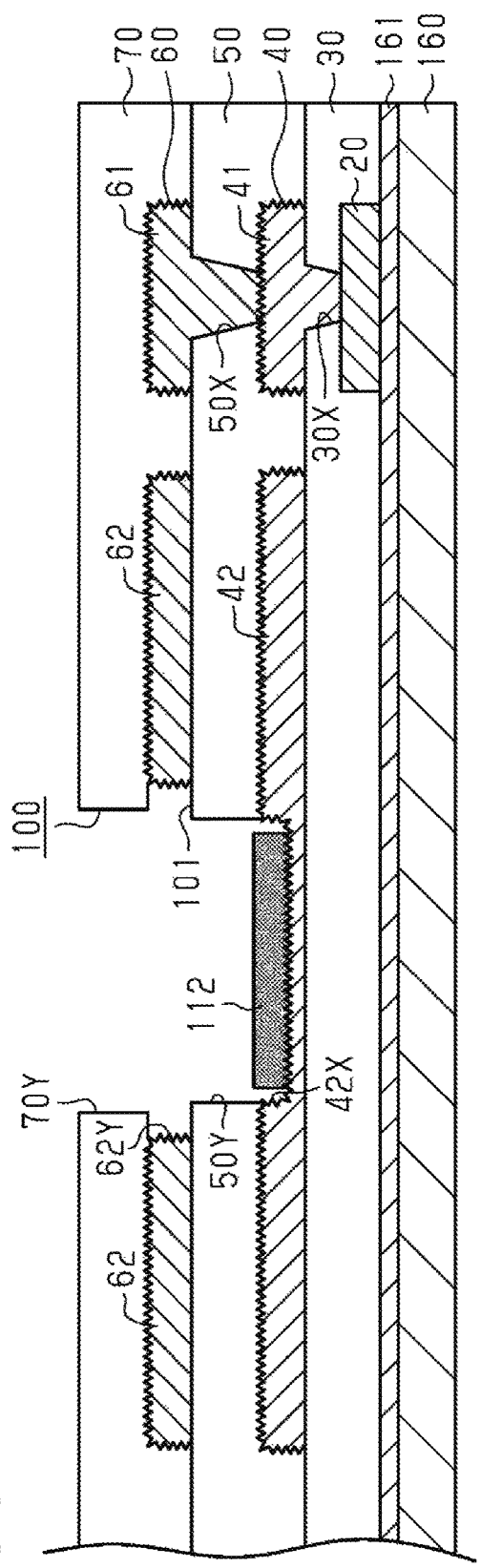

Next, in a step shown in FIG. 9B, an adhesive layer 112 is formed on the upper face of the metal layer 42 exposed from the opening portion 100. The adhesive layer 112 can be, for example, formed by applying a liquid resin or a paste-like resin which will be the adhesive layer 112, to the upper face of the metal layer 42. Incidentally, for example, an adhesive agent made of an epoxy-based resin is used as the adhesive layer 112. In addition, the resin agent in A-stage is used as the adhesive layer 112 in the present step. Incidentally, the resin agent in B-stage may be used as the adhesive layer 112 in the present step.

Successively, in a step shown in FIG. 10A, the electronic component 110 is mounted on the adhesive layer 112 inside the opening portion 100 by use of a mounter. On this occasion, the electronic component 110 is fixed on the adhesive layer 112 in a face-up state.

Next, in a step shown in FIG. 10B, an insulating layer 80 with which the opening portion 100 and the recess 101 are filled is formed. The insulating layer 80 is formed so as to cover the entire surface of the electronic component 110 not in contact with the adhesive layer 112. The insulating layer 80 is formed so as to cover an entire upper face of the insulating layer 70. On this occasion, upper faces of electrode terminals 111 of the electronic component 110 are formed either on the same plane as the upper face of the insulating layer 70 or to be lower than the upper face of the insulating layer 70. Accordingly, an upper face of the insulating layer 80 can be formed flatly.

Next, in a step shown in FIG. 11A, a through hole 80X penetrating the insulating layers 70 and 80 continuously in the thickness direction is formed at a required place in the insulating layers 70 and 80, and through holes 80Y are formed at required places in the insulating layer 80. The through holes 80X and 80Y can be, for example, formed by a laser machining method using a $CO_2$ laser, a YAG laser, or the like.

Successively, in a step shown in FIG. 11B, via wirings with which the through holes 80X and 80Y are filled are formed, and a wiring layer 90 electrically connected to the wiring layer 61 or the electrode terminals 111 through the via wirings is formed on the upper face of the insulating layer 80, for example, by a semi-additive method.

Next, in a step shown in FIG. 12A, a solder resist layer 130 having an opening portion 130X is formed on the upper face of the insulating layer 80. The solder resist layer 130 can be formed, for example, by laminating a photosensitive solder resist film or applying a liquid solder resist and patterning the resist into a required shape. By the present step, the wiring layer 90 exposed from the opening portion 130X is a pad P2. Incidentally, for example, a metal layer (i.e. a surface treatment layer) in which an Ni layer and an Au layer are formed in the named order may be formed on the pad P2 if occasions demand. The metal layer can be, for example, formed by an electroless plating method.

Successively, the support substrate 160 is removed. For example, the support body copper foil sheet of the support substrate 160 is mechanically peeled from the ultrathin copper foil sheet. On this occasion, the peeling layer is interposed between the support body copper foil sheet and the ultrathin copper foil sheet. Since an adhesive force between the support body copper foil sheet and the ultrathin copper foil sheet is weak, the support body copper foil sheet can be easily peeled from the ultrathin copper foil sheet. Then, the ultrathin copper foil sheet remaining on the metal film 161 is, for example, removed by wet etching using an aqueous solution of ferric chloride, an aqueous solution of cupric chloride, an aqueous solution of ammonium persulfate, or the like. On this occasion, the metal film 161 functions as a stopper layer when the ultrathin copper foil sheet of the support substrate 160 is etched.

Successively, the metal film 161 is removed by etching. When, for example, Ni is used as the material of the metal film 161, the metal film 161 is selectively etched and removed from the wiring layer 20 (the Cu layer) by wet etching using a hydrogen peroxide/nitric acid-based solution. On this occasion, the wiring layer 20 and the insulating layer 30 function as stopper layers when the metal film 161 is etched. By the present step, a lower face of the wiring layer 20 and a lower face of the insulating layer 30 are exposed to the outside, as shown in FIG. 12B. On this occasion, the lower face of the wiring layer 20 and the lower face of the insulating layer 30 which are in contact with an upper face of the metal film 161 (see FIG. 12A) are formed into a shape extending along the upper face (a flat face in this case) of the metal film 161. Therefore, the lower face of the wiring layer 20 and the lower face of the insulating layer 30 are formed to be substantially flush with each other.

Figure 13:
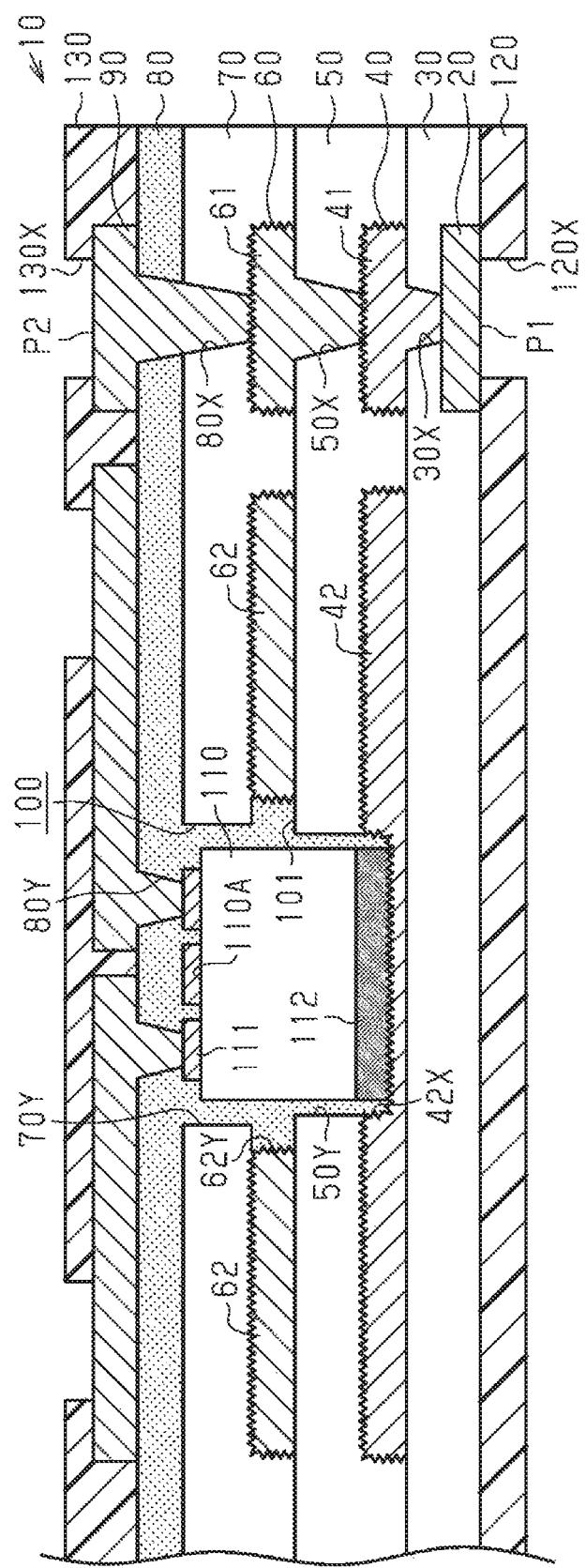
FIG. 13 is a schematic sectional view showing the method for manufacturing the wiring board according to the first embodiment.

Next, in a step shown in FIG. 13, a solder resist layer 120 having an opening portion 120X is formed on the lower face of the insulating layer 30 in a similar manner to or the same manner as the step shown in FIG. 12A. Thus, the wiring layer 20 exposed from the opening portion 120X serves as a pad P1. Incidentally, for example, a metal layer (i.e. a surface treatment layer) in which an Ni layer and an Au layer are formed in the named order may be formed on the pad P1 if occasions demand. The metal layer can be, for example, formed by an electroless plating method.

By the aforementioned manufacturing process, the wiring board 10 shown in FIGS. 1A and 1B can be manufactured. Incidentally, the wiring board 10 can be used in a reversed state or can be disposed at any angle.

Next, a method for manufacturing a semiconductor device 11 will be described.

Figure 14:
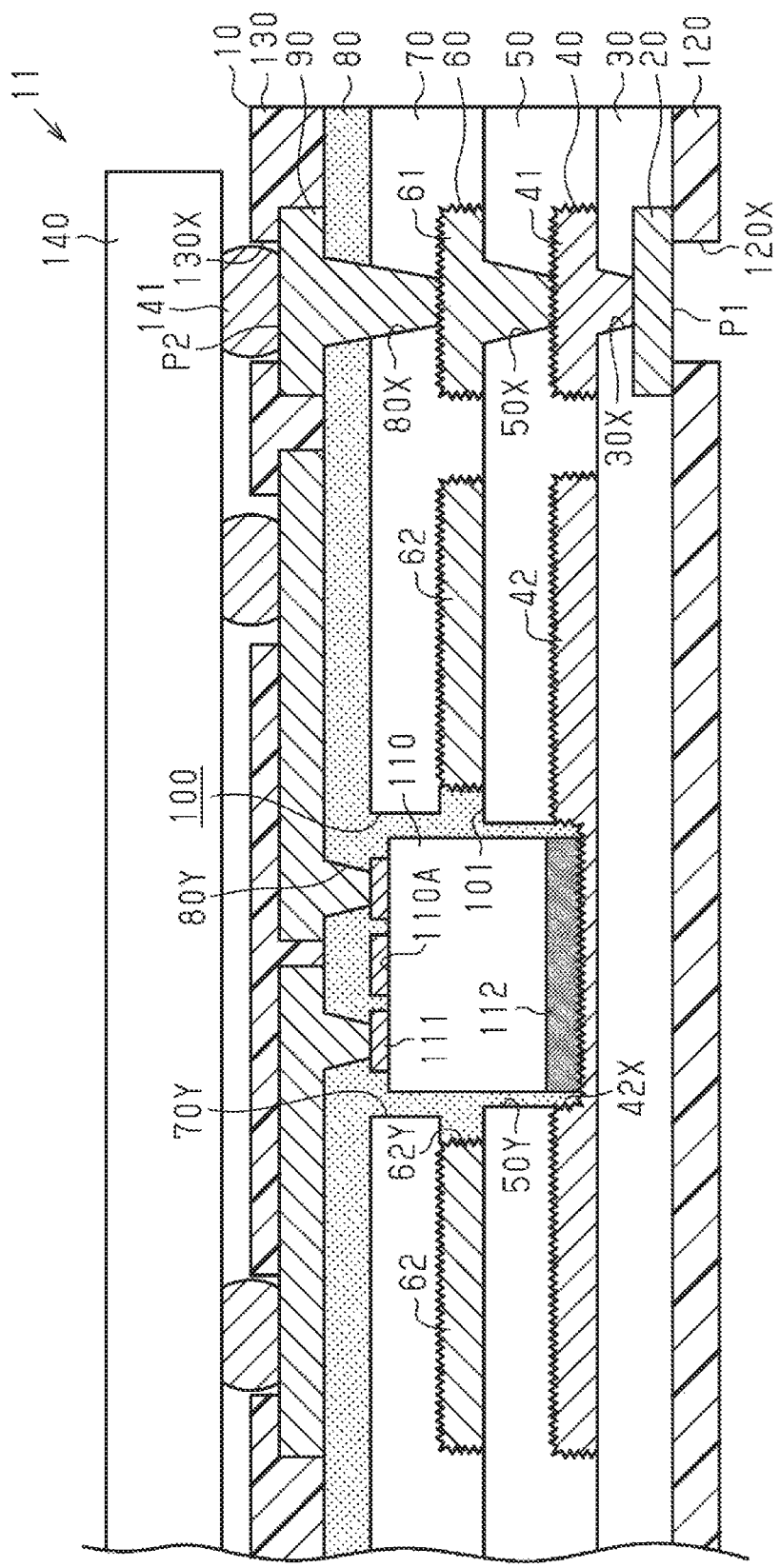
FIG. 14 is a schematic sectional view showing a method for manufacturing the semiconductor device according to the first embodiment.

First, a semiconductor chip 140 having a bump 141 formed on a circuit formation face of the semiconductor chip 140 is prepared in a step shown in FIG. 14. Successively, the bump 141 of the semiconductor chip 140 is flip-chip bonded onto the pad P2 of the wiring board 10. For example, when the bump 141 is a solder bump, reflow treatment is performed after the bump 141 and the pad P2 are aligned with each other. As a result, the bump 141 (the solder bump) is melted so that the bump 141 is electrically connected to the pad P2.

Successively, an underfill resin 150 (see FIG. 4) is formed between an upper face of the wiring board 10 and a lower face of the semiconductor chip 140.

Figure 4:
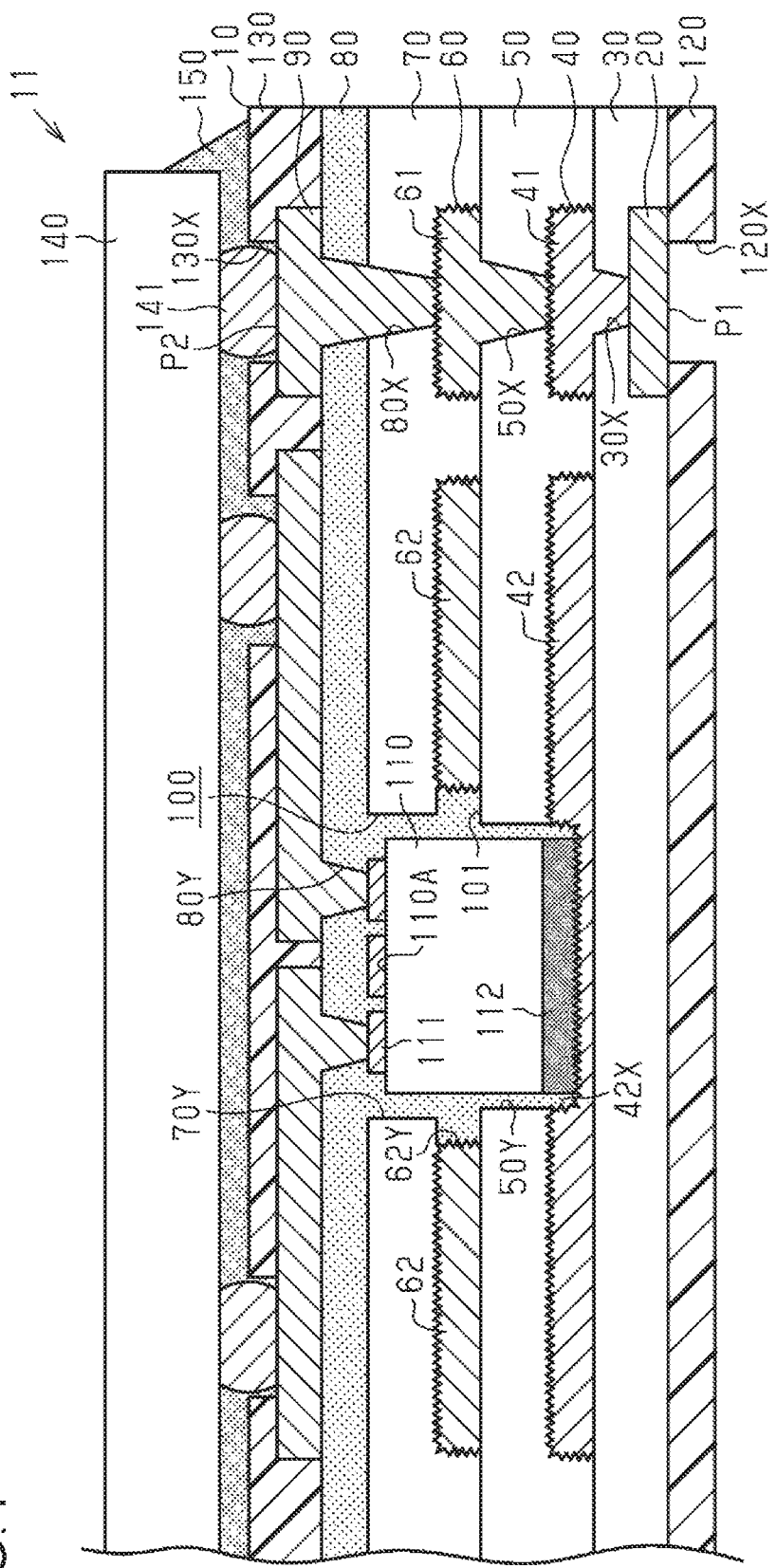
FIG. 4 is a schematic sectional view showing a semiconductor device according to the first embodiment.

The semiconductor device 11 shown in FIG. 4 can be manufactured by the aforementioned manufacturing process.

Next, operations and effects of the present embodiment will be described.

(1) The step portion constituted by the side face 50A of the insulating layer 50 and the side face 62A of the metal layer 62 is formed in the inner side face of the opening portion 100 where the electronic component 110 is received. In the configuration, the step portion is also formed in an interface between the inner side face of the opening portion 100 and the insulating layer 80 with which the opening portion 100 is filled. Peeling of the insulating layer 80 propagated to the interface between the insulating layer 50 and the insulating layer 80 can be stopped by the step portion. To give detailed description, stress is apt to be concentrated on the vicinity of an opening edge of the bottom of the opening portion 100 when a warp or thermal stress occurs in the wiring board 10. Therefore, the peeling of the insulating layer 80 may occur at the interface between the metal layer 42 and the insulating layer 80 in the vicinity of the opening edge of the bottom of the opening portion 100. When the peeling occurs at the interface between the metal layer 42 and the insulating layer 80, the peeling may be propagated to the interface between the inner side face of the opening portion 100 and the insulating layer 80. On this occasion, due to the step portion formed in the inner side face of the opening portion 100 in the wiring board 10 according to the present embodiment, the peeling of the insulating layer 80 can be stopped at the step portion. Thus, the peeling of the insulating layer 80 can be stopped halfway in the depth direction of the opening portion 100. Accordingly, the wiring layer 90 formed on the upper face of the insulating layer 80 can be suitably suppressed from being broken due to the peeling of the insulating layer 80. As a result, lowering of electrical reliability of the wiring board 10 can be suitably suppressed.

(2) The recess 101 constituted by the side face 50A of the insulating layer 50, the upper face of the insulating layer 50 exposed from the metal layer 62, the side face 62A of the metal layer 62, the lower face of the insulating layer 70 exposed from the metal layer 62, and the side face 70A of the insulating layer 70 is formed in the inner side face of the opening portion 100. That is, the side face 62A of the metal layer 62 is set back from the side faces 50A and 70A of the insulating layers 50 and 70 so that the recess 101 is formed. The step portion is constituted by the recess 101. Further, the insulating layer 80 is formed so as to fill the recess 101. Thus, a portion of the insulating layer 80 (specifically, the insulating layer 80 with which the recess 101 is filled) is formed to bite into the lower face of the insulating layer 70. Therefore, tight adhesiveness between the insulating layer 70 and the insulating layer 80 can be improved due to an anchor effect.

(3) The recess 101 is formed into a closed ring shape so as to surround the opening portion 100 over the whole circumference in plan view. In other words, the recess 101 is formed to entirely surround the electronic component 110 in plan view. According to the configuration, peeling of the insulating layer 80 can be stopped by the recess 101 even when the peeling occurred at any position of the opening edge of the bottom of the opening portion 100.

Modifications of First Embodiment

Incidentally, the aforementioned first embodiment may be changed suitably and carried out in the following modes. The aforementioned first embodiment and the following modifications can be combined with each other and carried out within a range in which the first embodiment and the modifications are not technically contradictory to each other.

In the aforementioned first embodiment, the opening portion 100 is constituted by two insulating layers 50 and 70 and one metal layer 62. However, the numbers of the insulating layers and the metal layers constituting the opening portion 100 are not limited particularly.

Figure 15:
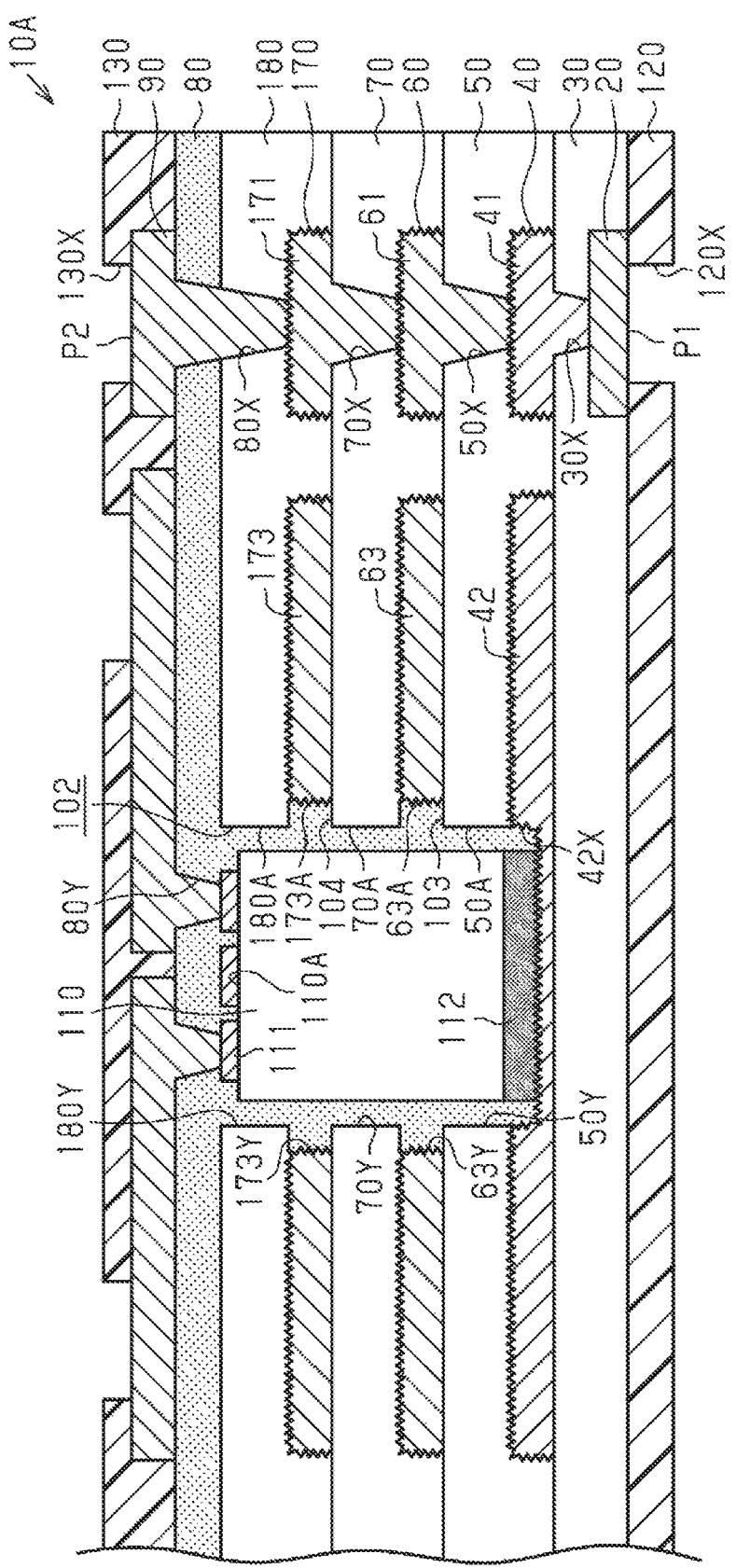
FIG. 15 is a schematic sectional view showing a wiring board according to a modification.

An opening portion 102 where an electronic component 110 is received may be constituted by three insulating layers 50, 70 and 180 and two metal layers 63 and 173, for example, as in a wiring board 10A shown in FIG. 15. The structure of the wiring board 10A will be described below. Incidentally, the same members as the aforementioned members shown in FIG. 1A to FIG. 14 are referred to by the same signs respectively and correspondingly, and detailed description about respective elements of the members will be omitted.

For example, a conductor layer 60 has a wiring layer 61 and the metal layer 63. The wiring layer 61 and the metal layer 63 are formed separately from each other to be electrically insulated from each other. The metal layer 63 is, for example, formed so as to surround a mount region where the electronic component 110 is mounted.

The insulating layer 70 is formed on an upper face of the insulating layer 50 so as to cover the conductor layer 60. A through hole 70X penetrating the insulating layer 70 in a thickness direction to expose a portion of an upper face of the conductor layer 60 (the wiring layer 61 in this case) is formed at a required place in the insulating layer 70. The through hole 70X is, for example, formed into an inverted truncated conical shape in which an opening diameter of a lower side opening end is smaller than an opening diameter of an upper side opening end.

A conductor layer 170 is formed on an upper face of the insulating layer 70. The thickness of the conductor layer 170 can be, for example, set in a range of about 10 to 30 μm. An upper face and a side face of the conductor layer 170 are, for example, roughened faces. The upper face and the side face of the conductor layer 170 are, for example, formed into roughened faces larger in surface roughness than a lower face of the conductor layer 170. The surface roughness of the conductor layer 170 can, for example, set to be not lower than 200 nm in terms of surface roughness Ra value.

For example, the conductor layer 170 has a wiring layer 171 and the metal layer 173. The wiring layer 171 and the metal layer 173 are formed separately from each other to be electrically insulated from each other.

The wiring layer 171 is, for example, electrically connected to the wiring layer 61 through a via wiring filled in the through hole 70X. The wiring layer 171 is, for example, formed integrally with the via wiring filled in the through hole 70X. The metal layer 173 is, for example, formed so as to surround the mount region where the electronic component 110 is mounted.

Each of the metal layers 63 and 173 in the present example is, for example, a dummy pattern which is electrically isolated (floating) without being electrically connected to any other wiring layer or any other conductor layer. For example, the metal layer 63, 173 may be a wiring pattern for drawing a wiring, or may be a power source wiring or a ground wiring.

The insulating layer 180 is formed on the upper face of the insulating layer 70 so as to cover the conductor layer 170. Incidentally, a thickness between the upper face of the conductor layer 170 and an upper face of the insulating layer 180 can be, for example, set in a range of about 40 to 100 μm.

The opening portion 102 is, for example, formed so as to penetrate the insulating layer 50, the metal layer 63, the insulating layer 70, the metal layer 173 and the insulating layer 180 in the thickness direction. The opening portion 102 is, for example, formed so as to expose a portion of an upper face of a metal layer 42. The opening portion 102 is formed correspondingly to the electronic component 110 embedded in the opening portion 102.

The opening portion 102 in the present example is constituted by a through hole 50Y of the insulating layer 50, a through hole 63Y, a through hole 70Y of the insulating layer 70, a through hole 173Y and a through hole 180Y which communicate with one another. The through hole 63Y penetrates the metal layer 63 in the thickness direction. The through hole 173Y penetrates the metal layer 173 in the thickness direction. The through hole 180Y penetrates the insulating layer 180 in the thickness direction.

The planar shape of each of the through holes 50Y, 63Y, 70Y, 173Y and 180Y is, for example, formed into a rectangular shape. The through holes 50Y, 63Y, 70Y, 173Y and 180Y are, for example, formed coaxially with one another. The planar shape of each of the through holes 50Y, 63Y, 70Y, 173Y and 180Y is, for example, formed to be larger than the planar shape of the electronic component 110, and formed to be smaller than the planar shape of the metal layer 42.

The through hole 63Y, 173Y is, for example, formed to be larger in planar shape than the through hole 50Y, 70Y, 180Y. The metal layer 63, 173 is, for example, formed so as to surround an opening edge of the through hole 50Y, 70Y, 180Y from the outside. The planar shape of the metal layer 63, 173 is, for example, formed into a closed ring shape which continuously surrounds the opening edge of the through hole 50Y, 70Y, 180Y over the whole circumference.

A side face 63A of the metal layer 63 constituting an inner side face of the opening portion 102 (the through hole 63Y) is provided at a position where the side face 63A is set back in a direction to be separately more distantly from the planar center of the opening portion 102 than a side face 50A, 70A of the insulating layer 50, 70. Thus, a recess 103 constituted by the side face 50A of the insulating layer 50, the upper face of the insulating layer 50 exposed from the metal layer 63, the side face 63A of the metal layer 63, the lower face of the insulating layer 70 exposed from the metal layer 63, and the side face 70A of the insulating layer 70 is formed in the inner side face of the opening portion 102.

A side face 173A of the metal layer 173 constituting the inner side face of the opening portion 102 (the through hole 173Y) is provided at a position where the side face 173A is set back inward of the insulating layer 70 from the side face 70A of the insulating layer 70. The side face 173A of the metal layer 173 is provided at a position where the side face 173A is set back inward of the insulating layer 180 from a side face 180A of the insulating layer 180 constituting the inner side face of the opening portion 102 (the through hole 180Y). That is, the side face 173A of the metal layer 173 is provided at the position where the side face 173A is set back in the direction to be separated more distantly from the planar center of the opening portion 102 than the side face 70A, 180A of the insulating layer 70, 180. Thus, a recess 104 constituted by the side face 70A of the insulating layer 70, the upper face of the insulating layer 70 exposed from the metal layer 173, the side face 173A of the metal layer 173, a lower face of the insulating layer 180 exposed from the metal layer 173, and the side face 180A of the insulating layer 180 is formed in the inner side face of the opening portion 102. Thus, a first step portion constituted by the recess 103 and a second step portion constituted by the recess 104 are formed in the inner side face of the opening portion 102.

The electronic component 101 is mounted on the upper face of the metal layer 42 exposed from the opening portion 102, through an adhesive layer 112. The insulating layer 80 is formed so as to fill the opening portion 102, the recess 103 and the recess 104.

According to the aforementioned configuration, the opening portion 102 is formed so as to penetrate the metal layers 63 and 173 and the insulating layers 50, 70 and 180 in the thickness direction. Thus, by increasing the numbers of the metal layers 63 and 173 and the insulating layers 50, 70 and 180, the opening portion 102 can be formed to be deeper accordingly. Therefore, even when a high electronic component 110 is embedded, the opening portion 102 deep enough to receive the electronic component 110 therein can be formed easily.

Figure 17:
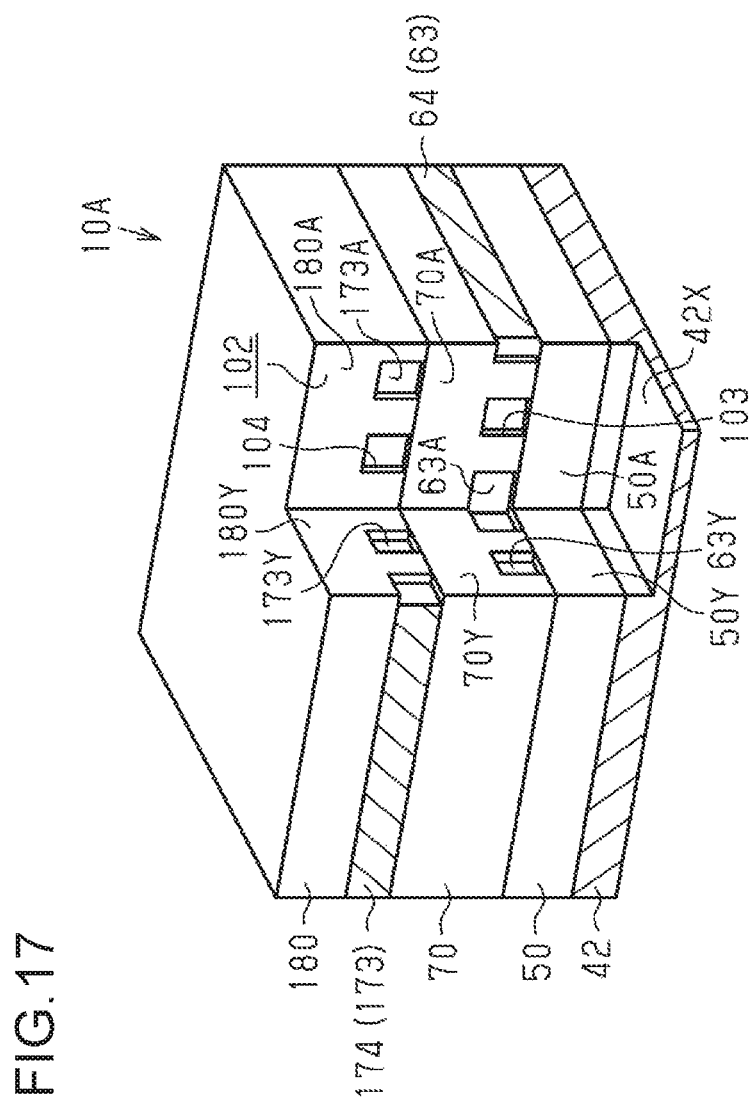
FIG. 17 is a schematic perspective view showing the wiring board according to the modification.

When the opening portion 102 is formed to penetrate two or more metal layers 63 and 173 in the thickness direction as in the modification shown in FIG. 15, structures shown in FIGS. 16A and 16B and FIG. 17 can be also used as the respective metal layers 63 and 173. The structures will be described below in detail. Incidentally, FIG. 16A is a plan view of the metal layer 42, the insulating layer 50, the metal layer 63, the insulating layer 70 and the electronic component 110, as seen from the upper face side of the insulating layer 70. In addition, FIG. 16B is a plan view of the metal layer 42, the insulating layers 50 and 70, the metal layer 173, the insulating layer 180 and the electronic component 110, as seen from the upper face side of the insulating layer 180.

As shown in FIG. 16A, the metal layer 63 has metal layers 64 each of which is shaped like a rectangle in plan view. The metal layers 64 are, for example, formed so as to surround the opening edges of the through holes 50Y and 70Y.

As shown in FIG. 16B, the metal layer 173 has metal layers 174 each of which is shaped like a rectangle in plan view. The metal layers 174 are, for example, formed so as to surround the opening edge of the through hole 180Y. A planar shape of the metal layers 64 and the metal layers 174 which are superimposed on each other in plan view is formed into a closed ring shape (a rectangular closed ring shape in this case) surrounding the opening edge of the opening portion 102 (the through holes 50Y, 70Y and 180Y) over the whole circumference. That is, the metal layers 63 and 173 in the present example are formed so that the planar shape of the two metal layers 63 and 173 which are superimposed on each other in plan view is formed into a closed ring shape surrounding the opening edge of the opening portion 102 over the whole circumference.

As shown in FIGS. 16A and 16B and FIG. 17, the metal layers 64 and the metal layers 174 are formed to alternate each other in the circumferential direction of the opening portion 102. For example, each of the metal layers 64 is formed at a position not overlapping with any metal layer 174 in plan view. In a similar manner or the same manner, each of the metal layers 174 is formed at a position not overlapping with any metal layer 64 in plan view. Incidentally, the metal layers 64 and the metal layers 174 may have some portions overlapping with each other in plan view.

As shown in FIG. 17, the side face 63A of each of the metal layers 64 constituting the inner side face of the opening portion 102 is provided at a position where the side face 63A is set back in a direction to be separated more distantly from the planar center of the opening portion 102 than each of the side faces 50A and 70A of the insulating layers 50 and 70. Thus, recesses 103 each of which is constituted by the side face 50A of the insulating layer 50, the side face 63A of the metal layer 64 and the side face 70A of the insulating layer 70 are formed in the inner side face of the opening portion 102. The recesses 103 are formed at predetermined intervals in the circumferential direction of the opening portion 102.

The side face 173A of each of the metal layers 174 constituting the inner side face of the opening portion 102 is provided at a position where the side face 173A is set back in the direction to be separated more distantly from the planar center of the opening portion 102 than each of the side faces 70A and 180A of the insulating layers 70 and 180. Thus, recesses 104 each of which is constituted by the side face 70A of the insulating layer 70, the side face 173A of the metal layer 174 and the side face 180A of the insulating layer 180 are formed in the inner side face of the opening portion 102. The recesses 104 are formed at predetermined intervals in the circumferential direction of the opening portion 102.

The recesses 103 and 104 are formed so that, for example, the planar shape of the recesses 103 and 104 which are superimposed on each other in plan view is formed into a closed ring shape surrounding the opening portion 102 over the whole circumference. The recesses 103 and the recesses 104 are formed to alternate each other in the circumferential direction of the opening portion 102. For example, each of the recesses 103 is formed at a position not overlapping with any recess 104 in plan view. In a similar manner or the same manner, each of the recesses 104 is formed at a position not overlapping with any recess 103 in plan view.

In the aforementioned configuration, the recesses 103 and 104 are formed so that the planar shape of the recesses 103 and the recesses 104 which are superimposed on each other in plan view is formed into a closed ring shape surrounding the opening portion 102 over the whole circumference. In other words, the combination of the recesses 103 and the recesses 104 is formed so as to entirely surround the electronic component 110 in plan view. Thus, peeling of the insulating layer 80 can be stopped by one of the recesses 103 and 104 even when the peeling occurs at any position of the opening edge of the bottom of the opening portion 102.

In addition, kinds of step portions are formed in the inner side face of the opening portion 102 by the metal layers 63 and 173. In this manner, the degree of freedom for designing the planar shape of each of the metal layers 63 and 173 can be improved in comparison with when a step portion is formed in the inner side face of the opening portion 102 by one metal layer.

Figure 18:
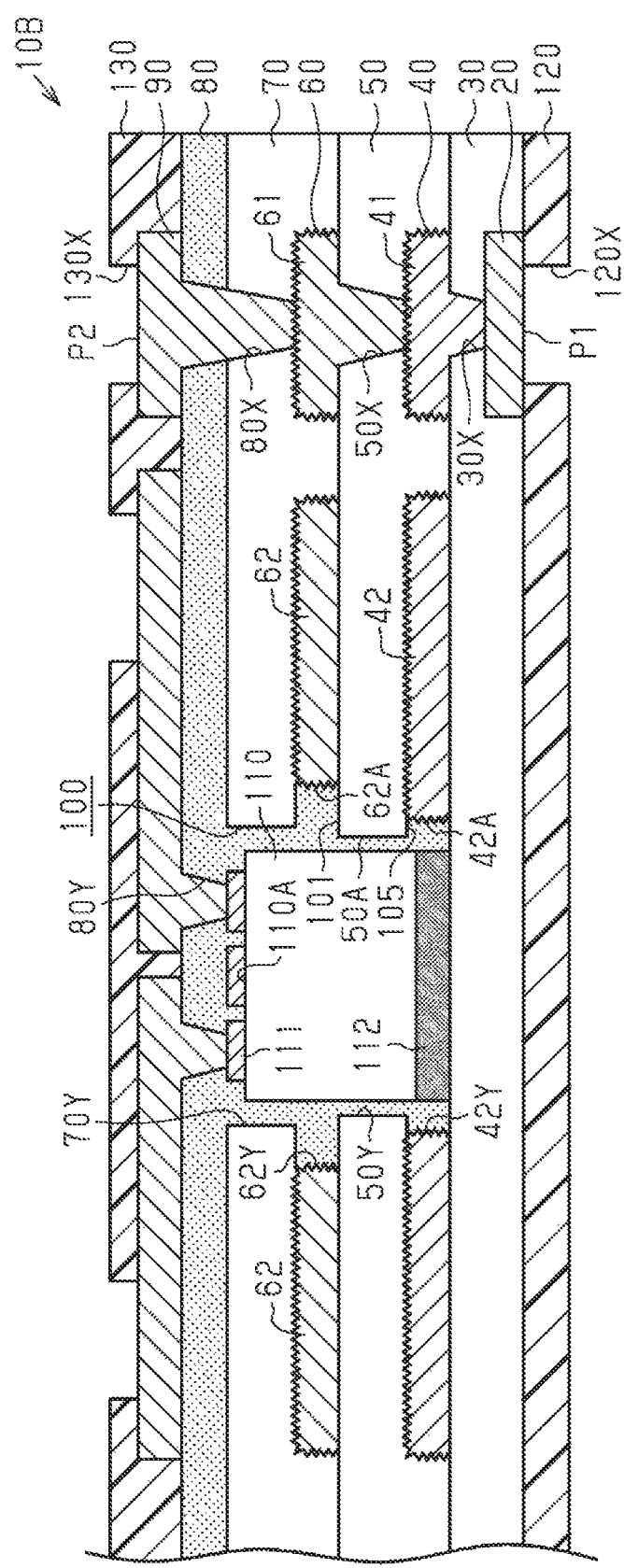
FIG. 18 is a schematic sectional view showing a wiring board according to another modification.

In the aforementioned embodiment, the electronic component 110 is mounted on the upper face of the metal layer 42 exposed from the opening portion 100. However, the present invention is not limited thereto. The electronic component 110 may be mounted on the upper face of the insulating layer 30 exposed from the opening portion 100, for example, as in a wiring board 10B shown in FIG. 18. For example, the electronic component 110 is bonded to the upper face of the insulating layer 30 exposed from the opening portion 100 in a face-up state by the adhesive layer 112. A through hole 42Y penetrating the metal layer 42 in the thickness direction is formed in the metal layer 42 in this case. The opening portion 100 in the present example is constituted by the through hole 42Y of the metal layer 42, the through hole 50Y of the insulating layer 50, the through hole 62Y of the metal layer 62 and the through hole 70Y of the insulating layer 70 which communicate with one another. That is, the opening portion 100 in the present example is formed so as to penetrate the metal layer 42, the insulating layer 50, the metal layer 62 and the insulating layer 70 in the thickness direction.

The through hole 42Y is, for example, formed to be larger in planar shape than each of the through holes 50Y and 70Y. The metal layer 42 is, for example, formed so as to surround the opening edge of the through hole 50Y, 70Y from the outside. The planar shape of the metal layer 42 is, for example, formed into a ring shape. The planar shape of the metal layer 42 in the present example is formed into a closed ring shape continuously surrounding the opening edge of the through hole 50Y, 70Y over the whole circumference.

The side face 42A of the metal layer 42 constituting the inner side face of the opening portion 100 (the though hole 42Y) is provided at a position where the side face 42A is set back in a direction to be separated more distantly from the planar center of the opening portion 100 than the side face 50A of the insulating layer 50. For example, the side face 42A of the metal layer 42 is formed so as to be set back from the side face 50A of the insulating layer 50 over the whole circumference of the opening portion 100. A recess 105 (a step portion) constituted by the side face 42A of the metal layer 42, the lower face of the insulating layer 50 exposed from the metal layer 42, and the side face 50A of the insulating layer 50 is formed in the inner side face of the opening portion 100.

The through hole 62Y in the present example is, for example, formed to be larger in planar shape than the through hole 42Y. That is, the side face 62A of the metal layer 62 is provided at a position where the side face 62A is set back in the direction to be separated more distantly from the planar center of the opening portion 100 than the side face 42A of the metal layer 42. In other words, a distance between the side face 42A of the metal layer 42 constituting the inner side face of the opening portion 100 and the side face 50A of the insulating layer 50 constituting the inner side face of the opening portion 100 is shorter than a distance between the side face 62A of the metal layer 62 constituting the inner side face of the opening portion 100 and the side face 50A of the insulating layer 50 constituting the inner side face of the opening portion 100.

In the aforementioned configuration, the opening portion 100 is formed so as to penetrate the metal layer 42 in the thickness direction. Accordingly, the opening portion 100 can be formed to be deeper by the thickness of the metal layer 42. Therefore, even when a high electronic component 110 is embedded, the opening portion 100 deep enough to receive the electronic component 110 can be formed easily.

Next, a method for manufacturing the wiring board 10B will be described. First, steps similar to or the same as the steps shown in FIG. 5A to FIG. 8A are carried out so as to form a structure body shown in FIG. 19A. That is, in the structure body shown in FIG. 19A, a through hole 50Y of an insulating layer 50, a through hole 62Y of a metal layer 62 and a through hole 70Y of an insulating layer 70 are made to communicate with one another so that an opening portion 100 penetrating the insulating layer 50, the metal layer 62 and the insulating layer 70 in a thickness direction is formed.

Successively, in a step shown in FIG. 19B, a portion of the metal layer 62 is removed so as to make the planar shape of the through hole 62Y larger than the planar shape of each of the through holes 50Y and 70Y, and a through hole 42Y penetrating a metal layer 42 in the thickness direction is formed. The removal of the metal layer 62 and the formation of the through hole 42Y can be, for example, performed by isotropic etching using the insulating layer 70 as an etching mask. By the isotropic etching, first, the metal layer 62 exposed from the insulating layer 70 is etched and removed, and the metal layer 42 exposed from the insulating layers 50 and 70 is etched and removed. Successively, by the isotropic etching, the metal layers 42 and 62 covered with the insulating layers 50 and 70 is also removed due to a side etch phenomenon in which the etching proceeds in an in-plane direction of the metal layers 42 and 62. Thus, side faces 42A and 62A of the metal layers 42 and 62 are set back in a direction to be separated more distantly from the planar center of the opening portion 100 than side faces 50A and 70A of the insulating layers 50 and the 70. As a result, a recess 101 or a recess 105 is formed in an inner side face of the opening portion 100 by the side face 42A of the metal layer 42 and the side face 50A of the insulating layer 50 or by the side face 62A of the metal layer 62 and the side face 70A of the insulating layer 70. In other words, in the present step, a two-step portion constituted by the recesses 101 and 105 is formed in the inner side face of the opening portion 100.

Next, in a step shown in FIG. 20A, an adhesive layer 112 is formed on an upper face of an insulating layer 30 exposed from the opening portion 100 in a similar manner to or the same manner as the step shown in FIG. 9B. Successively, an electronic component 110 is mounted on the adhesive layer 112 inside the opening portion 100 by use of a mounter in a similar manner to or the same manner as the step shown in FIG. 10A. Next, an insulating layer 80 with which the opening portion 100 and the recesses 101 and 105 are filled is formed in a similar manner to or the same manner as the step shown in FIG. 10B.

Next, steps similar to or the same as the steps shown in FIG. 11A to FIG. 12A are carried out. Thus, a structure body shown in FIG. 20B can be obtained. Then, steps similar to or the same as the steps shown in FIG. 12B and FIG. 13 are carried out. Thus, the wiring board 10B in the present modification can be manufactured.

In the aforementioned first embodiment, the recess 101 is formed over the whole circumference of the opening portion 100. However, the present invention is not limited thereto. For example, the recess 101 may be formed in only a circumferential portion of the opening portion 100.

Second Embodiment

A second embodiment will be described below in accordance with FIG. 21A to FIG. 33. As shown in FIG. 21A, a wiring board 210 has a structure in which a wiring layer 220, an insulating layer 230, a conductor layer 240, an insulating layer 250, a conductor layer 260, an insulating layer 270, an insulating layer 280, and a wiring layer 290 are formed sequentially. The wiring board 210 in the present example has a form of a so-called "coreless board" which is support substrate-free and different from a wiring board which is manufactured by a general build-up method, i.e. a wiring board in which a required number of build-up layers are formed sequentially on each or one of opposite faces of a core substrate serving as a support substrate.

The wiring board 210 has one or more electronic components 310 (one electronic component 310 in FIG. 21A) disposed inside an opening portion 300 formed in the plurality of insulating layers 250 and 270, a solder resist layer 320 formed on a lower face of the insulating layer 230, and a solder resist layer 330 formed on an upper face of the insulating layer 280. The wiring board 210 is a wiring board in which the electronic component 310 is embedded.

Here, for example, cupper (Cu) or a copper alloy can be used as the material of the wiring layers 220 and 290 and the conductor layers 240 and 260. For example, any of insulating resins such as an epoxy resin and a polyimide resin or any of resin materials in which fillers made of silica, alumina, etc., are mixed with these resins can be used as the material of the insulating layers 230, 250, 270 and 280. In addition, for example, a reinforcing material-including insulating resin in which a reinforcing material such as a woven fabric or an unwoven fabric of glass, aramid or LCP (Liquid Crystal Polymer) fiber is impregnated with a thermosetting resin containing an epoxy resin, a polyimide resin, or the like, as a main component may be used as the material of the insulating layers 230, 250, 270 and 280. Incidentally, a non-photosensitive insulating resin containing a thermosetting resin as a main component or an insulating resin containing a photosensitive resin as a main component can be used as the material of the insulating layers 230, 250, 270 and 280.

The wiring layer 220 is an outermost (lowermost in this case) wiring layer of the wiring board 210. A lower face of the wiring layer 220 is exposed from the insulating layer 230. The lower face of the wiring layer 220 in the present example is formed to be substantially flush with the lower face of the insulating layer 230. Incidentally, the lower face of the wiring layer 220 may be formed to be recessed on the conductor layer 240 side relatively to the lower face of the insulating layer 230. The thickness of the wiring layer 220 can be, for example, set in a range of about 10 to 30 μm.

The insulating layer 230 is formed so as to cover an upper face and a side face of the wiring layer 220 and expose the lower face of the wiring layer 220. A through hole 230X penetrating the insulating layer 230 in a thickness direction so as to expose a portion of the upper face of the wiring layer 220 is formed at a predetermined place in the insulating layer 230. The through hole 230X is, for example, formed into a taper shape in which an opening width (an opening diameter) is reduced as it goes from an upper side (the conductor layer 240 side) toward a lower side (the wiring layer 220 side) in FIG. 21A. For example, the through hole 230X is formed into an inverted truncated conical shape in which an opening diameter of a lower side opening end is smaller than an opening diameter of an upper side opening end. Incidentally, a thickness between the upper face of the wiring layer 220 and an upper face of the insulating layer 230 can be, for example, set in a range of about 10 to 35 μm.

The conductor layer 240 is formed on the upper face of the insulating layer 230. The thickness of the conductor layer 240 can be, for example, set in a range of about 10 to 30 μm. An upper face and a side face of the conductor layer 240 are, for example, roughened faces. The upper face and the side face of the conductor layer 240 are, for example, formed into roughened faces larger in surface roughness than a lower face of the conductor layer 240. The surface roughness of the conductor layer 240 can be, for example, set to be not lower than 200 nm in terms of surface roughness Ra value. Here, the surface roughness Ra value is one kind of numerical value, which expresses the surface roughness and which is called arithmetical average roughness. Specifically, the surface roughness Ra value is an arithmetic average of absolute values measured as a height varying within a measurement region from the surface which is an average line.

The conductor layer 240 has, for example, a wiring layer 241 and a metal layer 242. The wiring layer 241 and the metal layer 242 are formed separately from each other to be electrically insulated from each other. The wiring layer 241 and the metal layer 242 are formed on one and the same plane.

The wiring layer 241 is, for example, electrically connected to the wiring layer 220 through a via wiring filled in the through hole 230X. The wiring layer 241 is, for example, formed integrally with the via wiring filled in the through hole 230X.

The metal layer 242 is, for example, formed in a mount region where the electronic component 310 is mounted. The metal layer 242 is, for example, formed at a position overlapping with the electronic component 310 in plan view. The metal layer 242 is, for example, formed at a position overlapping with the opening portion 300 in plan view. The planar shape of the metal layer 242 is, for example, formed to be larger than the planar shape of the opening portion 300. An outer circumferential edge of the metal layer 242 is, for example, formed so as to surround an opening edge of the opening portion 300 from the outside in plan view. The metal layer 242 is, for example, formed into a rectangular shape in plan view. The metal layer 242 in the present example is, for example, a metal layer which is electrically isolated (floating) without being electrically connected to any other wiring layer or any other conductor layer. The metal layer 242 may be, for example, a wiring pattern for drawing a wiring or may be a power source wiring or a ground wiring. When the metal layer 242 is the wiring pattern, the power source wiring or the ground wiring, the metal layer 242 is, for example, electrically connected to another wiring layer or another conductor layer through a via wiring etc.

The insulating layer 250 is formed on the upper face of the insulating layer 230 so as to cover the conductor layer 240. Incidentally, a thickness between the upper face of the conductor layer 240 and an upper face of the insulating layer 250 can be, for example, set in a range of about 40 to 100 μm.

A through hole 250X penetrating the insulating layer 250 in the thickness direction so as to expose a portion of the upper face of the conductor layer 240 (the wiring layer 241 in this case) is formed at a predetermined place in the insulating layer 250. The through hole 250X is, for example, formed into a taper shape in which an opening width (an opening diameter) is reduced as it goes from the upper side (the conductor layer 260 side) toward the lower side (the conductor layer 240 side) in FIG. 21A. The through hole 250X is, for example, formed into an inverted truncated conical shape in which an opening diameter of a lower side opening end is smaller than an opening diameter of an upper side opening end.

The conductor layer 260 is formed on the upper face of the insulating layer 250. The thickness of the conductor layer 260 can be, for example, set in a range of about 10 to 30 μm. An upper face and a side face of the conductor layer 260 are, for example, roughened faces. The upper face and the side face of the conductor layer 260 are, for example, formed into roughened faces larger in surface roughness than a lower face of the conductor layer 260. The surface roughness of the conductor layer 260 can be, for example, set to be not lower than 200 nm in terms of surface roughness Ra value.

The conductor layer 260 has, for example, a wiring layer 261 and a metal layer 262. The wiring layer 261 and the metal layer 262 are formed separately from each other to be electrically insulated from each other. The wiring layer 261 and the metal layer 262 are formed on one and the same plane.

The wiring layer 261 is, for example, electrically connected to the wiring layer 241 through a via wiring filled in the through hole 250X. The wiring layer 261 is, for example, formed integrally with the via wiring filled in the through hole 250X.

The metal layer 262 is, for example, formed so as to surround the mount region where the electronic component 310 is mounted. The metal layer 262 in the present example is, for example, a dummy pattern which is electrically isolated (floating) without being electrically connected to any other wiring layer or any other conductor layer. The metal layer 262 may be, for example, a wiring pattern for drawing a wiring or may be a power source wiring or a ground wiring. When the metal layer 262 is the wiring pattern, the power source wiring or the ground wiring, for example, the metal layer 262 is electrically connected to another wiring layer or another conductor layer through a via wiring etc.

The insulating layer 270 is formed on the upper face of the insulating layer 250 so as to cover the conductor layer 260. Incidentally, a thickness between the upper face of the conductor layer 260 and an upper face of the insulating layer 270 can be, for example, set in a range of about 40 to 100 μm.

The opening portion 300 is, for example, formed so as to penetrate the insulating layer 250, the metal layer 262 and the insulating layer 270 in the thickness direction. The opening portion 300 is, for example, formed so as to expose a portion of an upper face of the metal layer 242. The opening portion 300 is formed correspondingly to the electronic component 310 embedded in the opening portion 300.

The opening portion 300 in the present example is constituted by a through hole 250Y, a through hole 262Y and a through hole 270Y. The through hole 250Y penetrates the insulating layer 250 in the thickness direction. The through hole 262Y penetrates the metal layer 262 in the thickness direction. The through hole 270Y penetrates the insulating layer 270 in the thickness direction.

Figure 22:
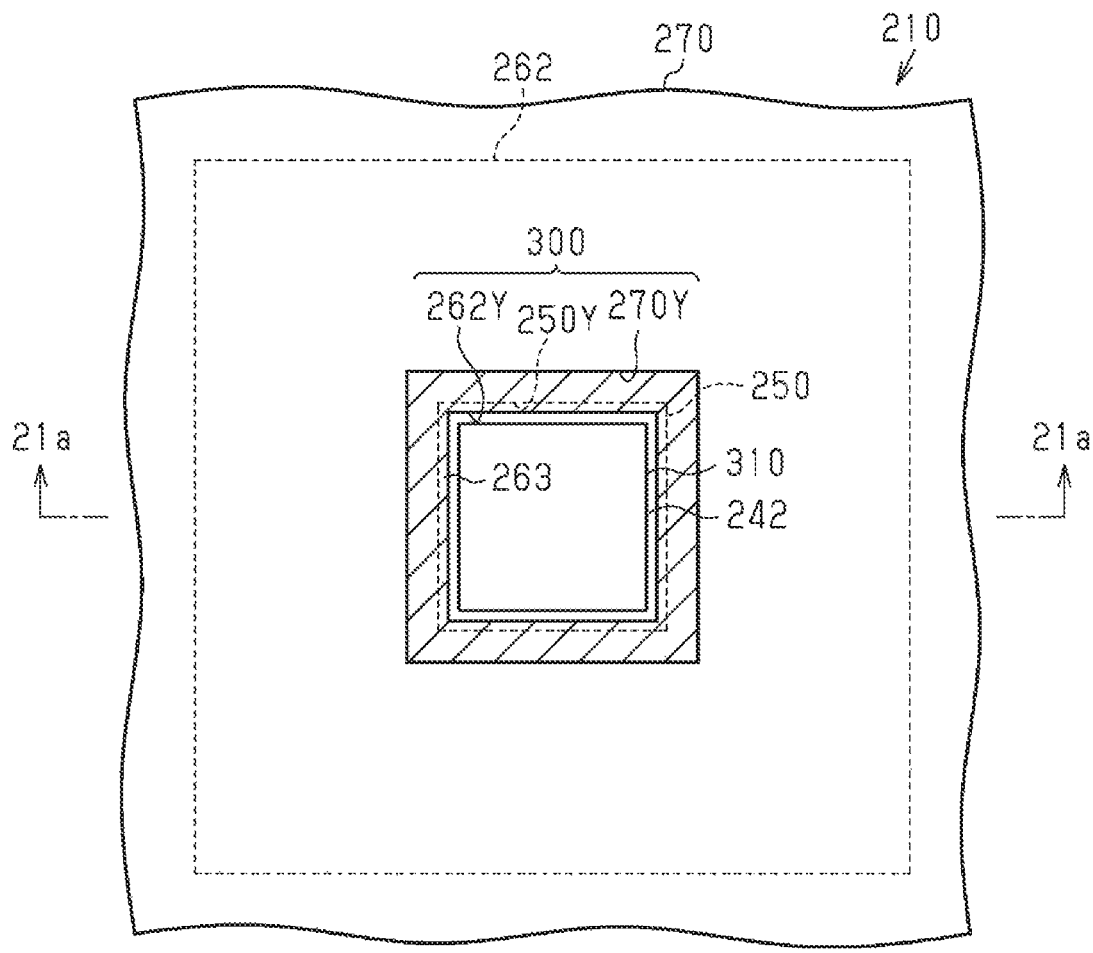
FIG. 22 is a schematic plan view showing the wiring board according to the second embodiment.

As shown in FIG. 22, each of the through holes 250Y, 262Y and 270Y in the present example is formed into a rectangular shape in plan view. The through holes 250Y, 262Y and 270Y are, for example, formed coaxially with each other. That is, positions of a central axis of the through hole 250Y, a central axis of the through hole 262Y and a central axis of the through hole 270Y align with one another in plan view. Each of the planar shapes of the through holes 250Y, 262Y and 270Y is formed to be larger than the planar shape of the electronic component 310. The planar shape of the through hole 250Y, 262Y, 270Y is, for example, formed to be smaller than the planar shape of the metal layer 242.

The through hole 262Y is, for example, formed to be smaller in planar shape than each of the through holes 250Y and 270Y. That is, the through hole 262Y has a smallest planar shape among the through holes 250Y, 262Y and 270Y. The size of the through hole 262Y can be, for example, set in a range of about 0.7 mm×0.7 mm to 15 mm×15 mm in plan view.

The metal layer 262 is, for example, formed so as to surround opening edges of the through holes 250Y and 270Y from the inside. The metal layer 262 is, for example, formed into a ring shape (frame shape) in plan view. The metal layer 262 in the present example is formed into a rectangular closed ring shape in plan view to continuously surround the opening edge of each of the through holes 250Y and 270Y over the whole circumference.

Incidentally, FIG. 22 is a plan view in which the wiring board 210 shown in FIG. 21A is seen from top. In FIG. 22, the insulating layer 280, the wiring layer 290 and the solder resist layer 330, etc. are drawn in perspective.

Figure 23:
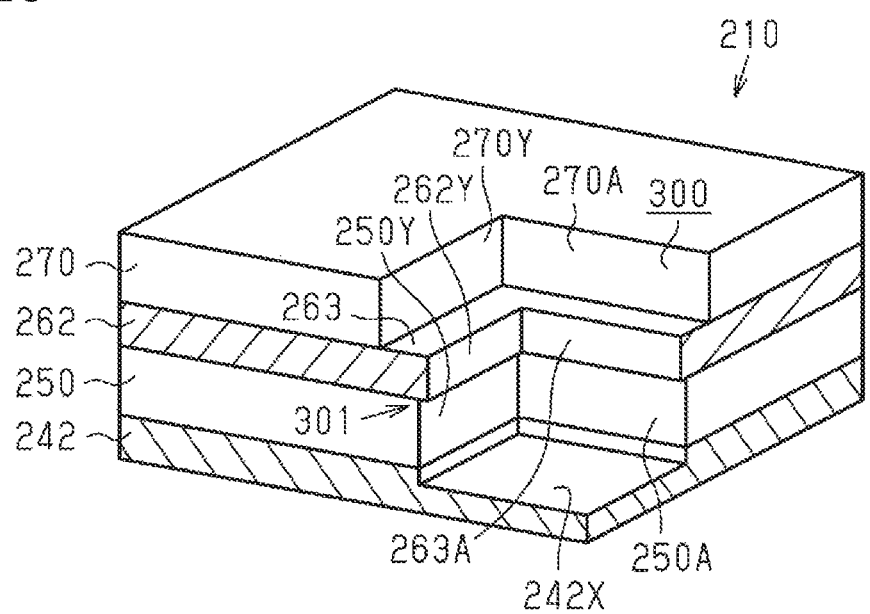
FIG. 23 is a schematic perspective view showing the wiring board according to the second embodiment.

As shown in FIG. 21B and FIG. 23, the metal layer 262 has a protrusion portion 263 protruding into the inside of the opening portion 300 from a side face 250A of the insulating layer 250 constituting an inner side face of the opening portion 300 (the through hole 250Y). A side face 263A of the protrusion portion 263 is provided at a position where the side face 263A protrudes in a direction to be closer to the planar center of the opening portion 300 than the side face 250A of the insulating layer 250. The side face 263A of the protrusion portion 263 is provided at a position where the side face 263A protrudes in the direction to be closer to the planar center of the opening portion 300 than a side face 270A of the insulating layer 270 constituting the inner side face of the opening portion 300 (the through hole 270Y). For example, the protrusion portion 263 is formed continuously over the whole circumference of the opening portion 300. An upper face and a lower face of the protrusion portion 263 are exposed from the insulating layers 270 and 250. In this manner, a convex step portion 301 constituted by the side face 250A of the insulating layer 250, the lower face of the protrusion portion 263, the side face 263A of the protrusion portion 263, the upper face of the protrusion portion 263 and the side face 270A of the insulating layer 270 is formed in the inner side face of the opening portion 300. The step portion 301 is, for example, formed continuously over the whole circumference of the opening portion 300.

The surface of the metal layer 262 exposed from the insulating layers 250 and 270 (i.e. the upper face, the lower face and the side face of the protrusion portion 263) is, for example, a roughened face. The upper face and the side face of the protrusion portion 263 are, for example, formed to be larger in surface roughness than an upper face of the metal layer 262 covered with the insulating layer 270.

As shown in FIG. 22, the through hole 250Y of the insulating layer 250 is, for example, formed to be smaller in planar shape than the through hole 270Y of the insulating layer 270.

As shown in FIG. 21B, the side face 270A of the insulating layer 270 is, for example, provided at a position where the side face 270A is set back in a direction to be separated more distantly from the planar center of the opening portion 300 than the side face 250A of the insulating layer 250. For example, the side face 270A of the insulating layer 270 is formed so as to be set back from the side face 250A of the insulating layer 250 over the whole circumference of the opening portion 300.

A recess 242X recessed on the insulating layer 230 side is formed in the upper face of the metal layer 242 exposed in the bottom of the opening portion 300 (specifically, the bottom of the through hole 250Y). A bottom face and an inner side face of the recess 242X are, for example, roughened faces. Surface roughness of the bottom face of the recess 242X is, for example, formed to be larger than surface roughness of the upper face of the metal layer 242 covered with the insulating layer 250. In other words, the surface roughness of the upper face of the metal layer 242 exposed in the bottom of the opening portion 300 is formed to be larger than the surface roughness of the upper face of the metal layer 242 covered with the insulating layer 250.

As shown in FIG. 21A, the electronic component 310 is mounted on (adhesively bonded to) the upper face of the metal layer 242 (specifically, the bottom face of the recess 242X) exposed from the opening portion 300 through an adhesive layer 312. That is, the electronic component 310 is disposed inside the opening portion 300. The adhesive layer 312 is formed on the upper face of the metal layer 242. For example, an epoxy-based, polyimide-based or silicone-based thermosetting adhesive agent can be used as the material of the adhesive layer 312.

For example, an active component such as a semiconductor chip, a transistor or a diode or a passive component such as a chip capacitor, a chip inductor or a chip resistor can be used as the electronic component 310. For example, a component made of silicon or a component made of ceramic can be used as the electronic component 310. The electronic component 310 according to the present embodiment is a semiconductor chip. For example, a logic chip such as a CPU (Central Processing Unit) chip or a GPU (Graphics Processing Unit) chip can be used as the semiconductor chip. In addition, for example, a memory chip such as a DRAM (Dynamic Random Access Memory) chip, an SRAM (Static Random Access Memory) chip or a flash memory chip can be used as the semiconductor chip.

The electronic component 310 can be, for example, made of a semiconductor substrate. For example, silicon etc. can be used as the material of the semiconductor substrate. Electrode terminals 311 are provided on, of the electronic component 310, a circuit formation face 310A where a semiconductor integrated circuit (not shown) is formed. The electrode terminals 311 are, for example, metal posts each formed in the shape of a column extending upward from the circuit formation face 310A. For example, copper or a copper alloy can be used as the material of the electrode terminals 311.

The electronic component 310 is bonded to the upper face of the metal layer 242 by the adhesive layer 312 in a state in which a back face (a lower face in this case) of the electronic component 310 opposite to the circuit formation face 310A is opposed to the upper face of the metal layer 242 (i.e. faces-up state). Upper faces of the electrode terminals 311 are, for example, formed on the same plane as the upper face of the insulating layer 270 or formed to be lower than the upper face of the insulating layer 270.

The insulating layer 280 is formed so as to fill the opening portion 300 and entirely cover the electronic component 310. The insulating layer 280 is, for example, formed so as to cover an entire side face of the adhesive layer 312, an entire side face of the electronic component 310, the entire circuit formation face 310A exposed from the electrode terminals 311, and the upper faces and side faces of the electrode terminals 311. The insulating layer 280 is, for example, formed so as to cover the surface of the metal layer 242 exposed from the adhesive layer 312 inside the opening portion 300.

As shown in FIG. 21B, the insulating layer 280 is formed so as to cover the entire side face 250A of the insulating layer 250, the entire lower face of the protrusion portion 263 of the metal layer 262, the entire side face 263A of the protrusion portion 263, the entire upper face of the protrusion portion 263, and the entire side face 270A of the insulating layer 270. Thus, the insulating layer 280 is, for example, formed so as to cover the entire surface (the lower face, the upper face and the side face) of the protrusion portion 263. In other words, the protrusion portion 263 is formed so as to bite into the insulating layer 280.

As shown in FIG. 21A, the insulating layer 280 is, for example, formed so as to cover the entire upper face of the insulating layer 270. A through hole 280X penetrating the insulating layers 270 and 280 in the thickness direction so as to expose a portion of the upper face of the conductor layer 260 (the wiring layer 261 in this case) is formed at a required place in the insulating layers 270 and 280. In addition, a through hole 280Y penetrating the insulating layer 280 in the thickness direction so as to expose a portion of the upper face of each of the electrode terminals 311 is formed at a required place in the insulating layer 280. Each of the through holes 280X and 280Y is, for example, formed into a taper shape in which an opening width (an opening diameter) is reduced as it goes from the upper side (the wiring layer 290 side) toward the lower side (the wiring layer 261 side or the electrode terminal 311 side) in FIG. 21A. For example, the through hole 280X, 280Y is formed into an inverted truncated conical shape in which an opening diameter of a lower side opening end is smaller than an opening diameter of an upper side opening end.

The wiring layer 290 is formed on the upper face of the insulating layer 280. The wiring layer 290 is, for example, an outermost (uppermost in this case) wiring layer of the wiring board 210. The wiring layer 290 has a wiring layer electrically connected to the wiring layer 261 through a via wiring filled in the through hole 280X. The wiring layer 290 has a wiring layer electrically connected to the electrode terminal 311 through a via wiring filled in the through hole 280Y. The wiring layer 290 is formed integrally with the via wiring filled in the through hole 280X or the through hole 280Y. The thickness of the wiring layer 290 can be, for example, set in a range of about 10 to 30 μm.

The solder resist layer 320 is formed on the lower face of the outermost (lowermost in this case) insulating layer 230 so as to cover the lowermost wiring layer 220. For example, an insulating resin such as an epoxy resin or an acrylic resin can be used as the material of the solder resist layer 320. The thickness of the solder resist layer 320 can be, for example, set in a range of about 10 to 30 μm.

An opening portion 320X serving for exposing at least a portion of the lower face of the lowermost wiring layer 220 as a pad P11 is formed in the solder resist layer 320. For example, an external connection terminal such as a solder ball or a lead pin, which is used when the wiring board 210 is mounted on a mount board such as a motherboard is connected to the pad P11. That is, the pad P11 in the present example functions as an external connection pad.

Incidentally, a surface treatment layer may be formed on a lower face of the pad P11 if occasions demand. A gold (Au) layer, a nickel (Ni) layer/Au layer (a metal layer in which the Ni layer and the Au layer are formed in the named order), an Ni layer/palladium (Pd) layer/Au layer (a metal layer in which the Ni layer, the Pd layer and the Au layer are formed in the named order), etc. can be listed as examples of the surface treatment layer. Here, the Au layer is a metal layer made of Au or an Au alloy. The Ni layer is a metal layer made of Ni or an Ni alloy. The Pd layer is a metal layer made of Pd or a Pd alloy. For example, a metal layer (an electroless plating metal layer) formed by an electroless plating method can be used as each of the Ni layer, the Au layer and the Pd layer. In addition, an OSP (Organic Solderability Preservative) film formed by applying antioxidation treatment such as OSP treatment to the surface of the pad P11 can be used as another example of the surface treatment layer. An organic coating of an azole compound, an imidazole compound, or the like, can be used as the OSP film. Incidentally, the wiring layer 220 per se exposed from the opening portion 320X (or the surface treatment layer in the case where the surface treatment layer is formed on the wiring layer 220) may be set as the external connection terminal.

The solder resist layer 330 is formed on the upper face of the outermost (uppermost in this case) insulating layer 280 so as to cover the uppermost wiring layer 290. For example, an insulating resin such as an epoxy resin or an acrylic resin can be used as the material of the solder resist layer 330. The thickness of the solder resist layer 330 can be, for example, set in a range of about 10 to 30 μm.

An opening portion 330X serving for exposing at least a portion of the uppermost wiring layer 290 as a pad P12 is formed in the solder resist layer 330. The pad P12 functions, for example, as an electronic component mounting pad in order to be electrically connected to an electronic component such as a semiconductor chip.

Incidentally, a surface treatment layer may be formed on the surface (an upper face and a side face or only an upper face) of the pad P12 if occasions demand. Metal layers such as an Au layer, an Ni layer/Au layer and an Ni layer/Pd layer/Au layer and an OSP film can be used as examples of the surface treatment layer.

Figure 24:
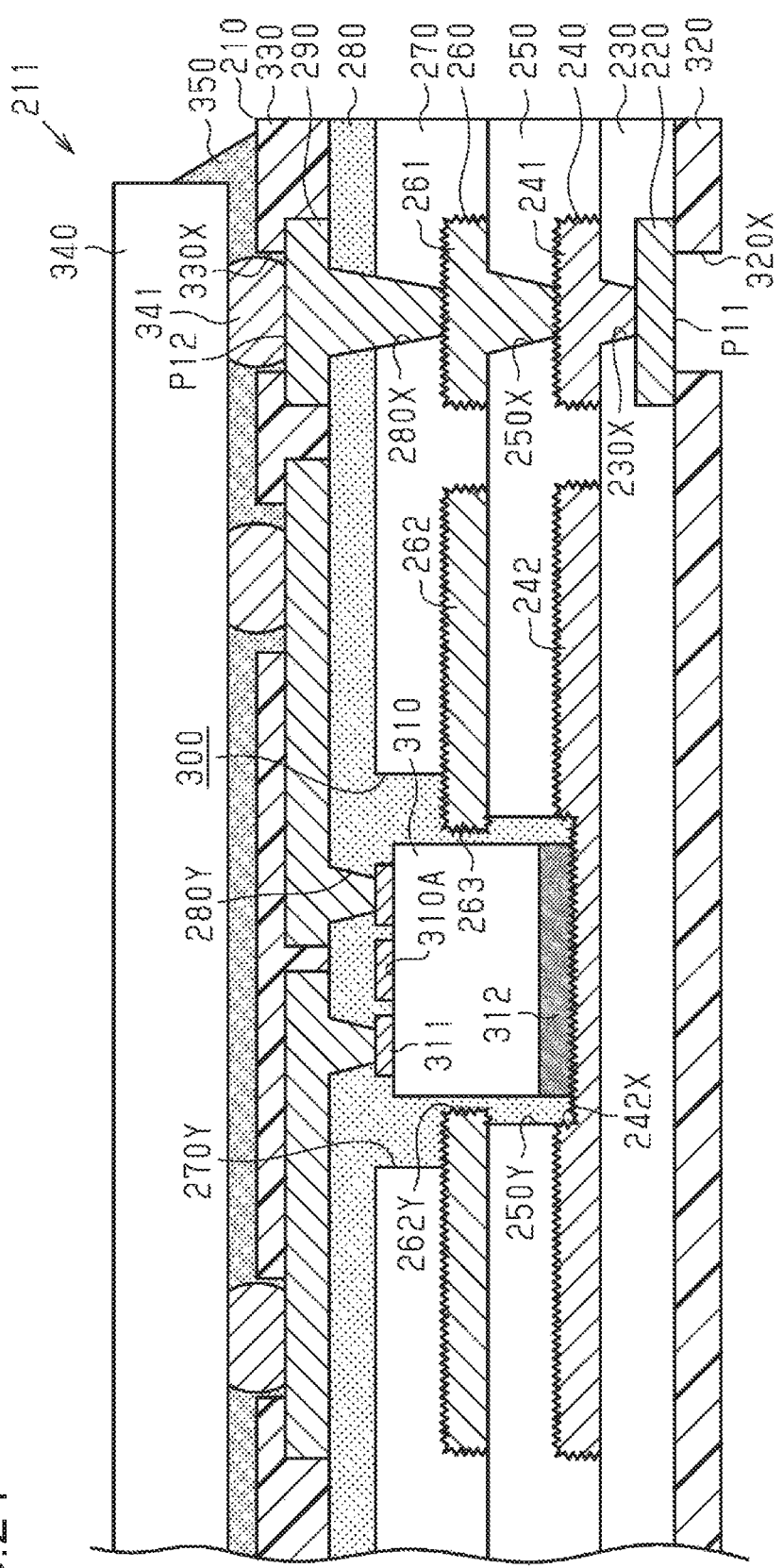
FIG. 24 is a schematic sectional view showing a semiconductor device according to the second embodiment.

Next, the structure of a semiconductor device 211 will be described in accordance with FIG. 24. The semiconductor device 211 has the wiring board 210, one or more semiconductor chips 340 (one semiconductor chip 340 in FIG. 24), and an underfill resin 350. The semiconductor chip 340 is flip-chip mounted on the wiring board 210. That is, a bump 341 provided and disposed on a circuit formation face (a lower face in this case) of the semiconductor chip 340 is bonded to the pad P12 of the wiring board 210. Thus, the semiconductor chip 340 is electrically connected to the pad P12 (the wiring layer 290) through the bump 341.

For example, a logic chip such as a CPU chip or a GPU chip, or a memory chip such as a DRAM chip, an SRAM chip or a flash memory chip can be used as the semiconductor chip 340. Incidentally, when a plurality of semiconductor chips 340 are mounted on the wiring board 210, the logic chip and the memory chip may be configured in combination and mounted on the wiring board 210.

For example, a gold bump or a solder bump can be used as the bump 341. For example, an alloy containing lead (Pb), a tin (Sn)—Au alloy, an Sn—Cu alloy, an Sn—Ag alloy, an Sn-silver (Ag)—Cu alloy, or the like, can be used as the material of the solder bump.

The underfill resin 350 is provided to fill a gap between the wiring board 210 and the semiconductor chip 340. For example, an insulating resin such as an epoxy resin can be used as the material of the underfill resin 350.

Next, a method for manufacturing the wiring board 210 will be described. Incidentally, portions to be final constituent elements of the wiring board 10 will be designated by signs of the final constituent elements for convenience of explanation in the description.

First, a support substrate 360 is prepared, as shown in FIG. 25A. For example, a plate-like material high in rigidity, such as silicon, glass or metal (such as copper) can be used as the material of the support substrate 360. For example, a metal plate or a metal foil sheet can be used as the support substrate 360. A copper foil sheet in which an ultrathin copper foil sheet about 2 to 5 µm thick is pasted to a support body copper foil sheet, which is about 35 to 70 µm thick, through a peeling layer is used as the support substrate 360 in the present example.

Next, a metal film 361 covering an entire upper face of the support substrate 360 is formed on the upper face of the support substrate 360. For example, the metal film 361 is formed on an upper face of the ultrathin copper foil sheet of the support substrate 360. The metal film 361 can be, for example, formed by a sputtering method, a vapor deposition method or an electrolytic plating method. For example, an electrically conductive material serving as a stopper layer when the support substrate 360 is etched and removed can be used as the material of the metal film 361. In addition, for example, an electrically conductive material which can be selectively etched and removed from a wiring layer 220 (e.g. a Cu layer) which will be formed by a subsequent step can be used as the material of the metal film 361. For example, a metal such as nickel (Ni), titanium (Ti), chromium (Cr), tin, cobalt (Co), iron (Fe) or palladium or an alloy containing at least one metal selected from the aforementioned metals can be used as the material of such a metal film 361. Ni is used as the material of the metal film 361 in the present example. The thickness of the metal film 361 can be, for example, set in a range of about 0.1 to 1.0 µm.

Successively, the wiring layer 220 is formed on an upper face of the metal film 361. The wiring layer 220 can be, for example, formed by a semi-additive method. Specifically, first, a resist pattern (not shown) having an opening portion corresponding to the shape of the wiring layer 220 is formed on the upper face of the metal film 361. Successively, by an electrolytic copper plating method using the support substrate 360 and the metal film 361 as power feed layers, a copper plating coating is deposited on the upper face of the metal film 361 exposed from the opening portion of the resist pattern. Then, the resist pattern is removed. In this manner, the wiring layer 220 can be formed on the metal film 361. Incidentally, any of various wiring formation methods such as a subtractive method other than the semi-additive method can be also used as the method for forming the wiring layer 220.

Next, an insulating layer 230 having a through hole 230X exposing a portion of an upper face of the wiring layer 220 is formed on the upper face of the metal film 361 in a step shown in FIG. 25B. When, for example, a resin film is used as the insulating layer 230, the resin film is laminated on the upper face of the metal film 361 by thermocompression bonding, and the resin film is patterned by a photolithographic method in order to form the insulating layer 230. Alternatively, a liquid or paste-like insulating resin may be applied to the upper face of the metal film 361 by a spin coating method etc., and the insulating resin may be patterned by a photolithographic method in order to form the insulating layer 230.

Next, a via wiring filled in the through hole 230X is formed, and a conductor layer 240 is formed on an upper face of the insulating layer 230, for example, by a semi-additive method, in a step shown in FIG. 25C. The conductor layer 240 has a wiring layer 241 and a metal layer 242. The wiring layer 241 is electrically connected to the wiring layer 220 through the via wiring filled in the through hole 230X. The metal layer 242 is formed in a mount region of an electronic component 310 (see FIG. 21A).

Figure 26A:
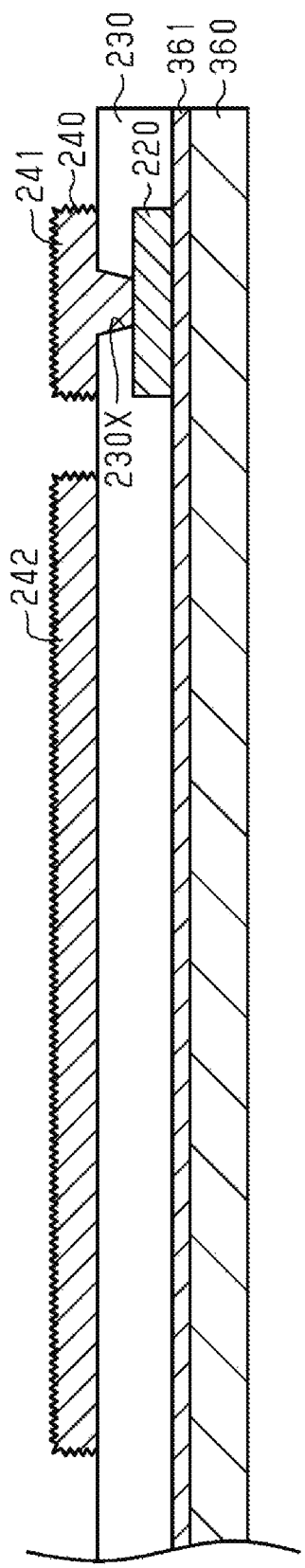
FIGS. 26A and 26B are schematic sectional views showing the method for manufacturing the wiring board according to the second embodiment.

Successively, roughening treatment is applied to the conductor layer 240 in a step shown in FIG. 26A. An entire upper face and an entire side face of the conductor layer 240 are formed into roughened faces by the roughening treatment. For example, blackening treatment, etching treatment, plating, blast treatment, or the like, can be performed as the roughening treatment.

Figure 26B:
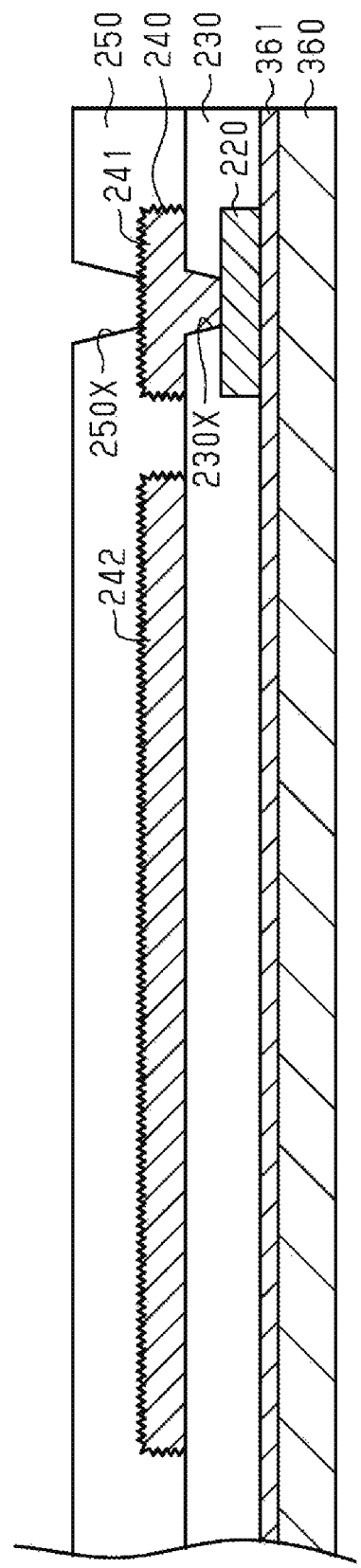

Next, an insulating layer 250 having a through hole 250X exposing a portion of an upper face of the wiring layer 241 is formed on the upper face of the insulating layer 230 in a similar manner to or the same manner as the step shown in FIG. 25B, in a step shown in FIG. 26B. On this occasion, the insulating layer 250 is formed so as to cover an entire upper face and an entire side face of the metal layer 242.

Figure 27A:
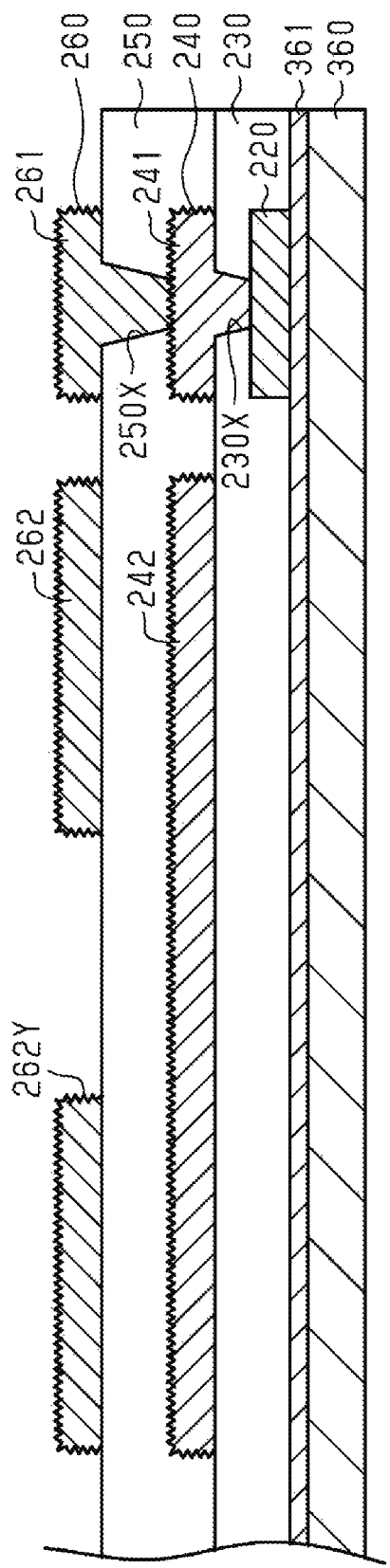
FIGS. 27A and 27B are schematic sectional views showing the method for manufacturing the wiring board according to the second embodiment.

Next, a via wiring filled in the through hole 250X is formed, and a conductor layer 260 is formed on an upper face of the insulating layer 250, for example, by a semi-additive method, in a step shown in FIG. 27A. The conductor layer 260 has a wiring layer 261 and a metal layer 262. The wiring layer 261 is electrically connected to the wiring layer 241 through the via wiring filled in the through hole 250X. The metal layer 262 has a through hole 262Y. On this occasion, the planar shape of the through hole 262Y is formed to be smaller than the planar shape of the metal layer 242.

Successively, roughening treatment is applied to the conductor layer 260. By the roughening treatment, an entire upper face and an entire side face of the conductor layer 260 are formed into roughened faces. For example, blackening treatment, etching treatment, plating, blast treatment, or the like, can be performed as the roughening treatment.

Figure 27B:
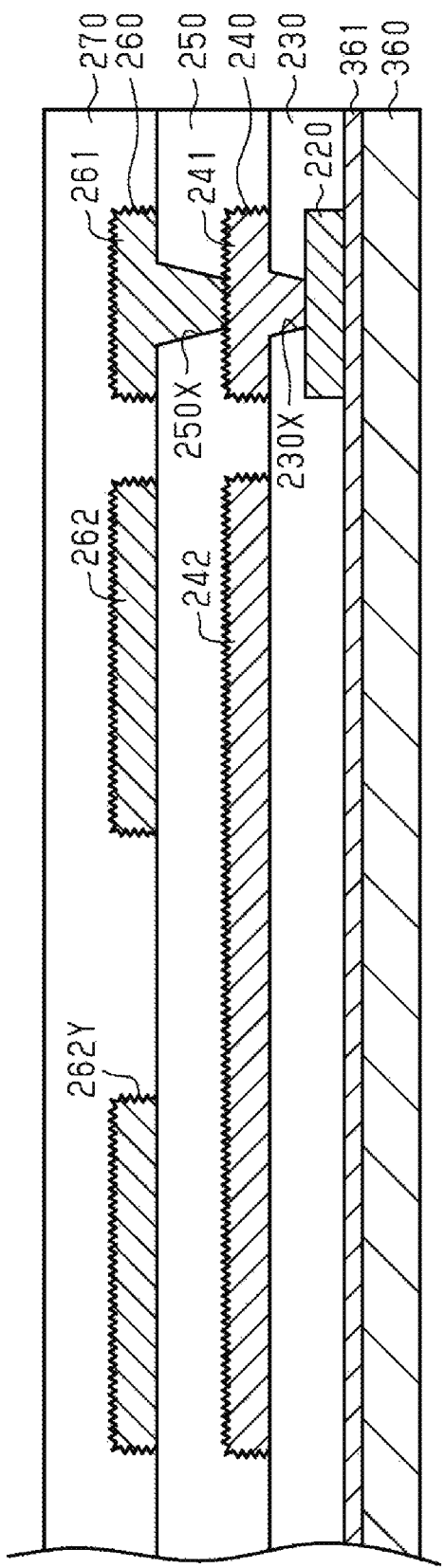

Next, an insulating layer 270 covering the wiring layer 261 and the metal layer 262 is formed on the upper face of the insulating layer 250 in a similar manner to or the same manner as the step shown in FIG. 25B, in a step shown in FIG. 27B. On this occasion, the insulating layer 270 is formed so as to cover an entire upper face and an entire side face of the metal layer 262. The insulating layer 270 is formed so as to fill the through hole 262Y.

Next, in a step shown in FIG. 28A, a through hole 270Y penetrating the insulating layer 270 in a thickness direction is formed and a through hole 250Y penetrating the insulating layer 250 in the thickness direction is formed, so that a portion of the metal layer 242 corresponding to the mount region of the electronic component 310 (see FIG. 21A) is exposed from the through holes 270Y and 250Y. The through holes 250Y and 270Y can be, for example, formed by a laser machining method using a $CO_2$ laser, a YAG laser, or the like.

In the present step, the planar shape of the through hole 270Y is formed to be one size larger than the planar shape of the through hole 262Y of the metal layer 262. Therefore, a portion of the upper face of the metal layer 262 in the vicinity of the opening edge of the through hole 270Y is exposed from the insulating layer 270. On this occasion, the metal layer 262 exposed from the insulating layer 270 functions as a mask and a stopper layer during the laser machining. Therefore, the through hole 250Y penetrating the insulating layer 250 in the thickness direction is formed in the insulating layer 250 exposed from the through hole 262Y of the metal layer 262. Thus, the planar shape of the through hole 250Y is formed into a size substantially equal to the planar shape of the through hole 262Y. In the present step, the metal layer 242 functions as a stopper layer during the laser machining.

In the present step, the through hole 250Y, the through hole 262Y and the through hole 270Y are formed to communicate with one another so that an opening portion 300 penetrating the insulating layer 250, the metal layer 262 and the insulating layer 270 in the thickness direction is formed. The portion of the upper face of the metal layer 242 is exposed from the opening portion 300.

Successively, resin smear adhering to the exposed face of the metal layer 242 exposed in the bottom of the opening portion 300 (specifically, the bottom of the through hole 250Y) is removed by desmear treatment in a step shown in FIG. 28B. By the desmear treatment, portions of the insulating layers 250 and 270 exposed in an inner side face of the opening portion 300 are removed. Therefore, side faces 250A and 270A of the insulating layers 250 and 270 constituting the inner side face of the opening portion 300 are set back in a direction to be separated more distantly from the planar center of the opening portion 300. Thus, a portion of the metal layer 262 is exposed from the insulating layers 250 and 270. On this occasion, a protrusion portion 263 protruding so as to be closer to the planar center of the opening portion 300 than the side face 250A of the insulating layer 250 is formed in the metal layer 262.

Next, in a step shown in FIG. 29A, roughening treatment is applied to the upper face of the metal layer 242 exposed from the insulating layer 250. By the roughening treatment, the entire upper face of the metal layer 242 exposed from the insulating layer 250 is formed into a roughened face. In addition, by the roughening treatment, a recess 242X recessed on the insulating layer 230 side is formed in the upper face of the metal layer 242 exposed from the insulating layer 250. Further, surface roughness of a bottom face of the recess 242X is larger than that prior to etching treatment. Therefore, the surface roughness of the bottom face of the recess 242X is larger than surface roughness of the upper face of the metal layer 242 covered with the insulating layer 250. For example, blackening treatment, etching treatment, plating, blast treatment, or the like, can be performed as the roughening treatment.

In the present step, the surface (a lower face, an upper face and a side face) of the protrusion portion 263 of the metal layer 262 exposed from the insulating layers 250 and 270 is roughened at the same time when the metal layer 242 is roughened. Thus, surface roughness of the surface of the protrusion portion 263 is larger than that prior to etching treatment. Therefore, the surface roughness of the surface of the protrusion portion 263 is larger than the surface roughness of the upper face of the metal layer 242 covered with the insulating layer 250.

Next, in a step shown in FIG. 29B, an adhesive layer 312 is formed on the upper face of the metal layer 242 exposed from the opening portion 300. The adhesive layer 312 can be, for example, formed by applying a liquid resin or a paste-like resin which will be the adhesive layer 312, to the upper face of the metal layer 242. Incidentally, for example, an adhesive agent made of an epoxy-based resin is used as the adhesive layer 312. In addition, the resin agent in A-stage is used as the adhesive layer 312 in the present step. Incidentally, the resin agent in B-stage may be used as the adhesive layer 312 in the present step.

Successively, the electronic component 310 is mounted on the adhesive layer 312 inside the opening portion 300 by use of a mounter. On this occasion, the electronic component 310 is fixed on the adhesive layer 312 in a face-up state.

Next, in a step shown in FIG. 30A, an insulating layer 280 with which the opening portion 300 is filled is formed. The insulating layer 280 is formed so as to cover the entire surface of the electronic component 310 not in contact with the adhesive layer 312. The insulating layer 280 is formed so as to cover the entire surface of the protrusion portion 263 which has been subjected to roughening treatment. The insulating layer 280 is formed so as to cover an entire upper face of the insulating layer 270. On this occasion, upper faces of electrode terminals 311 of the electronic component 310 are formed either on the same plane as the upper face of the insulating layer 270 or to be lower than the upper face of the insulating layer 270. Accordingly, an upper face of the insulating layer 280 can be formed flatly.

Next, in a step shown in FIG. 30B, a through hole 280X penetrating the insulating layers 270 and 280 continuously in the thickness direction is formed at a required place in the insulating layers 270 and 280, and through holes 280Y are formed at required places in the insulating layer 280. The through holes 280X and 280Y can be, for example, formed by a laser machining method using a $CO_2$ laser, a YAG laser, or the like.

Successively, in a step shown in FIG. 31A, via wirings with which the through holes 280X and 280Y are filled are formed, and a wiring layer 290 electrically connected to the wiring layer 261 or the electrode terminals 311 through the via wirings is formed on the upper face of the insulating layer 280, for example, by a semi-additive method.

Next, in a step shown in FIG. 31B, a solder resist layer 330 having an opening portion 330X is formed on the upper face of the insulating layer 280. The solder resist layer 330 can be formed, for example, by laminating a photosensitive solder resist film or applying a liquid solder resist and patterning the resist into a required shape. By the present step, the wiring layer 290 exposed from the opening portion 330X is a pad P12. Incidentally, for example, a metal layer (i.e. a surface treatment layer) in which an Ni layer and an Au layer are formed in the named order may be formed on the pad P12 if occasions demand. The metal layer can be, for example, formed by an electroless plating method.

Successively, the support substrate 360 is removed. For example, the support body copper foil sheet of the support substrate 360 is mechanically peeled from the ultrathin copper foil sheet. On this occasion, the peeling layer is interposed between the support body copper foil sheet and the ultrathin copper foil sheet. Since an adhesive force between the support body copper foil sheet and the ultrathin copper foil sheet is weak, the support body copper foil sheet can be easily peeled from the ultrathin copper foil sheet. Then, the ultrathin copper foil sheet remaining on the metal film 361 is, for example, removed by wet etching using an aqueous solution of ferric chloride, an aqueous solution of cupric chloride, an aqueous solution of ammonium persulfate, or the like. On this occasion, the metal film 361 functions as a stopper layer when the ultrathin copper foil sheet of the support substrate 360 is etched.

Figure 32A:
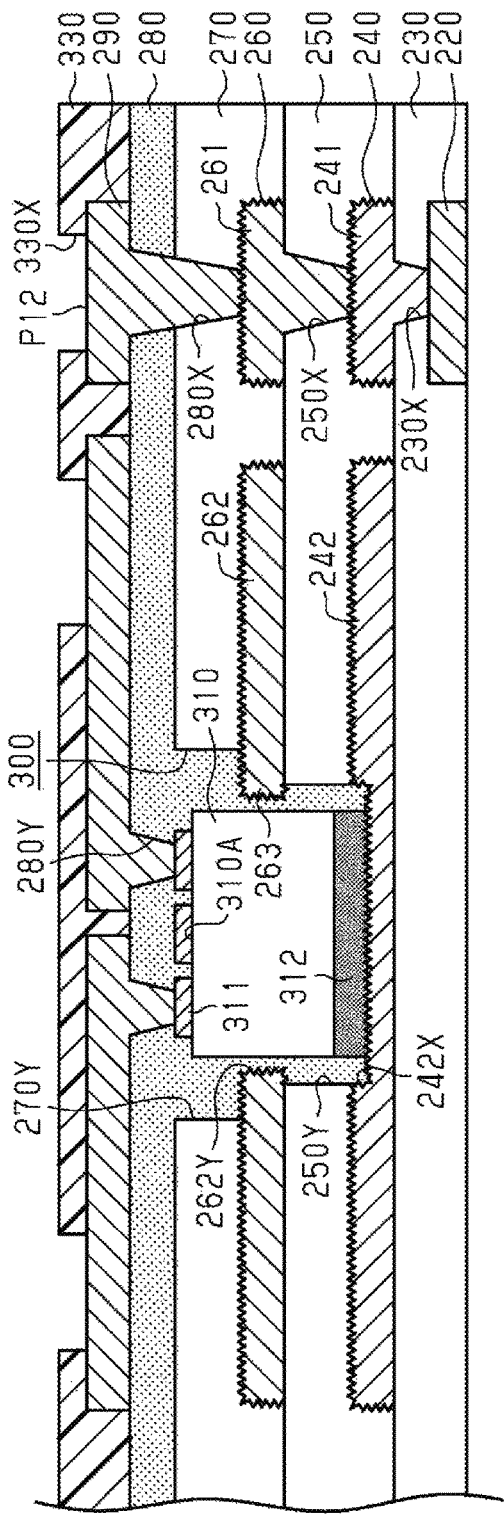
FIGS. 32A and 32B are schematic sectional views showing the method for manufacturing the wiring board according to the second embodiment.

Successively, the metal film 361 is removed by etching. When, for example, Ni is used as the material of the metal film 361, the metal film 361 is selectively etched and removed from the wiring layer 220 (the Cu layer) by wet etching using a hydrogen peroxide/nitric acid-based solution. On this occasion, the wiring layer 220 and the insulating layer 230 function as stopper layers when the metal film 361 is etched. By the present step, a lower face of the wiring layer 220 and a lower face of the insulating layer 230 are exposed to the outside, as shown in FIG. 32A. On this occasion, the lower face of the wiring layer 220 and the lower face of the insulating layer 230 which are in contact with an upper face of the metal film 361 (see FIG. 31B) are formed into a shape extending along the upper face (a flat face in this case) of the metal film 361. Therefore, the lower face of the wiring layer 220 and the lower face of the insulating layer 230 are formed to be substantially flush with each other.

Figure 32B:
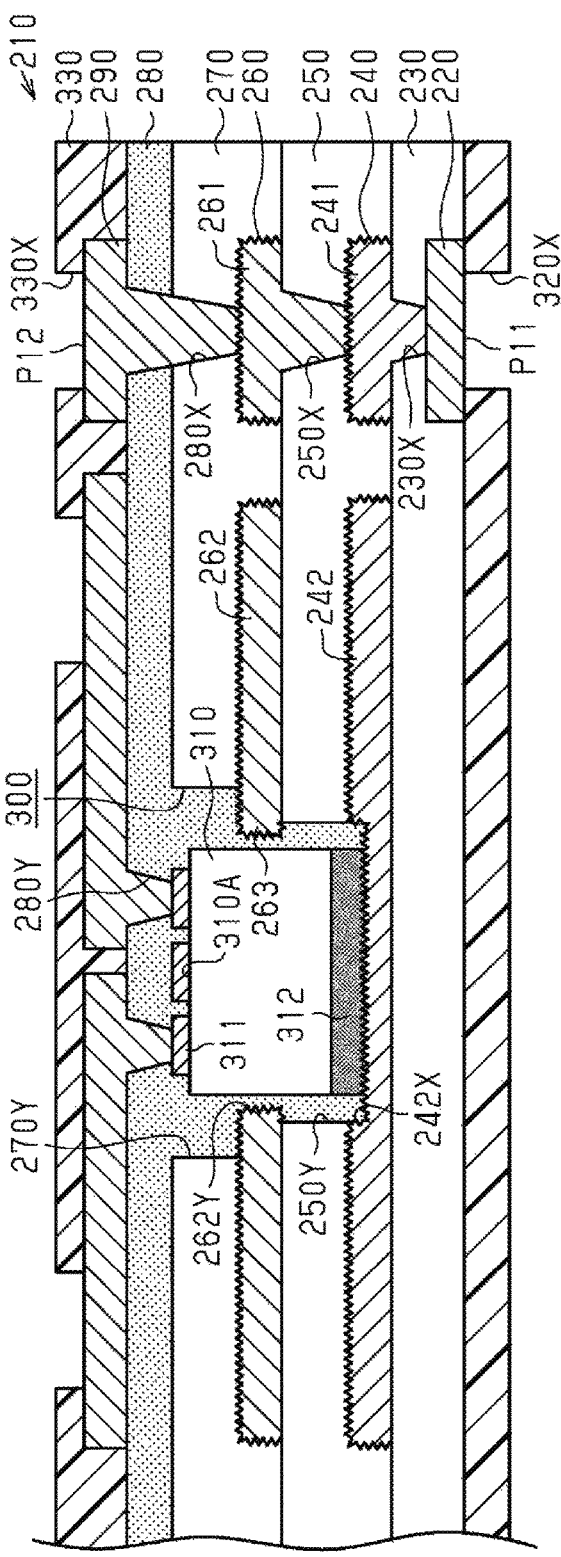
Figure 33:
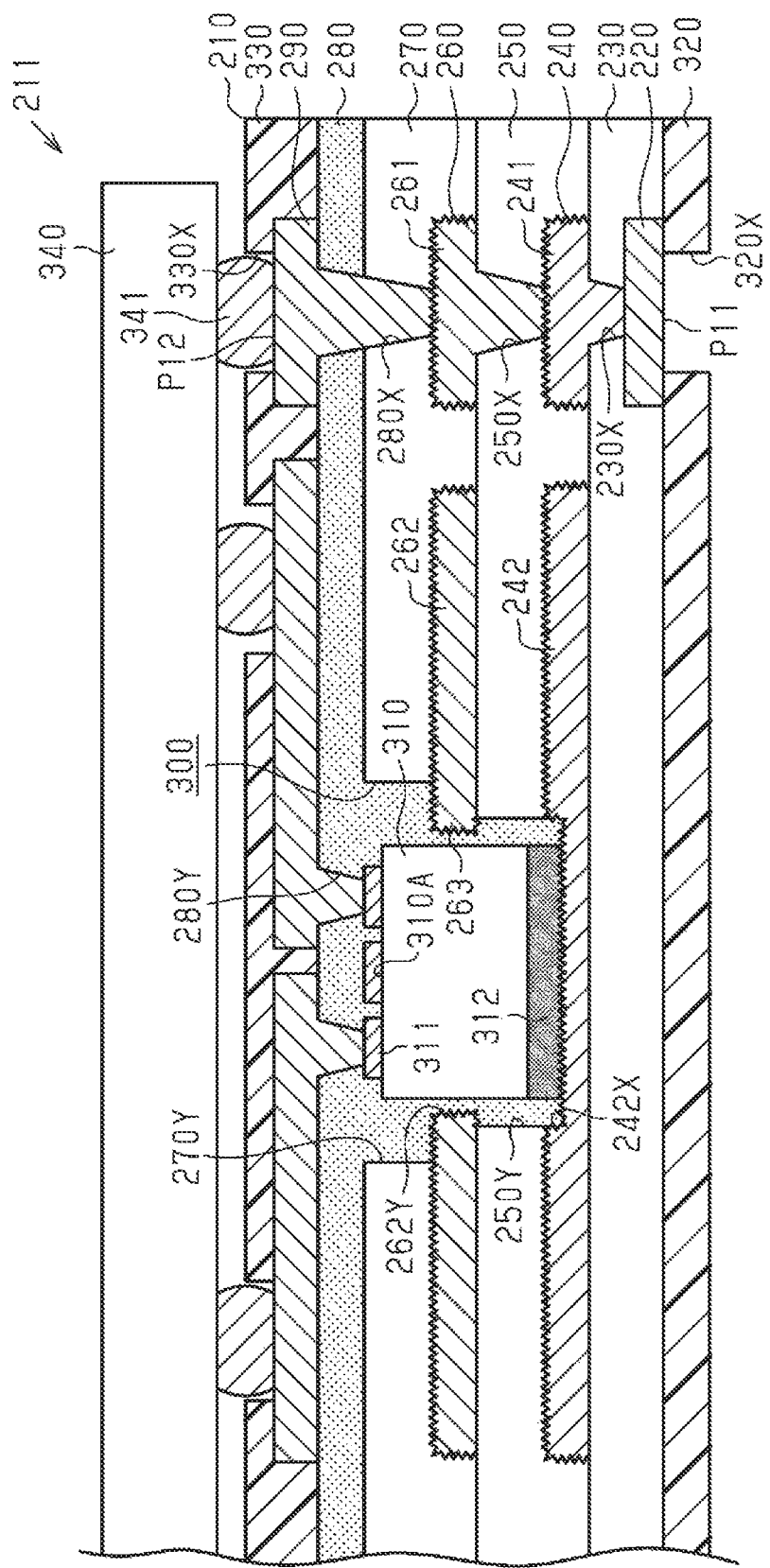
FIG. 33 is a schematic sectional view showing a method for manufacturing the semiconductor device according to the second embodiment.

Next, in a step shown in FIG. 32B, a solder resist layer 320 having an opening portion 320X is formed on the lower face of the insulating layer 230 in a similar manner to or the same manner as the step shown in FIG. 31B. Thus, the wiring layer 220 exposed from the opening portion 320X serves as a pad P11. Incidentally, for example, a metal layer (i.e. a surface treatment layer) in which an Ni layer and an Au layer are formed in the named order may be formed on the pad P11 if occasions demand. The metal layer can be, for example, formed by an electroless plating method.

By the aforementioned manufacturing process, the wiring board 210 shown in FIGS. 21A and 21B can be manufactured. Incidentally, the wiring board 210 can be used in a reversed state or can be disposed at any angle.

Next, a method for manufacturing the semiconductor device 211 will be described. First, a semiconductor chip 340 having a bump 341 formed on a circuit formation face of the semiconductor chip 340 is prepared in a step shown in FIG. 33. Successively, the bump 341 of the semiconductor chip 340 is flip-chip bonded onto the pad P12 of the wiring board 210. When, for example, the bump 341 is a solder bump, reflow treatment is performed after the bump 341 and the pad P12 are aligned with each other. As a result, the bump 341 (the solder bump) is melted so that the bump 341 is electrically connected to the pad P12.

Successively, an underfill resin 350 (see FIG. 24) is formed between an upper face of the wiring board 210 and a lower face of the semiconductor chip 340. The semiconductor device 211 shown in FIG. 24 can be manufactured by the aforementioned manufacturing process.

Next, operations and effects of the present embodiment will be described.

(2-1) The step portion 301 constituted by the side face 250A of the insulating layer 250 and the side face 263A of the protrusion 263 of the metal layer 262 is formed in the inner side face of the opening portion 300 where the electronic component 310 is received. In the configuration, a step portion is also formed in an interface between the inner side face of the opening portion 300 and the insulating layer 280 with which the opening portion 300 is filled. Thus, peeling of the insulating layer 280 can be stopped by the step portion 301 even when the peeling is propagated to the interface between the insulating layer 250 and the insulating layer 280. To give detailed description, stress is apt to be concentrated on the vicinity of the opening edge of the bottom of the opening portion 300 when a warp or thermal stress occurs in the wiring board 210. Therefore, the peeling of the insulating layer 280 may occur at the interface between the metal layer 242 and the insulating layer 280 in the vicinity of the opening edge of the bottom of the opening portion 300. When the peeling occurs at the interface between the metal layer 242 and the insulating layer 280, the peeling may be propagated to the interface between the inner side face of the opening portion 300 and the insulating layer 280. On this occasion, due to the step portion 301 formed in the inner side face of the opening portion 300, the peeling of the insulating layer 280 can be stopped at the step portion 301. Thus, the peeling of the insulating layer 280 can be stopped halfway in the depth direction of the opening portion 300. Accordingly, the wiring layer 290 formed on the upper face of the insulating layer 280 can be suitably suppressed from being broken due to the peeling of the insulating layer 280. As a result, lowering of electrical reliability of the wiring board 210 can be suitably suppressed.

(2-2) The convex step portion 301 constituted by the side face 250A of the insulating layer 250, the lower face of the protrusion portion 263 exposed from the insulating layer 250, the side face 263A of the protrusion portion 263, the upper face of the protrusion portion 263 exposed from the insulating layer 270, and the side face 270A of the insulating layer 270 is formed in the inner side face of the opening portion 300. That is, a portion of the metal layer 262 is formed to protrude more inward of the opening portion 300 than the side faces 250A and 270A of the insulating layers 250 and 270 so that the step portion 301 is formed in the inner side face of the opening portion 300. Further, the insulating layer 280 is formed so as to cover the entire surface of the metal layer 262 (i.e. the protrusion portion 263) protruding more inward of the opening portion 300 than the side faces 250A and 270A of the insulating layers 250 and 270. Thus, the protrusion portion 263 of the metal layer 262 is formed so as to bite into the insulating layer 280. Therefore, tight adhesiveness between the metal layer 262 and the insulating layer 280 can be improved due to an anchor effect.

(2-3) The step portion 301 is formed into a closed ring shape so as to surround the opening portion 300 over the whole circumference in plan view. According to the configuration, peeling of the insulating layer 280 can be stopped by the step portion 301 even when the peeling occurs at any position of the opening edge of the bottom of the opening portion 300.

Modifications of Second Embodiment

Incidentally, the aforementioned second embodiment may be changed suitably and carried out in the following modes. The aforementioned second embodiment and the following modifications can be combined with each other and carried out within a range in which the second embodiment and the modifications are not technically contradictory to each other.

In the aforementioned second embodiment, the opening portion 300 is constituted by two insulating layers 250 and 270 and one metal layer 262. However, the numbers of the insulating layers and the metal layers constituting the opening portion 300 are not limited particularly.

Figure 34:
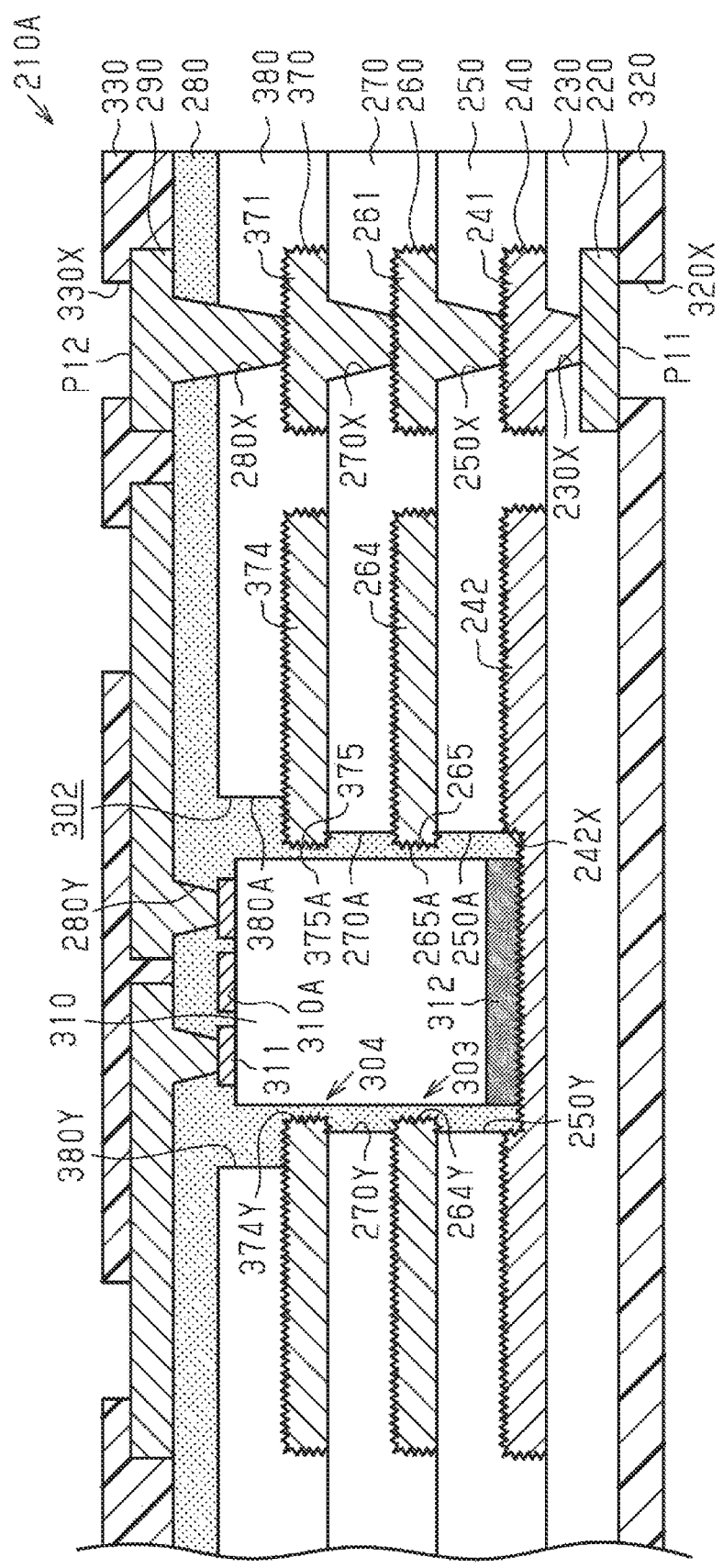
FIG. 34 is a schematic sectional view showing a wiring board according to a modification.

For example, as in a wiring board 210A shown in FIG. 34, an opening portion 302 where an electronic component 310 is received may be constituted by three insulating layers 250, 270 and 380 and two metal layers 264 and 374. The structure of the wiring board 210A will be described below. Incidentally, the same members as the aforementioned members shown in FIG. 21A to FIG. 33 are referred to by the same signs respectively and correspondingly, and detailed description about respective elements of the members will be omitted.

For example, a conductor layer 260 has a wiring layer 261 and the metal layer 264. The wiring layer 261 and the metal layer 264 are formed separately from each other to be electrically insulated from each other. The metal layer 264 is, for example, formed so as to surround a mount region where the electronic component 310 is mounted.

The insulating layer 270 is formed on an upper face of the insulating layer 250 so as to cover the conductor layer 260. A through hole 270X penetrating the insulating layer 270 in a thickness direction to expose a portion of an upper face of the conductor layer 260 (the wiring layer 261 in this case) is formed at a required place in the insulating layer 270. The through hole 270X is, for example, formed into an inverted truncated conical shape in which an opening diameter of a lower side opening end is smaller than an opening diameter of an upper side opening end.

A conductor layer 370 is formed on an upper face of the insulating layer 270. The thickness of the conductor layer 370 can be, for example, set in a range of about 10 to 30 μm. An upper face and a side face of the conductor layer 370 are, for example, roughened faces. The upper face and the side face of the conductor layer 370 are, for example, formed into roughened faces larger in surface roughness than a lower face of the conductor layer 370. The surface roughness of the conductor layer 370 can, for example, set to be not lower than 200 nm in terms of surface roughness Ra value.

For example, the conductor layer 370 has a wiring layer 371 and the metal layer 374. The wiring layer 371 and the metal layer 374 are formed separately from each other to be electrically insulated from each other.

The wiring layer 371 is, for example, electrically connected to the wiring layer 261 through a via wiring filled in the through hole 270X. The wiring layer 371 is, for example, formed integrally with the via wiring filled in the through hole 270X. The metal layer 374 is, for example, formed so as to surround the mount region where the electronic component 310 is mounted.

Each of the metal layers 264 and 374 in the present example is, for example, a dummy pattern which is electrically isolated (floating) without being electrically connected to any other wiring layer or any other conductor layer. For example, the metal layer 264, 374 may be a wiring pattern for drawing a wiring, or may be a power source wiring or a ground wiring.

The insulating layer 380 is formed on the upper face of the insulating layer 270 so as to cover the conductor layer 370. Incidentally, a thickness between the upper face of the conductor layer 370 and an upper face of the insulating layer 380 can be, for example, set in a range of about 40 to 100 μm.

The opening portion 302 is, for example, formed so as to penetrate the insulating layer 250, the metal layer 264, the insulating layer 270, the metal layer 374 and the insulating layer 380 in the thickness direction. The opening portion 302 is, for example, formed so as to expose a portion of an upper face of a metal layer 242. The opening portion 302 is formed correspondingly to the electronic component 310 embedded in the opening portion 302.

The opening portion 302 in the present example is constituted by a through hole 250Y of the insulating layer 250, a through hole 264Y, a through hole 270Y of the insulating layer 270, a through hole 374Y and a through hole 380Y which communicate with one another. The through hole 264Y penetrates the metal layer 264 in the thickness direction. The through hole 374Y penetrates the metal layer 374 in the thickness direction. The through hole 380Y penetrates the insulating layer 380 in the thickness direction.

The planar shape of each of the through holes 250Y, 264Y, 270Y, 374Y and 380Y is, for example, formed into a rectangular shape. The through holes 250Y, 264Y, 270Y, 374Y and 380Y are, for example, formed coaxially with one another. The planar shape of each of the through holes 250Y, 264Y, 270Y 374Y and 380Y is, for example, formed to be larger than the planar shape of the electronic component 310, and formed to be smaller than the planar shape of the metal layer 242.

The through hole 264Y, 374Y is, for example, formed to be smaller in planar shape than the through hole 250Y, 270Y, 380Y. The metal layer 264, 374 is, for example, formed so as to surround an opening edge of the through hole 250Y, 270Y, 380Y from the inside. The planar shape of the metal layer 264, 374 is, for example, formed into a closed ring shape which continuously surrounds the opening edge of the through hole 250Y, 270Y, 380Y over the whole circumference.

The metal layer 264 has a protrusion portion 265 protruding inward of the opening portion 300 from each of side faces 250A and 270A of the insulating layers 250 and 270. A side face 265A of the protrusion portion 265 is provided at a position where the side face 265A protrudes in a direction to be closer to the planar center of the opening portion 302 than the side faces 250A and 270A of the insulating layers 250 and 270. Thus, a convex step portion 303 constituted by the side face 250A of the insulating layer 250, a lower face of the protrusion portion 265, the side face 265A of the protrusion portion 265, an upper face of the protrusion portion 265 and the side face 270A of the insulating layer 270 is formed in an inner side face of the opening portion 302.

The metal layer 374 has a protrusion portion 375 protruding inward of the opening portion 302 from the side face 270A of the insulating layer 270. A side face 375A of the protrusion portion 375 is provided at a position where the side face 375A protrudes in the direction to be closer to the planar center of the opening portion 302 than a side face 380A of the insulating layer 380 and the side face 270A of the insulating layer 270 which constitute the inner side face of the opening portion 302 (the through hole 308Y). Thus, a convex step portion 304 constituted by the side face 270A of the insulating layer 270, a lower face of the protrusion portion 375, the side face 375A of the protrusion portion 375, an upper face of the protrusion portion 375 and the side face 380A of the insulating layer 380 is formed in the inner side face of the opening portion 302.

The side face 380A of the insulating layer 380 is, for example, provided at a position where the side face 380A is set back in a direction to be separated more distantly from the planar center of the opening portion 302 than the side faces 250A and 270A of the insulating layers 250 and 270. The electronic component 310 is mounted on the upper face of the metal layer 242 exposed from the opening portion 302, through an adhesive layer 312. The insulating layer 280 is formed so as to fill the opening portion 302 and cover the entire surfaces of the step portions 303 and 304. The insulating layer 280 is formed so as to cover the entire surface of the protrusion portion 265 of the metal layer 264 and the entire surface of the protrusion portion 375 of the metal layer 374.

According to the aforementioned configuration, the opening portion 302 is formed so as to penetrate the metal layers 264 and 374 and the insulating layers 250, 270 and 380 in the thickness direction. Thus, by increasing the numbers of the metal layers 264 and 374 and the insulating layers 250, 270 and 380, the opening portion 302 can be formed to be deeper accordingly. Therefore, even when a high electronic component 310 is embedded, the opening portion 302 deep enough to receive the electronic component 310 therein can be formed easily.

Figure 35A:
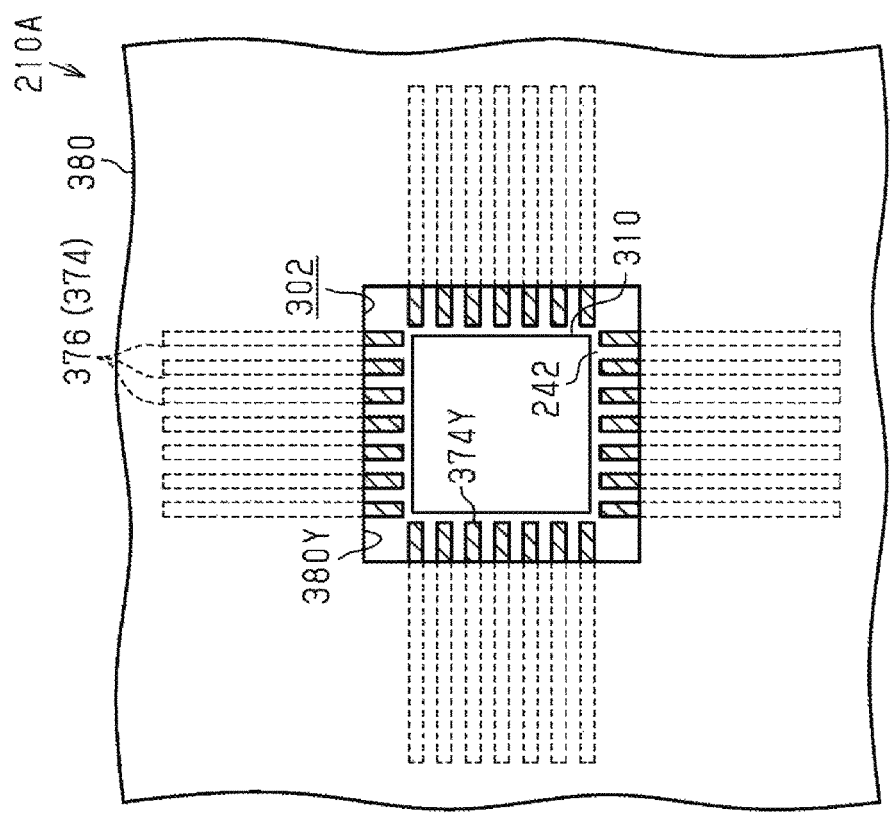
FIGS. 35A and 35B are schematic plan views showing the wiring board according to the modification.
Figure 35B:
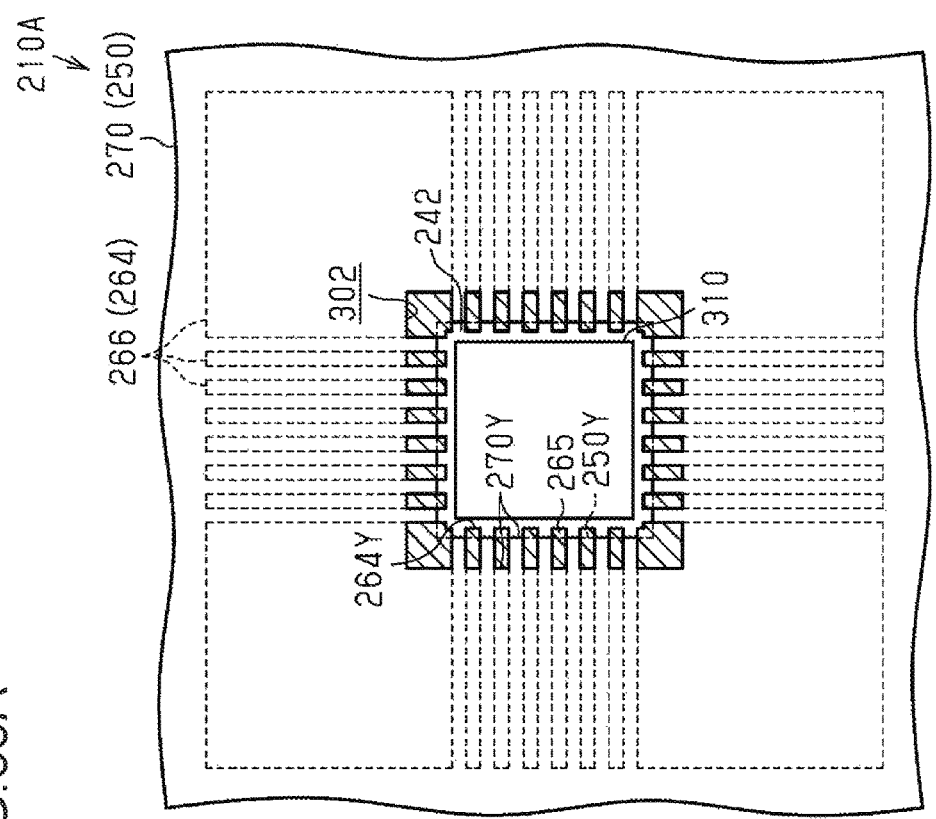
Figure 36:
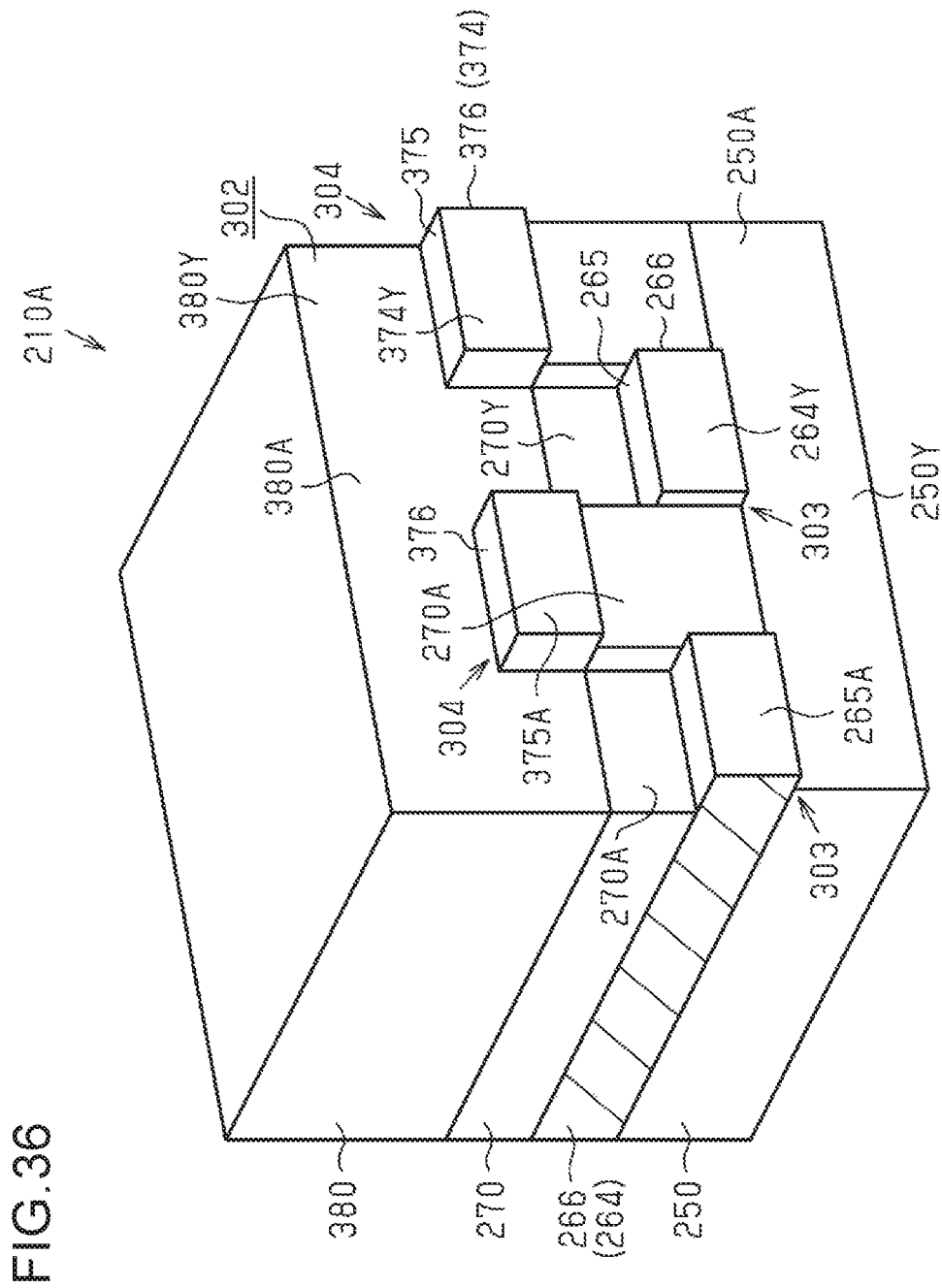
FIG. 36 is a schematic perspective view showing the wiring board according to the modification.

When the opening portion 302 is formed to penetrate two or more metal layers 264 and 374 in the thickness direction as in the modification shown in FIG. 34, structures shown in FIGS. 35A and 35B and FIG. 36 can be also used as the respective metal layers 264 and 374. The structures will be described below in detail. Incidentally, FIG. 35A is a plan view of the metal layer 242, the insulating layer 250, the metal layer 264, the insulating layer 270 and the electronic component 310, as seen from the upper face side of the insulating layer 270. In addition, FIG. 35B is a plan view of the metal layer 242, the insulating layers 250 and 270, the metal layer 374, the insulating layer 380 and the electronic component 310, as seen from the upper face side of the insulating layer 380.

As shown in FIG. 35A, the metal layer 264 has metal layers 266 each of which is shaped like a rectangle in plan view. The metal layers 266 are, for example, formed so as to surround the opening edge of the through hole 250Y.

As shown in FIG. 35B, the metal layer 374 has metal layers 376 each of which is shaped like a rectangle in plan view. The metal layers 376 are, for example, formed so as to surround the opening edge of the through hole 380Y. A planar shape of the metal layers 266 and the metal layers 376 which are superimposed on each other in plan view is formed into a closed ring shape (a rectangular closed ring shape in this case) surrounding an opening edge of the opening portion 302 over the whole circumference. That is, the metal layers 264 and 374 in the present example are formed so that the planar shape of the two metal layers 264 and 374 which are superimposed on each other in plan view is formed into the closed ring shape surrounding the opening edge of the opening portion 302 over the whole circumference.

As shown in FIGS. 35A and 35B and FIG. 36, the metal layers 266 and the metal layers 376 are formed to alternate each other in the circumferential direction of the opening portion 302. For example, each of the metal layers 266 is formed at a position not overlapping with any metal layer 374 in plan view. In a similar manner or the same manner, each of the metal layers 376 is formed at a position not overlapping with any metal layer 266 in plan view. Incidentally, the metal layers 266 and the metal layers 376 may have some portions overlapping with each other in plan view.

As shown in FIG. 36, the side face 265A of each of the metal layers 266 constituting the inner side face of the opening portion 302 is provided at a position where the side face 265A protrudes in a direction to be closer to the planar center of the opening portion 302 than each of the side faces 250A and 270A of the insulating layers 250 and 270. Thus, step portions 303 each of which is constituted by the side face 250A of the insulating layer 250, the side face 265A of the metal layer 266, and the side face 270A of the insulating layer 270 are formed in the inner side face of the opening portion 302. The step portions 303 are formed at predetermined intervals in the circumferential direction of the opening portion 302.

The side face 375A of each of the metal layers 376 constituting the inner side face of the opening portion 302 is provided at a position where the side face 375A protrudes in a direction to be closer to the planar center of the opening portion 302 than each of the side faces 270A and 380A of the insulating layers 270 and 380. Thus, step portions 304 each of which is constituted by the side face 270A of the insulating layer 270, the side face 375A of the metal layer 376, and the side face 380A of the insulating layer 380 are formed in the inner side face of the opening portion 302. The step portions 304 are formed at predetermined intervals in the circumferential direction of the opening portion 302.

The step portions 303 and 304 are formed so that, for example, the planar shape of the recesses 303 and 304 which are superimposed on each other in plan view is formed into a closed ring shape surrounding the opening portion 302 over the whole circumference. The step portions 303 and the step portions 304 are formed to alternate each other in the circumferential direction of the opening portion 302. For example, each of the step portions 303 is formed at a position not overlapping with any step portion 304 in plan view. In a similar manner or the same manner, each of the step portions 304 are formed at a position not overlapping with any step portion 303 in plan view.

Here, of the side face 270A of the insulating layer 270, portions overlapping with the metal layers 376 in plan view are, for example, provided at positions where the portions of the side face 270A protrude in a direction to be closer to the planar center of the opening portion 302 than the side face 380A of the insulating layer 380. Of the side face 270A of the insulating layer 270, the portions overlapping with the metal layers 376 in plan view are, for example, formed on the same plane as the side face 250A of the insulating layer 250. On the other hand, of the side face 270A of the insulating layer 270, portions not overlapping with the metal layers 376 in plan view are, for example, formed on the same plane as the side face 380A of the insulating layer 380.

In the aforementioned configuration, the step portions 303 and the step portions 304 are formed so that the planar shape of the step portions 303 and 304 which are superimposed on each other in plan view is formed into a closed ring shape surrounding the opening portion 302 over the whole circumference. Thus, peeling of the insulating layer 280 can be stopped by one of the step portions 303 and 304 even when the peeling occurs at any position of the opening edge of the bottom of the opening portion 302.

In addition, kinds of step portions are formed in the inner side face of the opening portion 302 by the metal layers 264 and 374. In this manner, the degree of freedom for designing the planar shape of each of the metal layers 264 and 374 can be improved in comparison with when a step portion is formed in the inner side face of the opening portion 302 by one metal layer.

In the aforementioned second embodiment, the step portion 301 is formed over the whole circumference of the opening portion 300. The present invention is not limited thereto. For example, the step portion 301 may be formed at only a circumferential portion of the opening portion 300.

OTHER EMBODIMENTS

Each of the aforementioned embodiments can be changed and carried out as follows. The aforementioned embodiments and the following modifications can be combined with each other and carried out in a range that the embodiments and the modifications are not technically contradictory to each other.

Figure 37:
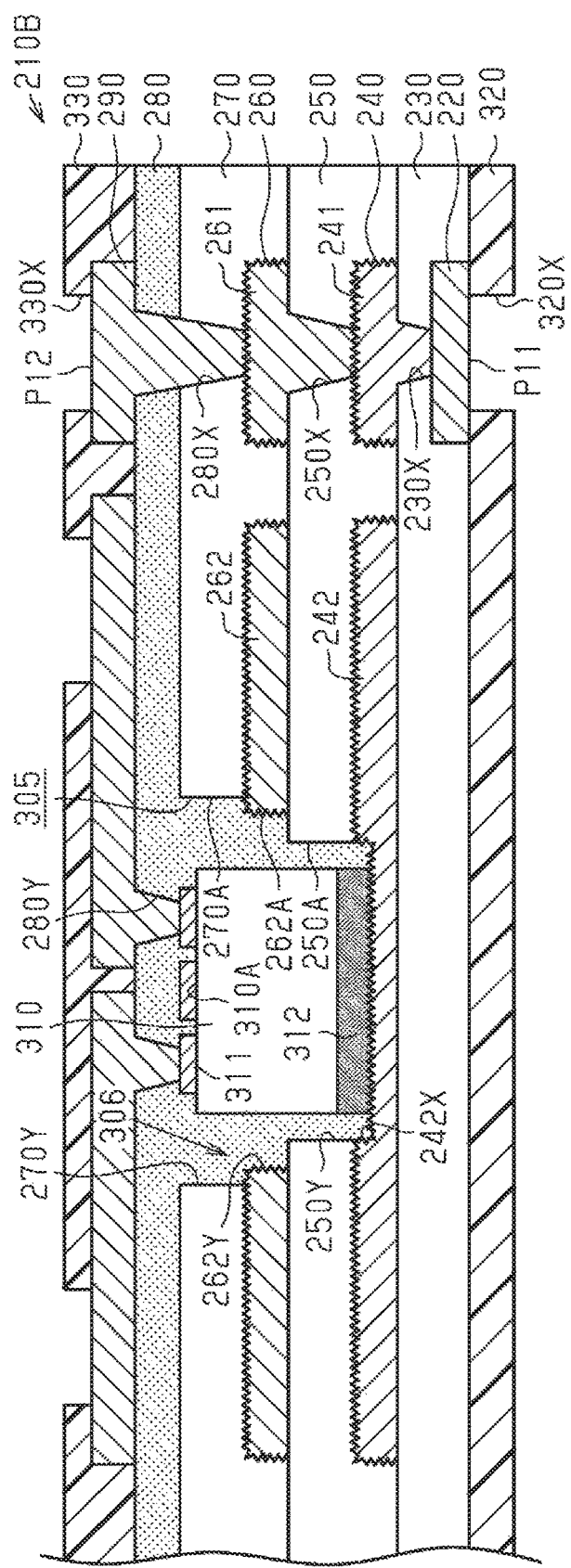
FIG. 37 is a schematic sectional view showing a wiring board according to another modification.
Figure 38:
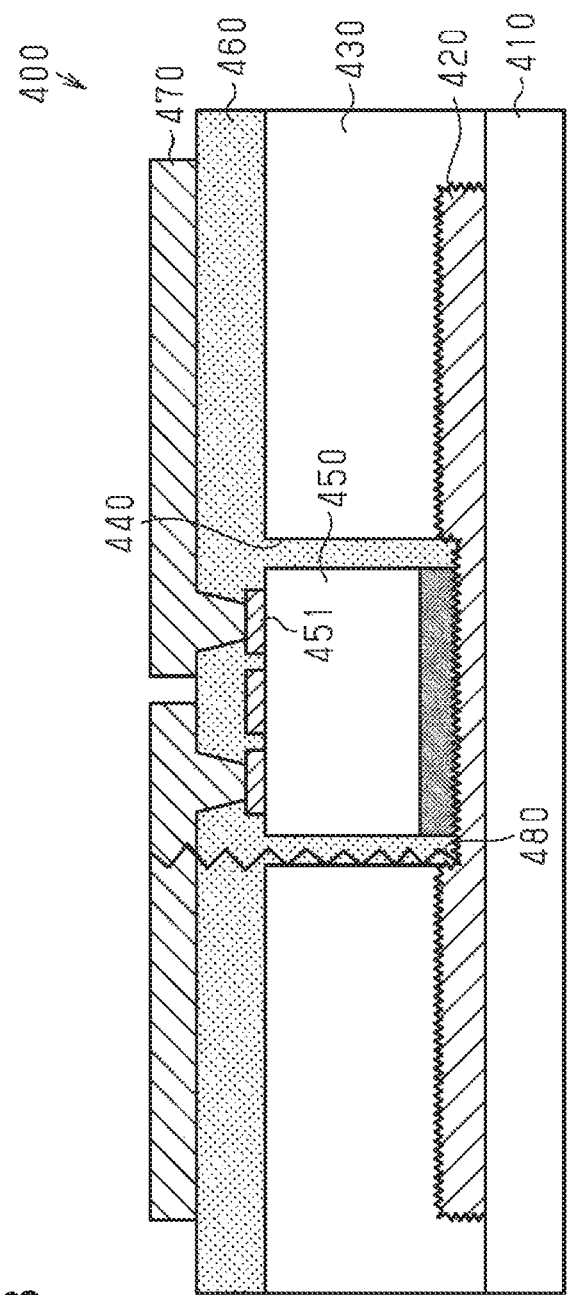
FIG. 38 is a schematic sectional view showing a wiring board according to the background art.

For example, as shown in FIG. 37, a stepwise step portion 306 may be formed in an inner side face of an opening portion 305 where an electronic component 310 is received. In a wiring board 210B shown in FIG. 37, a through hole 250Y of an insulating layer 250, a through hole 262Y of a metal layer 260 and a through hole 270Y of an insulating layer 270 communicate with one another to thereby constitute the opening portion 305.

The planar shape of the through hole 262Y of the metal layer 262 is formed to be larger than the planar shape of the through hole 250Y of the insulating layer 250. The planar shape of the through hole 270Y of the insulating layer 270 is formed to be larger than the planar shape of the through hole 262Y of the metal layer 262.

A side face 262A of the metal layer 262 is provided at a position where the side face 262A is set back in a direction to be separated more distantly from the planar center of the opening portion 305 than a side face 250A of the insulating layer 250. Therefore, an upper face of the insulating layer 250 positioned in the vicinity of the side face 250A of the insulating layer 250 is exposed from the metal layer 262. In addition, a side face 270A of the insulating layer 270 is provided at a position where the side face 270A is set back in the direction to be separated more distantly from the planar center of the opening portion 305 than the side face 262A of the metal layer 262. Therefore, an upper face of the metal layer 262 positioned in the vicinity of the side face 262A of the metal layer 262 is exposed from the insulating layer 270. Thus, the stepwise step portion 306 constituted by the side face 250A of the insulating layer 250, the upper face of the insulating layer 250 exposed from the metal layer 262, the side face 262A of the metal layer 262, the upper face of the metal layer 262 exposed from the insulating layer 270, and the side face 270A of the insulating layer 270 is formed in the inner side face of the opening portion 305. An insulating layer 280 in this case is formed to cover the entire surface of the stepwise step portion 306.

In the wiring board 10 or 210 according to each of the aforementioned embodiments, each of the through holes 50Y, 62Y and 70Y or the through holes 250Y, 262Y and 270Y constituting the opening portion 100 or 300 is substantially formed into a rectangular shape in sectional view. That is, the through hole 50Y, 62Y, 70Y, 250Y, 262Y, 270Y is formed so that an opening width of an upper side opening end and an opening width of a lower side opening end are substantially equal to each other. The present invention is not limited thereto. For example, the through hole 50Y, 62Y, 70Y, 250Y, 262Y, 270Y may be formed into a taper shape whose opening width is reduced as it goes from an upper side toward a lower side.

The structure of the wiring board 10 or 210 in each of the aforementioned embodiments is not limited particularly. For example, the numbers, arrangement, etc. of wiring layers and insulating layers in a wiring structure formed on an upper face of the insulating layer 80 or 280 can be modified/changed variously. In addition, the numbers, arrangement, etc. of wiring layers and insulating layers in a wiring structure formed on a lower face of the insulating layer 30 or 230 can be modified/changed variously. In addition, a wiring layer may be formed on an upper face of the insulating layer 70 or 270.

The upper face and the side face of the wiring layer 20, 90, 220, 290 in each of the aforementioned embodiments may be formed into roughened faces in a similar manner to or the same manner as the conductor layer 40 etc. In each of the aforementioned embodiments, the wiring layer 41, 61, 241, 261 in the conductor layer 40, 60, 240, 260 may be omitted. In addition, the solder resist layer 120, 130, 320, 330 may be omitted.

In each of the aforementioned embodiments, the wiring board 10 or 210 is embodied as a coreless board. However, the present invention is not limited thereto. For example, the wiring board 10 or 210 may be embodied as a core-including build-up board having a core substrate.

The number of the electronic components 110 embedded in the wiring board 10 or 210 in each of the aforementioned embodiments is not limited particularly. In addition, the electronic components embedded in the wiring board 10 or 210 are not limited to one kind. Any kinds of electronic components may be embedded in the wiring board 10 or 210.

In each of the aforementioned embodiments, the pad P1 or P11 is used as an external connection pad, and the pad P2 or P12 is used as an electronic component mounting pad. The present invention is not limited thereto. For example, the pad P1 or P11 may be used as an electronic component mounting pad, and the pad P2 or P12 may be used as an external connection pad.

In the semiconductor device 11 or 211 according to each of the aforementioned embodiments, one semiconductor chip 140 or 340 is mounted on the wiring board 10 or 210. A plurality of semiconductor chips 140 or 340 may be mounted on the wiring board 10 or 210. In this case, for example, a logic chip and a memory chip may be mounted in combination on the wiring board 10 or 210.

In addition, a chip component such as a chip capacitor, a chip inductor or a chip resistor, or another electronic component such as a crystal resonator may be mounted on the wiring board 10 or 210 in place of the semiconductor chip 140 or 340.

In addition, a mounting form of the electronic component such as the semiconductor chip 140 or 340, the chip component or the crystal resonator may be modified/changed variously. Examples of the mounting form of the electronic component include a flip-chip mounting form, a wire bonding mounting form, a solder mounting form or a mounting form using a combination of those mounting forms.

In the aforementioned embodiments, the manufacturing method is embodied as a manufacturing method for obtaining a single piece (obtaining one piece). However, the manufacturing method may be embodied as a manufacturing method for obtaining a plurality of pieces. The aforementioned various embodiments are summarized as follows.

(1) A method for manufacturing a wiring board, comprising:

forming a second insulating layer on an upper face of a first insulating layer;

forming a first metal layer having a first through hole on an upper face of the second insulating layer;

forming a third insulating layer on the upper face of the second insulating layer so as to cover the first metal layer;

forming a second through hole and a third through hole, the second through hole penetrating the second insulating layer in a thickness direction to communicate with the first through hole, the second through hole being different in size of planar shape from the first through hole, the third through hole penetrating the third insulating layer in the thickness direction to communicate with the first through hole, the third through hole being different in size of planar shape from the first through hole;

mounting an electronic component in an opening portion that includes the first through hole, the second through hole and the third through hole communicating with one another;

forming a filling insulating layer so as to fill the opening portion and cover the electronic component; and forming a wiring layer on an upper face of the filling insulating layer.

(2) The method for manufacturing a wiring board according to clause (1), wherein:

the forming second through hole and the third through hole comprises:

forming the second through hole in the second insulating layer and forming the third through hole in the third insulating layer, the second through hole being larger in planar shape than the first through hole, the third through hole being larger in planar shape than the first through hole; and removing a portion of the first metal layer so as to make the planar shape of the first through hole larger than the planar shape of the second through hole.

(3) The method for manufacturing a wiring board according to clause (1), wherein:

the forming second through hole and the third through hole comprises:

forming the second through hole in the second insulating layer and forming the third through hole in the third insulating layer, the second through hole being larger in planar shape than the first through hole, the third through hole being larger in planar shape than the first through hole; and applying roughening treatment to a portion of the first metal layer exposed from the second through hole and the third through hole, wherein the filling insulating layer is formed so as to cover the entire surface of the roughened portion of the first metal layer.

What is claimed is:

1. A wiring board comprising:
   a first insulating layer;
   a second insulating layer that is formed on an upper face of the first insulating layer;
   a first metal layer that is formed on an upper face of the second insulating layer;
   a third insulating layer that is formed on the upper face of the second insulating layer so as to cover the first metal layer;
   an opening portion that penetrates at least the second insulating layer, the first metal layer and the third insulating layer in a thickness direction of the wiring board;
   an electronic component that is provided in the opening portion;
   a filling insulating layer that fills the opening portion and covers the electronic component; and
   a wiring layer that is formed on an upper face of the filling insulating layer,
   wherein a first step portion is formed by a side face of the second insulating layer constituting an inner side face of the opening portion and a side face of the first metal layer constituting the inner side face of the opening portion.

2. The wiring board according to claim 1, wherein the first step portion entirely surrounds the electronic component in plan view.

3. The wiring board according to claim 1, further comprising:
   a second metal layer that is formed on an upper face of the third insulating layer; and
   a fourth insulating layer that is formed on the upper face of the third insulating layer so as to cover the second metal layer;
   wherein:
   the opening portion penetrates the second insulating layer, the first metal layer, the third insulating layer, the second metal layer and the fourth insulating layer in the thickness direction;
   the filling insulating layer covers an upper face of the fourth insulating layer; and
   a second step portion is formed by a side face of the third insulating layer constituting the inner side face of the opening portion and a side face of the second metal layer constituting the inner side face of the opening portion.

4. The wiring board according to claim 3, wherein a combination of the first step portion and the second step portion entirely surrounds the electronic component in plan view.

5. The wiring board according to claim 1, wherein the first step portion is formed by the side face of the second insulating layer, the upper face of the second insulating layer exposed from the first metal layer, and the side face of the first metal layer.

6. The wiring board according to claim 5, wherein:
   the first step portion is a recess that is constituted by the side face of the second insulating layer, the upper face of the second insulating layer exposed from the first metal layer, the side face of the first metal layer, a lower face of the third insulating layer exposed from the first metal layer, and a side face of the third insulating layer; and
   the filling insulating layer is formed so as to fill the recess.

7. The wiring board according to claim 1, wherein:
   the first step portion is formed by the side face of the second insulating layer, a lower face of the first metal layer exposed from the second insulating layer, and a side face of the first metal layer.

8. The wiring board according to claim 7, wherein:
   the first step portion is formed by the side face of the second insulating layer, the lower face of the first metal layer exposed from the second insulating layer, the side face of the first metal layer, an upper face of the first metal layer exposed from the third insulating layer, and a side face of the third insulating layer; and
   the filling insulating layer covers the lower face of the first metal layer exposed from the second insulating layer, the side face of the first metal layer, and the upper face of the first metal layer exposed from the third insulating layer.

9. The wiring board according to claim 1, further comprising:
   a third metal layer that is formed on the upper face of the first insulating layer;
   wherein:
   the opening portion is formed so as to expose a portion of an upper face of the third metal layer; and
   the electronic component is mounted on the upper face of the third metal layer exposed from the opening portion.

10. The wiring board according to claim 1, further comprising:
    a third metal layer that is formed on the upper face of the first insulating layer, wherein:
the opening portion penetrates the third metal layer, the second insulating layer, the first metal layer and the third insulating layer in the thickness direction; and a distance between a side face of the third metal layer constituting the inner side face of the opening portion and the side face of the second insulating layer constituting the inner side face of the opening portion is shorter than a distance between the side face of the first metal layer constituting the inner side face of the opening portion and the side face of the second insulating layer constituting the inner side face of the opening portion.

11. The wiring board according to claim 1, further comprising:

a third metal layer that is formed on the upper face of the first insulating layer;

wherein:

the opening portion penetrates the third metal layer, the second insulating layer, the first metal layer and the third insulating layer in the thickness direction; and a third step portion is formed by the side face of the second insulating layer constituting the inner side face of the opening portion and a side face of the third metal layer constituting the inner side face of the opening portion.

* * * * *